US008455978B2

(12) United States Patent
Lee

(10) Patent No.: US 8,455,978 B2
(45) Date of Patent: Jun. 4, 2013

(54) SEMICONDUCTOR CIRCUIT STRUCTURE AND METHOD OF MAKING THE SAME

(76) Inventor: Sang-Yun Lee, Beaverton, OR (US)

( * ) Notice: Subject to any disclaimer, the term of this patent is extended or adjusted under 35 U.S.C. 154(b) by 183 days.

(21) Appl. No.: 12/847,374

(22) Filed: Jul. 30, 2010

(65) Prior Publication Data
US 2011/0291234 A1 Dec. 1, 2011

Related U.S. Application Data

(60) Provisional application No. 61/349,134, filed on May 27, 2010.

(51) Int. Cl.
H01L 23/02 (2006.01)
H01L 21/31 (2006.01)

(52) U.S. Cl.
USPC ............ 257/532; 257/E21.575; 257/E23.023; 438/778

(58) Field of Classification Search
USPC ................. 257/532, 777, 758, 296, 773, 779, 257/E21.575, E21.09, E23.023, E23.169; 438/643, 478, 642, 108, 406, 455, 778
See application file for complete search history.

(56) References Cited

U.S. PATENT DOCUMENTS

| | | |
|---|---|---|
| 4,704,785 A | 11/1987 | Curran |
| 4,829,018 A | 5/1989 | Wahlstrom |
| 4,939,568 A | 7/1990 | Kato et al. |
| 5,047,979 A | 9/1991 | Leung |
| 5,087,585 A | 2/1992 | Hayashi |
| 5,093,704 A | 3/1992 | Saito et al. |
| 5,106,775 A | 4/1992 | Kaga et al. |
| 5,152,857 A | 10/1992 | Ito et al. |
| 5,265,047 A | 11/1993 | Leung et al. |
| 5,266,511 A | 11/1993 | Takao |
| 5,308,782 A | 5/1994 | Mazure et al. |
| 5,355,022 A | 10/1994 | Sugahara et al. |
| 5,374,564 A | 12/1994 | Bruel |
| 5,554,870 A | 9/1996 | Fitch et al. |
| 5,627,106 A | 5/1997 | Hsu |
| 5,695,557 A | 12/1997 | Yamagata et al. |
| 5,737,748 A | 4/1998 | Shigeeda |
| 5,829,026 A | 10/1998 | Leung et al. |
| 5,835,396 A | 11/1998 | Zhang |
| 5,892,225 A | 4/1999 | Okihara |
| 5,915,167 A | 6/1999 | Leedy |
| 5,977,579 A | 11/1999 | Noble |

(Continued)

FOREIGN PATENT DOCUMENTS
WO WO 2009/128372 * 10/2009

OTHER PUBLICATIONS

Kim et al., "Electrical and mechanical properties of tantalum nitride thin films . . . ", 2005, Journal of Crystal Growth, vol. 283, pp. 401-404.*

(Continued)

Primary Examiner — Nikolay Yushin
(74) Attorney, Agent, or Firm — Greg L. Martinez

(57) ABSTRACT

A semiconductor circuit structure includes an interconnect region, and a material transfer region. The semiconductor circuit structure includes a conductive bonding region which couples the material transfer region to the interconnect region through a bonding interface. The conductive bonding region includes a barrier layer between a conductive layer and bonding layer. The bonding layer is positioned towards the material transfer region, and the conductive layer is positioned towards the interconnect region.

92 Claims, 40 Drawing Sheets

U.S. PATENT DOCUMENTS

| | | | |
|---|---|---|---|
| 5,980,633 A | 11/1999 | Yamagata et al. | |
| 5,998,808 A | 12/1999 | Matsushita | |
| 6,009,496 A | 12/1999 | Tsai | |
| 6,057,212 A | 5/2000 | Chan et al. | |
| 6,103,597 A | 8/2000 | Aspar et al. | |
| 6,153,495 A | 11/2000 | Kub et al. | |
| 6,222,251 B1 | 4/2001 | Holloway | |
| 6,225,651 B1 | 5/2001 | Billon | |
| 6,229,161 B1 | 5/2001 | Nemati et al. | |
| 6,259,623 B1 | 7/2001 | Takahashi | |
| 6,331,468 B1 | 12/2001 | Aronowitz et al. | |
| 6,380,099 B2 | 4/2002 | Sakaguchi et al. | |
| 6,423,614 B1 | 7/2002 | Doyle | |
| 6,531,697 B1 | 3/2003 | Nakamura et al. | |
| 6,534,382 B1 | 3/2003 | Sakaguchi et al. | |
| 6,535,411 B2 | 3/2003 | Jolin et al. | |
| 6,600,173 B2 | 7/2003 | Tiwari | |
| 6,621,168 B2 | 9/2003 | Sundahl et al. | |
| 6,630,713 B2 | 10/2003 | Geusic | |
| 6,638,634 B2 | 10/2003 | Miyasaka | |
| 6,677,204 B2 | 1/2004 | Cleeves et al. | |
| 6,742,067 B2 | 5/2004 | Hsien | |
| 6,751,113 B2 | 6/2004 | Bhakta et al. | |
| 6,787,920 B2 | 9/2004 | Amir | |
| 6,822,233 B2 | 11/2004 | Nakamura et al. | |
| 6,854,067 B1 | 2/2005 | Kutz et al. | |
| 6,943,067 B2 | 9/2005 | Greenlaw | |
| 6,943,407 B2 | 9/2005 | Ouyang et al. | |
| 6,995,430 B2 | 2/2006 | Langdo et al. | |
| 7,002,152 B2 | 2/2006 | Grunewald | |
| 7,052,941 B2 | 5/2006 | Lee | |
| 7,078,739 B1 | 7/2006 | Nemati et al. | |
| 7,470,142 B2 | 12/2008 | Lee | |
| 7,470,598 B2 | 12/2008 | Lee | |
| 7,632,738 B2 | 12/2009 | Lee | |
| 7,633,162 B2 | 12/2009 | Lee | |
| 7,671,371 B2 | 3/2010 | Lee | |
| 7,718,508 B2 | 5/2010 | Lee | |
| 7,738,702 B2 | 6/2010 | Kanatsu | |
| 2002/0024140 A1 | 2/2002 | Nakajima et al. | |
| 2002/0025604 A1 | 2/2002 | Tiwari | |
| 2002/0125524 A1 | 9/2002 | Okudaira et al. | |
| 2002/0141233 A1 | 10/2002 | Hosotani et al. | |
| 2002/0153548 A1 | 10/2002 | Mizutani et al. | |
| 2003/0067043 A1 | 4/2003 | Zhang | |
| 2003/0075752 A1* | 4/2003 | Motoyama | 257/306 |
| 2003/0113963 A1 | 6/2003 | Wurzer | |
| 2003/0139011 A1 | 7/2003 | Cleeves et al. | |
| 2003/0157796 A1* | 8/2003 | Kim et al. | 438/637 |
| 2004/0113207 A1 | 6/2004 | Hsu et al. | |
| 2004/0131233 A1 | 7/2004 | Comaniciu et al. | |
| 2004/0155301 A1 | 8/2004 | Zhang | |
| 2004/0156233 A1 | 8/2004 | Bhattacharyya | |
| 2004/0160849 A1 | 8/2004 | Rinerson et al. | |
| 2005/0280156 A1* | 12/2005 | Lee | 257/758 |
| 2008/0230904 A1* | 9/2008 | Lee | 257/751 |
| 2011/0068402 A1* | 3/2011 | Takasawa et al. | 257/347 |

OTHER PUBLICATIONS

Sze, "Semiconductor devices, physics and technology", 2002, John Willey & Sons. Inc., p. 17.*

\* cited by examiner

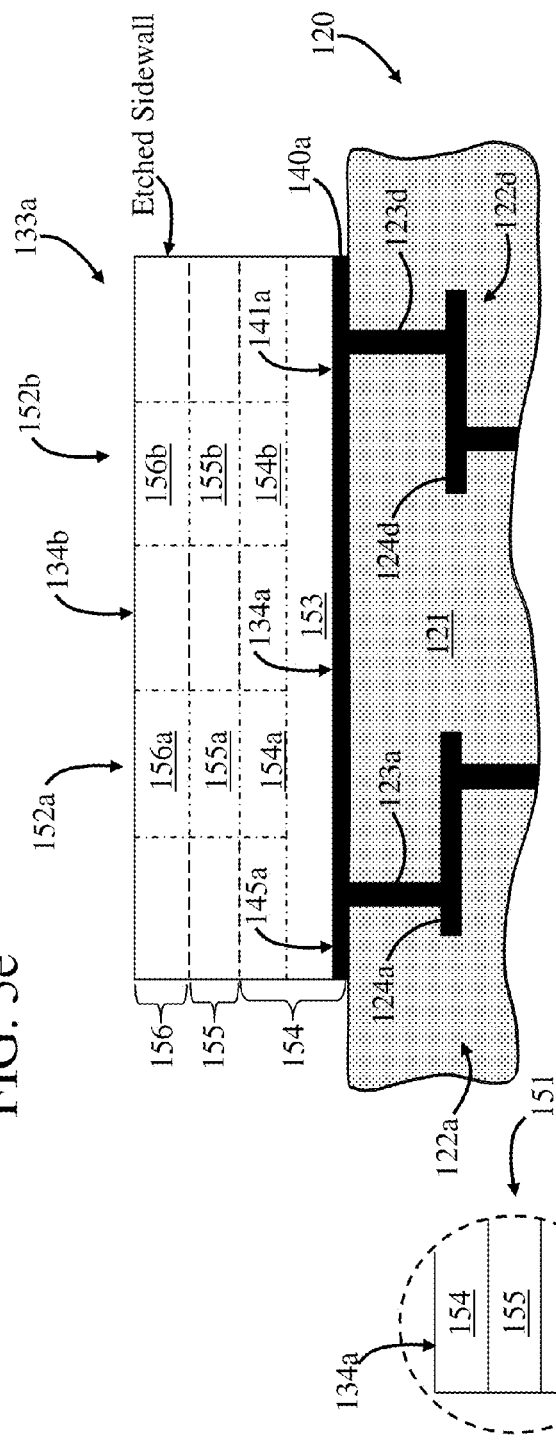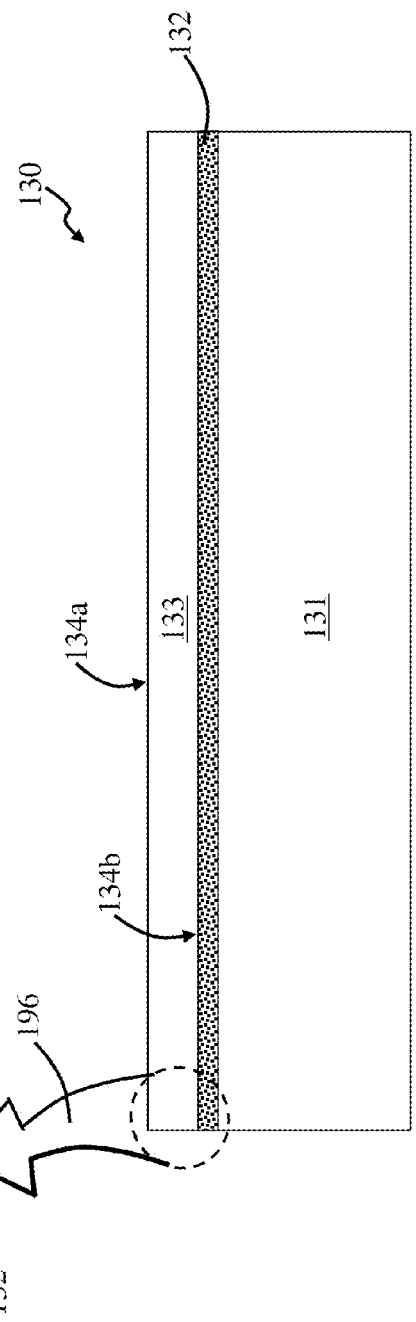

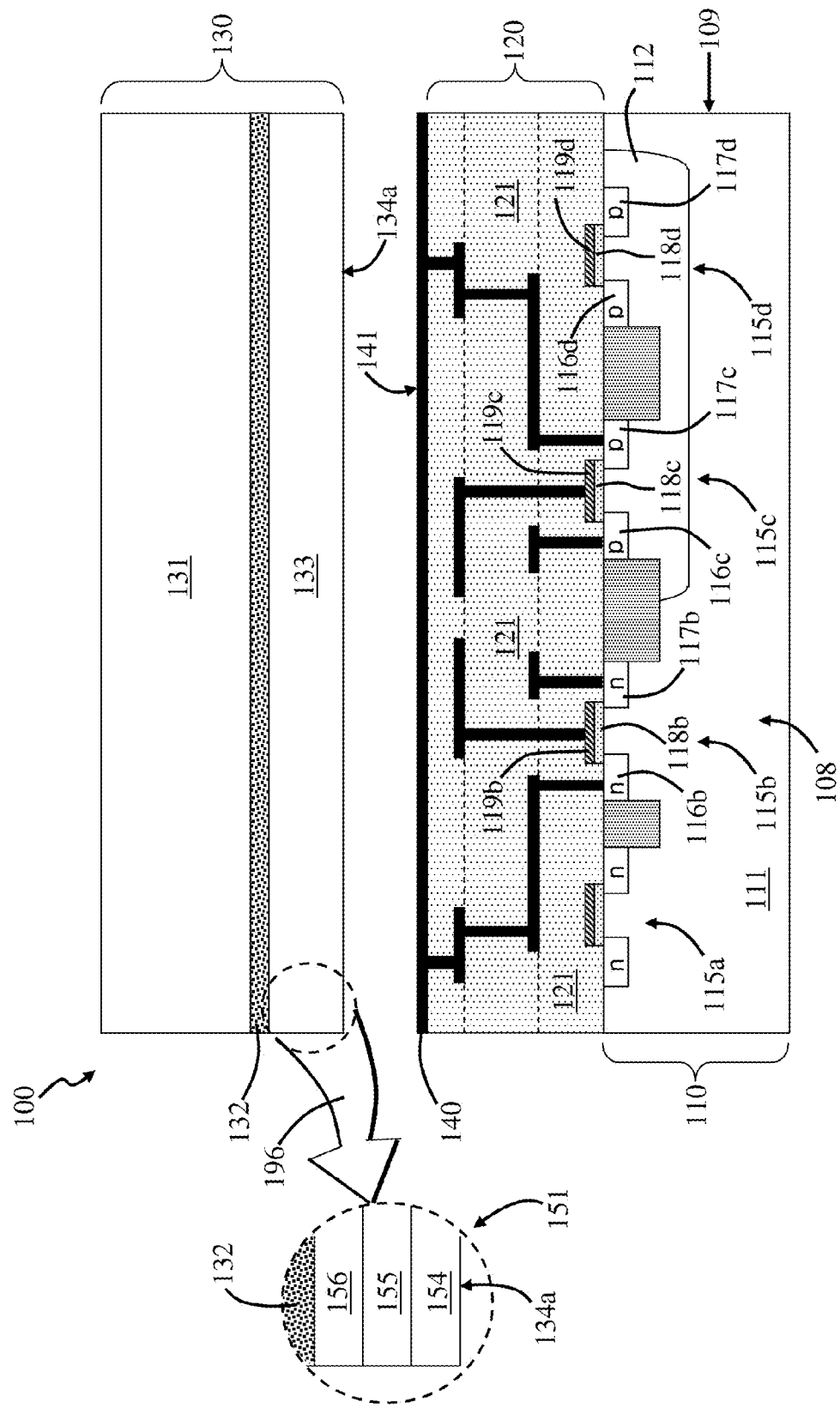

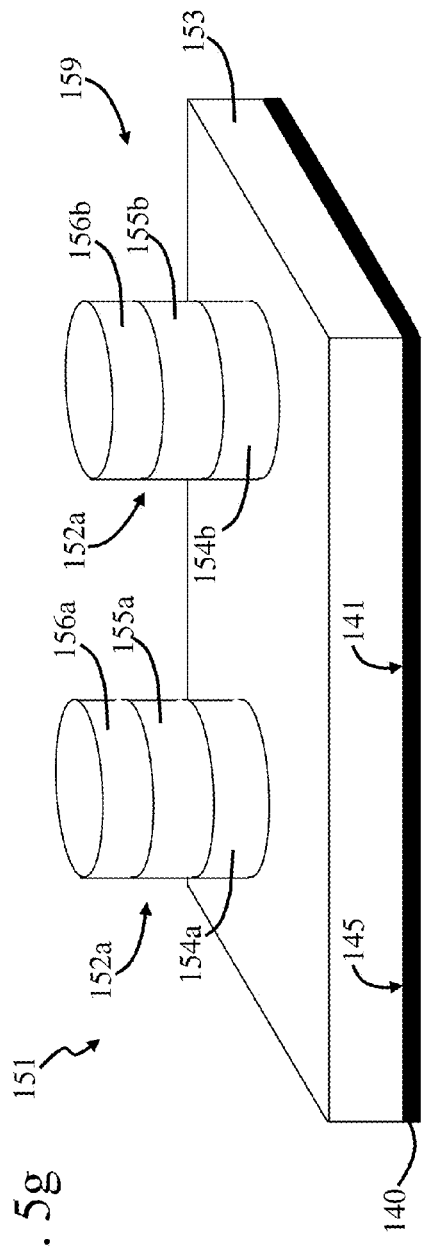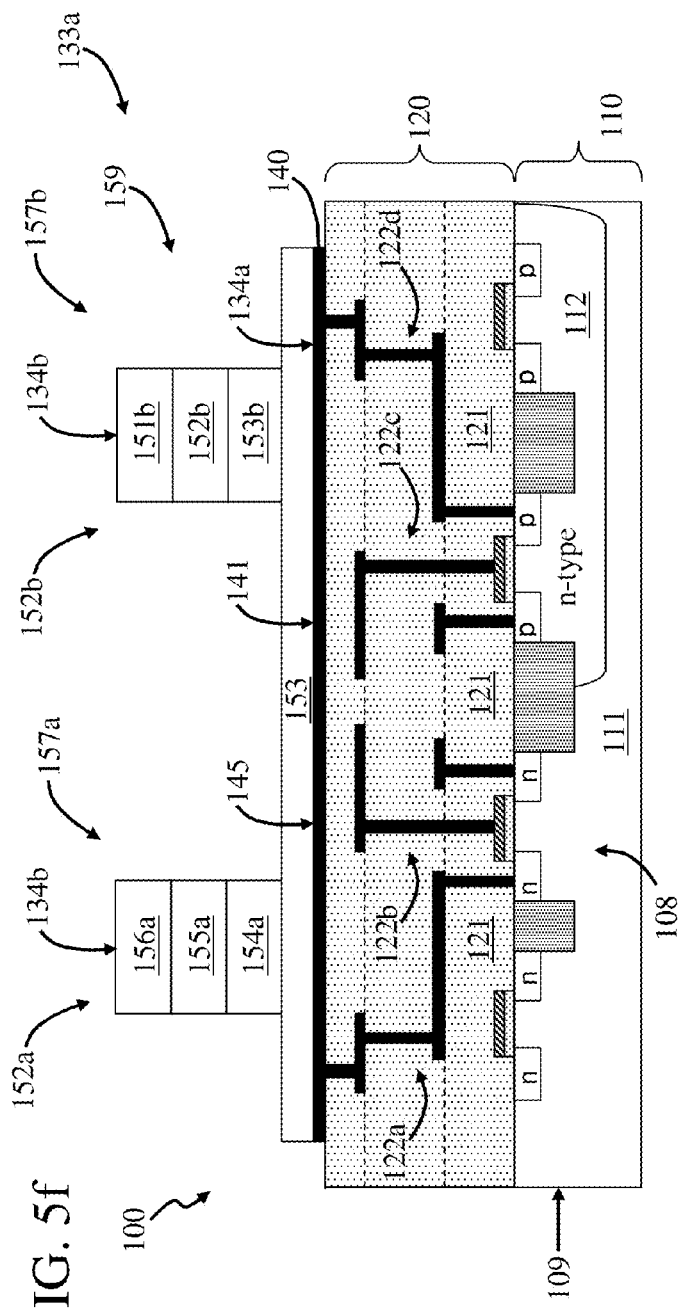

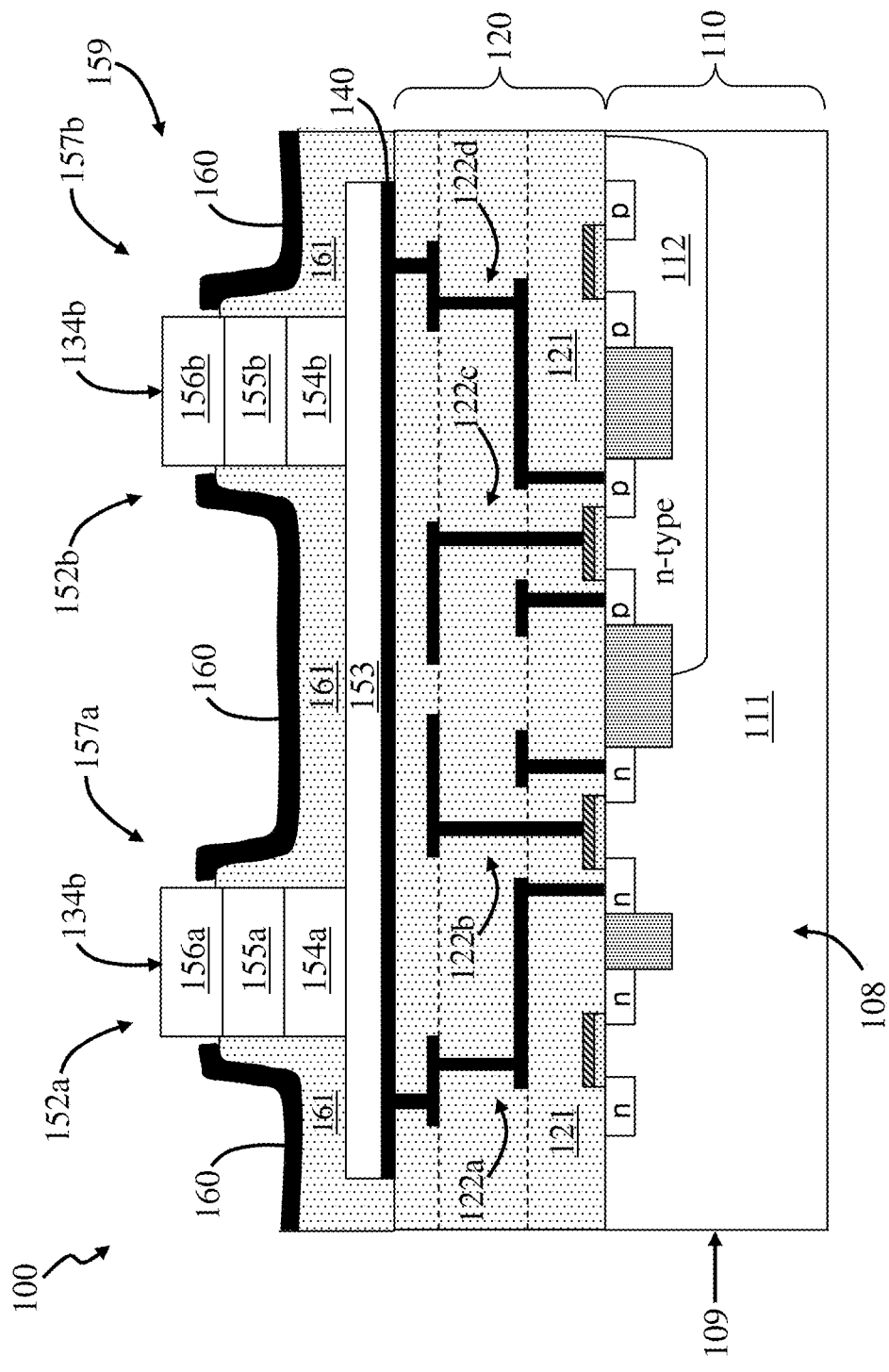

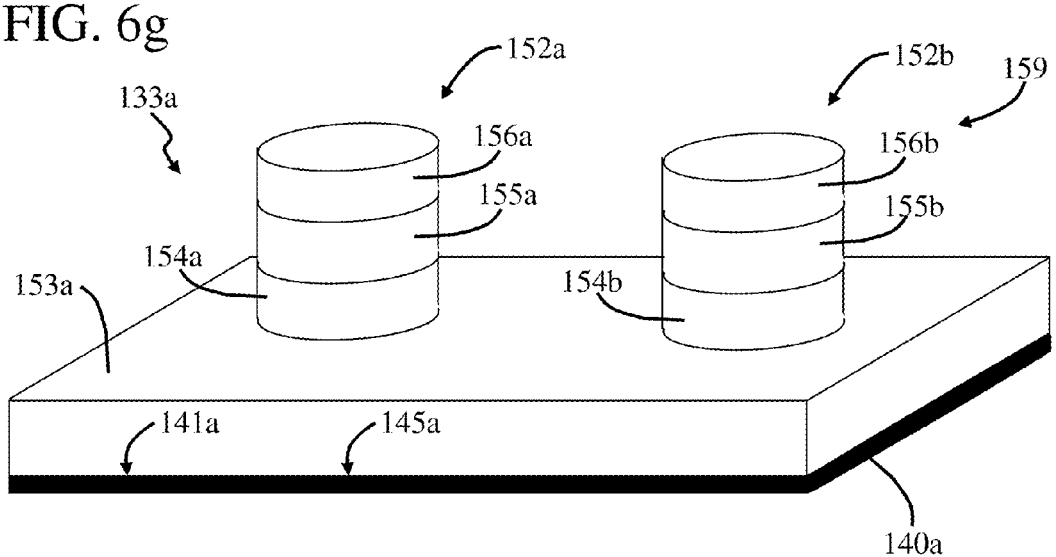
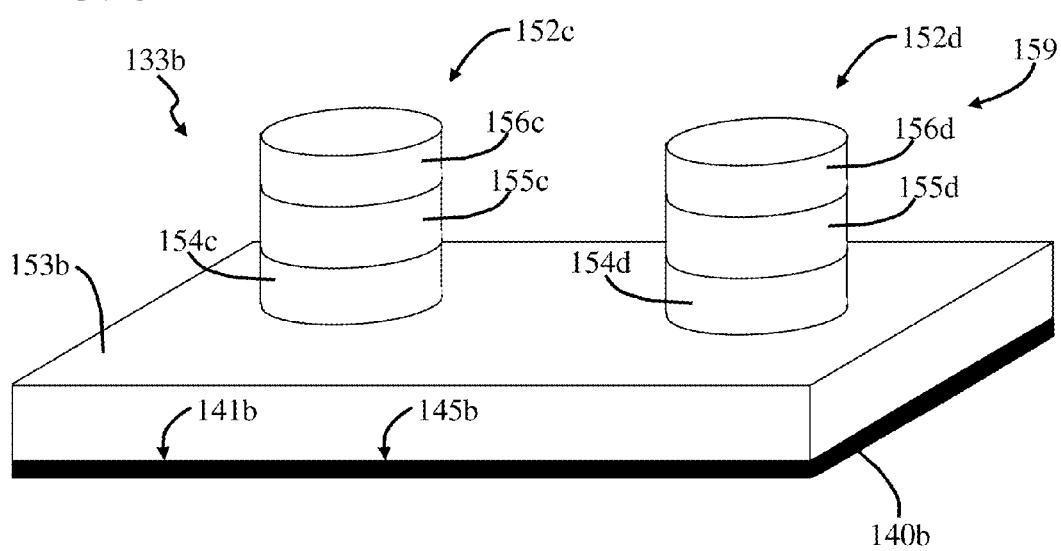

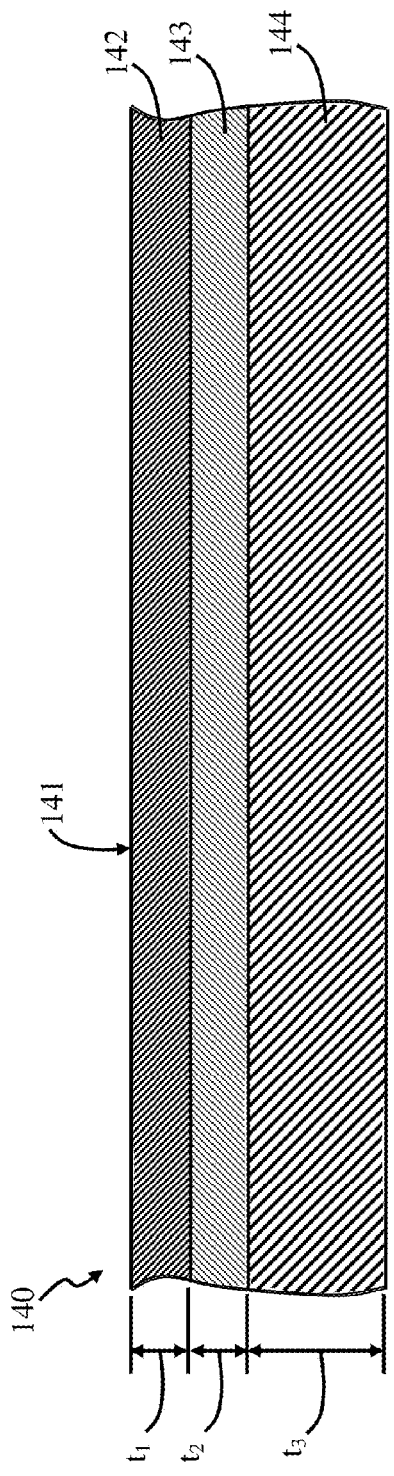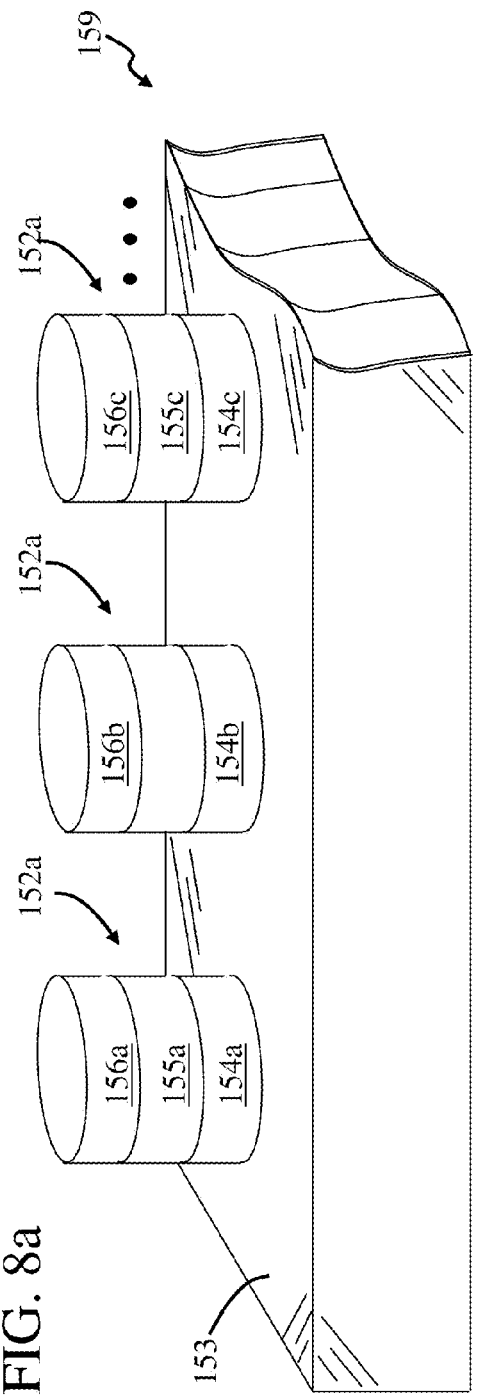

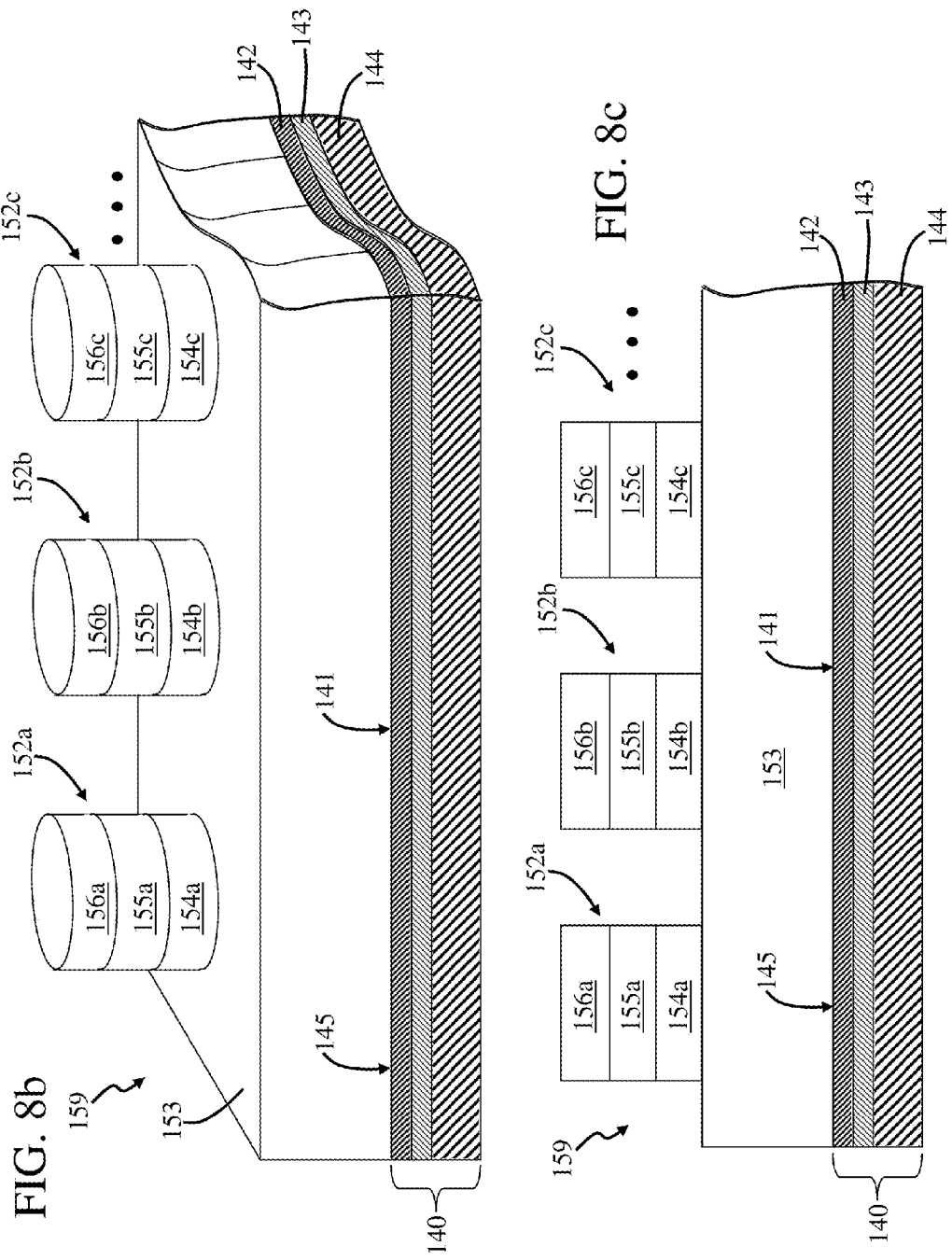

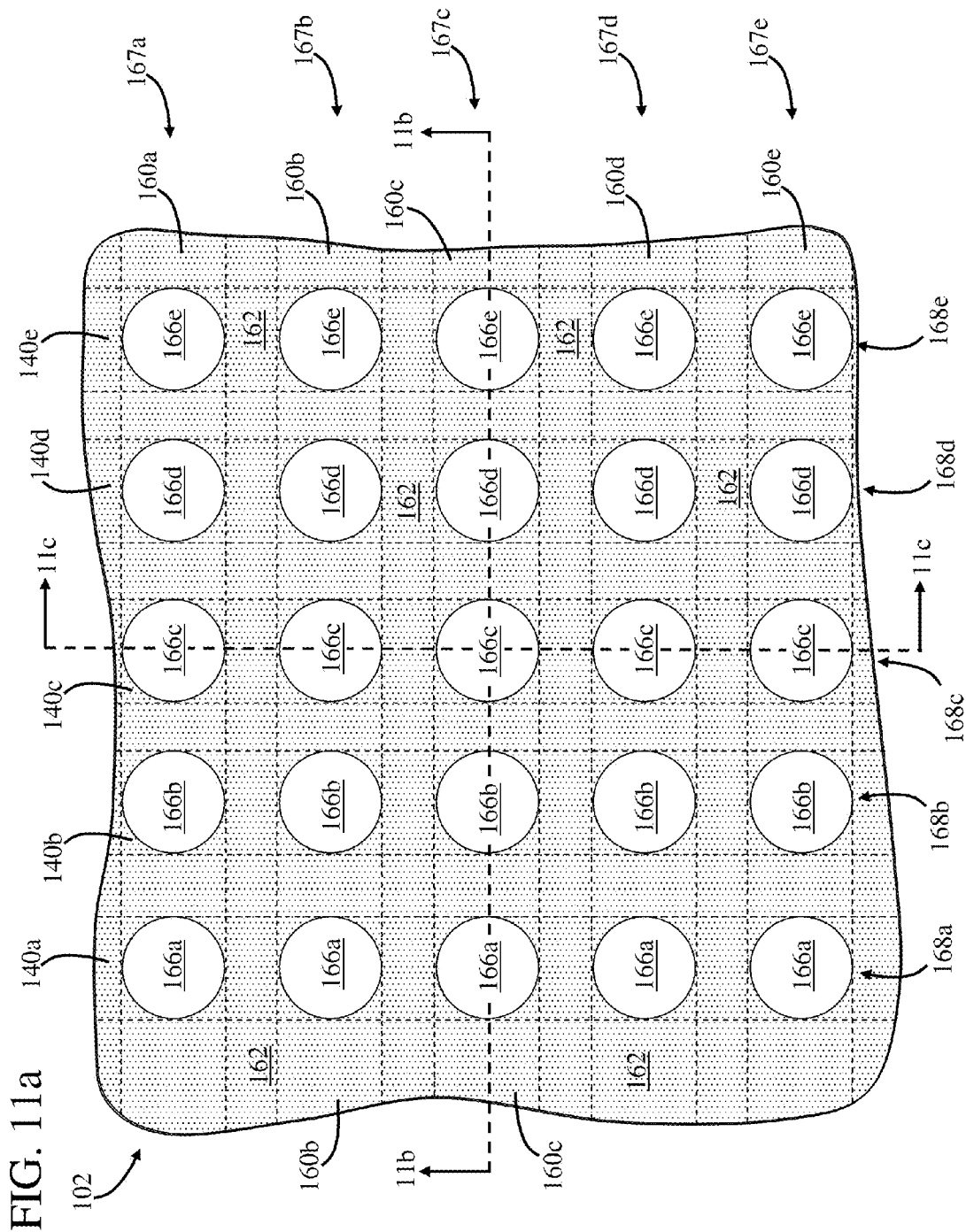

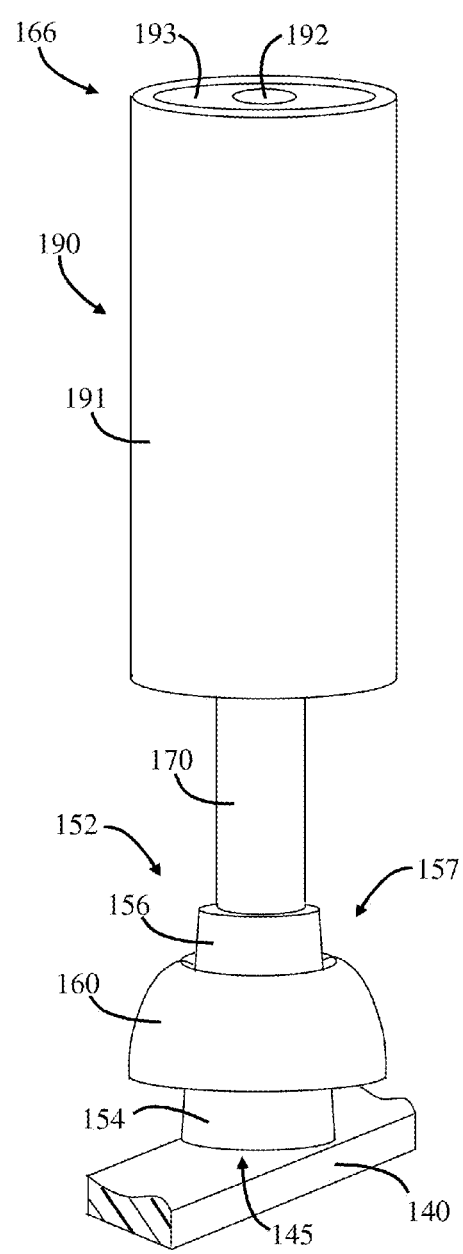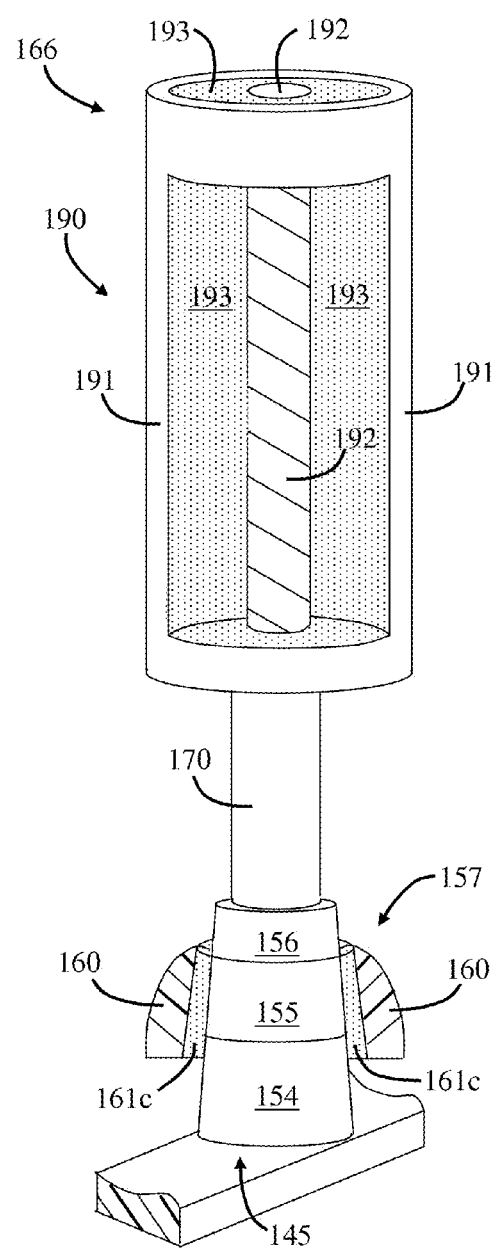

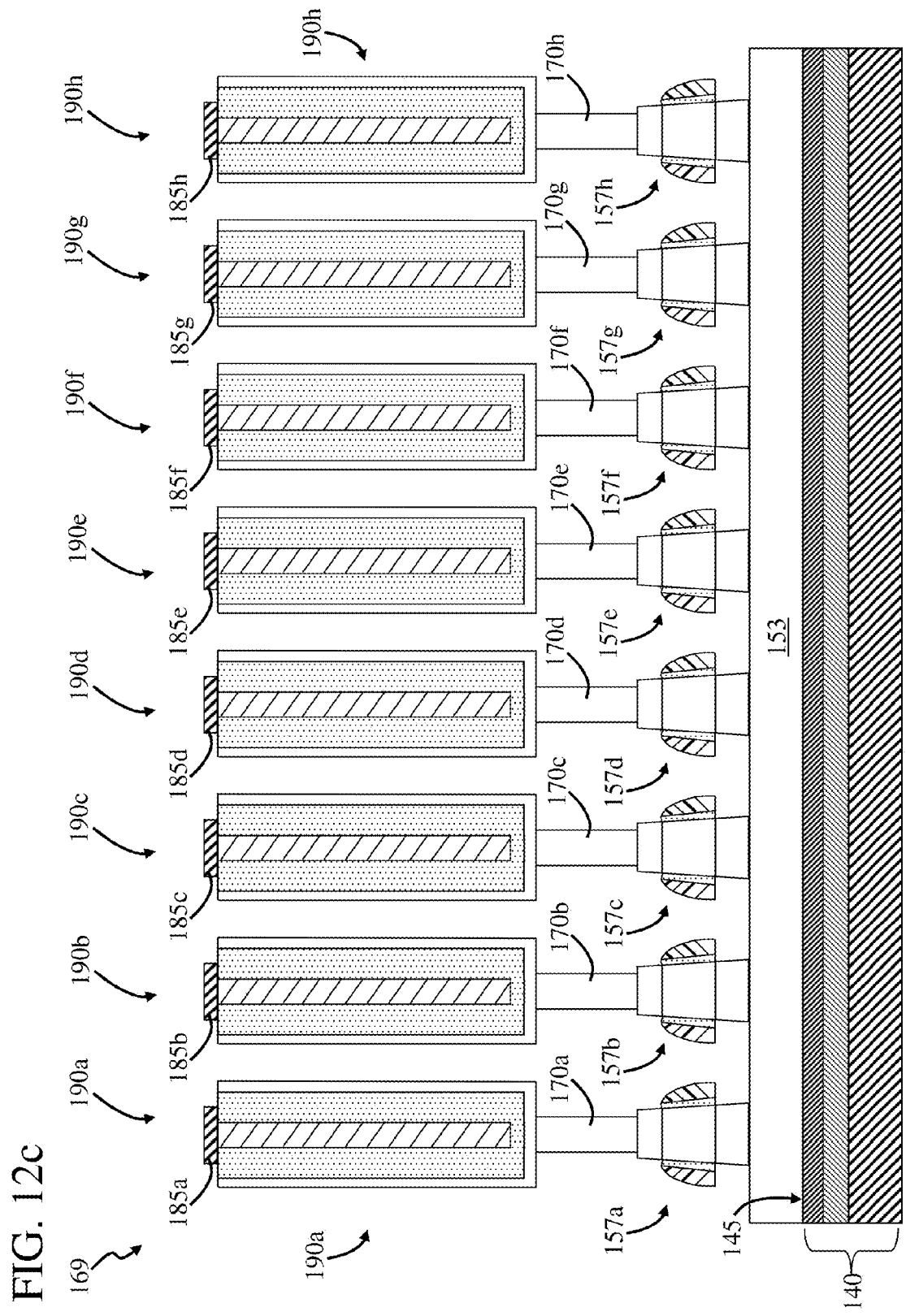

SEMICONDUCTOR CIRCUIT STRUCTURE AND METHOD OF MAKING THE SAME

CROSS-REFERENCE TO RELATED APPLICATIONS

This application claims priority to U.S. Provisional Application No. 61/349,134, filed on May 27, 2010 by the same inventor, the contents of which are incorporated by reference as though fully set forth herein.

BACKGROUND OF THE INVENTION

1. Field of the Invention

The present invention relates generally to a semiconductor circuit structure which includes a conductive bonding region.

2. Description of the Related Art

Advances in semiconductor manufacturing technology have provided computer systems with integrated circuits that include many millions of active and passive electronic devices, along with the interconnects to provide the desired circuit connections. A typical computer system includes a computer chip, with processor and control circuits, and an external memory chip. As is well-known, most integrated circuits include laterally oriented active and passive electronic devices that are carried on a single major surface of a substrate. The current flow through laterally oriented devices is generally parallel to the single major surface of the substrate. Active devices typically include transistors and passive devices typically include resistors, capacitors and inductors. However, these laterally oriented devices consume significant amounts of chip area. Laterally oriented devices are sometimes referred to as planar or horizontal devices. Examples of laterally oriented devices can be found in U.S. Pat. Nos. 6,600,173 to Tiwari, 6,222,251 to Holloway and 6,331,468 to Aronowitz.

Vertically oriented devices extend in a direction that is generally perpendicular to the single major surface of the substrate. The current flow through vertically oriented devices is perpendicular to the single major surface of the substrate. Hence, the current flow through a vertically oriented semiconductor device is perpendicular to the current flow through a horizontally oriented semiconductor device. Examples of vertically oriented semiconductor device can be found in U.S. Pat. Nos. 5,106,775 to Kaga, 6,229,161 to Nemati and 7,078,739 to Nemati.

It should be noted that U.S. Pat. Nos. 5,554,870 to Fitch, 6,229,161 to Nemati and 7,078,739 to Nemati disclose the formation of both horizontal and vertical semiconductor devices on a single major surface of a substrate. However, forming both horizontal and vertical semiconductor devices on a single major surface of a substrate complicates the processing steps because the required masks used to form the horizontal and vertical semiconductor devices are not compatible.

Some references disclose forming an electronic device, such as a dynamic random access memory (DRAM) capacitor, by crystallizing polycrystalline and/or amorphous semiconductor material using a laser. One such electronic device is described in U.S. patent Application No. 20040156233 to Bhattacharyya. The laser is used to heat the polycrystalline or amorphous semiconductor material to form a single crystalline semiconductor material. However, a disadvantage of this method is that the laser is capable of driving the temperature of the semiconductor material to be greater than 800 degrees Celsius (° C.). In some situations, the temperature of the semiconductor material is driven to be greater than about 1000° C. It should be noted that some of this heat undesirably flows to other regions of the semiconductor structure proximate to the DRAM capacitor, which can cause damage.

Another type of semiconductor memory is referred to as a static random access memory (SRAM) circuit. There are many different circuits that operate as SRAM memory circuits, with examples being disclosed in U.S. Pat. Nos. 5,047,979, 5,265,047 and 6,259,623. Some SRAM memory circuits include four transistors per unit cell, and others include six transistors per unit cell. In general, an SRAM memory circuit occupies more area as the number of transistors it includes increases. Hence, an SRAM memory circuit having six transistors generally occupies more area than an SRAM memory circuit having four transistors.

The transistors of many SRAM memory circuits are metal oxide field effect (MOSFET) transistors, which can be n-channel or p-channel. An n-channel MOSFET is typically referred to as an NMOS transistor and a p-channel MOSFET is typically referred to as a PMOS transistor. SRAM memory circuits are complementary metal oxide semiconductor (CMOS) circuits when they include NMOS and PMOS transistors in communication with each other. A substrate which carries a CMOS circuit requires a p-type well and an n-type well, wherein the p-type well is used to from the NMOS transistors and the n-type well is used to form the PMOS transistors. The p-type well and n-type well are spaced apart from each other, which undesirably increases the area occupied by the CMOS circuit.

Some vertically oriented semiconductor devices are coupled to an interconnect region through a bonding region. Several examples of bonding regions can be in U.S. Pat. Nos. 7,671,371, 7,633,162, 7,632,738, 7,470,598, 7,470,142, 7,378,702, 7,052,941 and 7,718,508. It is desirable, however, to have a bonding region that provides a desired conductivity as well as a desired bonding strength.

BRIEF SUMMARY OF THE INVENTION

The present disclosure is generally directed to a semiconductor circuit structure, and a method of forming the semiconductor circuit structure. The invention will be best understood from the following description when read in conjunction with the accompanying drawings.

BRIEF DESCRIPTION OF THE DRAWINGS

FIG. 1b is a perspective view of a substrate and grown semiconductor layer of the grown semiconductor structure of FIG. 1a.

FIG. 2b is a perspective view of a substrate and grown semiconductor layer of the bonded semiconductor structure of FIG. 2a.

FIGS. 5a-5k are views of steps of manufacturing one embodiment of a bonded semiconductor structure.

FIGS. 6a-6j are views of steps of manufacturing another embodiment of a bonded semiconductor structure.

FIG. 7a is a close-up view of a conductive bonding region of a bonded semiconductor structure, wherein the conductive bonding region includes a conductive layer, barrier layer and bonding layer.

FIG. 7b is a side view of a vertically oriented semiconductor device carried by the conductive bonding region of FIG. 7a.

FIG. 8a is a perspective view of a mesa structure array having a plurality of mesa structures.

FIG. 8b is a perspective view of the mesa structure array of FIG. 8a carried by the conductive bonding region of FIG. 7a.

FIG. 8c is a side view of the mesa structure array of FIG. 8a carried by the conductive bonding region of FIG. 7a.

FIG. 9b is a top view of the mesa structure array of FIG. 9a.

FIG. 10b is a top view of the mesa structure array of FIG. 10a.

FIG. 11a is a top view of a portion of a bonded semiconductor structure, wherein bonded semiconductor structure includes a plurality of memory devices arranged in rows and columns.

FIGS. 11d and 11e are perspective views of one embodiment of a memory device of the bonded semiconductor structure of FIG. 11a.

FIGS. 12b and 12c are cut-away perspective and side views, respectively, of the array of memory elements of FIG. 12a.

DETAILED DESCRIPTION OF THE INVENTION

Figure 1A:
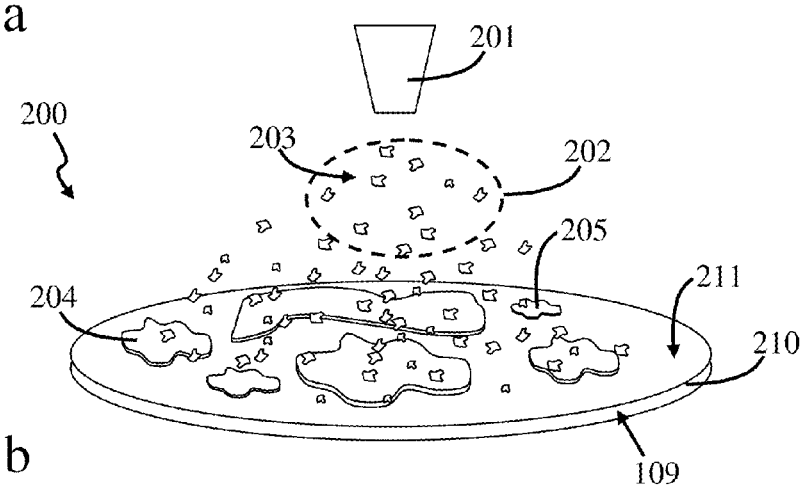
FIG. 1a is a perspective view of a partially fabricated grown semiconductor structure.

Information regarding how to make and use some of the embodiments of this disclosure can be found in several U.S. Patents and Patent Applications by the same inventor as this disclosure. For example, information can be in U.S. patent application Ser. Nos.:

11/092,498, filed on Mar. 29, 2005,
11/092,499, filed on Mar. 29, 2005,
11/092,500, filed on Mar. 29, 2005,
11/092,501, filed on Mar. 29, 2005;
11/092,521, filed on Mar. 29, 2005;
11/180,286, filed on Jul. 12, 2005;
11/378,059, filed on Mar. 17, 2006;
11/606,523, filed on Nov. 30, 2006,
11/873,719, filed on Oct. 17, 2007; and
11/873,769, filed on Oct. 17, 2007;
11/873,851, filed on Oct. 17, 2007, the contents of all of which are incorporated by reference as though fully set forth herein.

Information regarding how to make and use some of the embodiments of this disclosure can be found in U.S. Pat. Nos. 7,052,941, 7,378,702, 7,470,142, 7,470,598, 7,632,738, 7,633,162, 7,671,371, and 7,718,508, the contents of all of which are incorporated by reference as though fully set forth herein. It should be noted that U.S. Pat. Nos. 7,052,941, 7,378,702, 7,470,142, 7,470,598, 7,632,738, 7,633,162, 7,671,371, and 7,718,508, are by the same inventor as this disclosure. It should also be noted that in the following figures, like reference characters indicate corresponding elements throughout the several views.

FIG. 1a is a perspective view of a partially fabricated grown semiconductor structure 200. In this embodiment, grown semiconductor structure 200 includes a substrate 210. Substrate 210 can be of many different types, such as a semiconductor wafer. Semiconductor wafers are manufactured in many different sizes. For example, silicon wafers are typically manufactured in 100 millimeters (mm), 200 mm and 300 mm wafer sizes. A gaseous semiconductor material 203 is provided from a growth material source 201 in a region 202 proximate to a substrate surface 211 of substrate 210. It should be noted that, in general, more than one material sources are used to provide growth material and process gases. However, one material source is shown in FIG. 1a for simplicity and ease of discussion.

The semiconductor material discussed herein can be of many different types, such as silicon, germanium, silicongermanium, gallium arsenide, silicon carbide gallium nitride, as well as alloys thereof. Further, substrate 210 can include a single layer structure, such as a silicon layer. However, in other embodiments, substrate 210 can include a multiple layer structure, such as a silicon-on-sapphire (SOS) and silicon-on-insulator (SOI) layer structure.

Figure 1B:
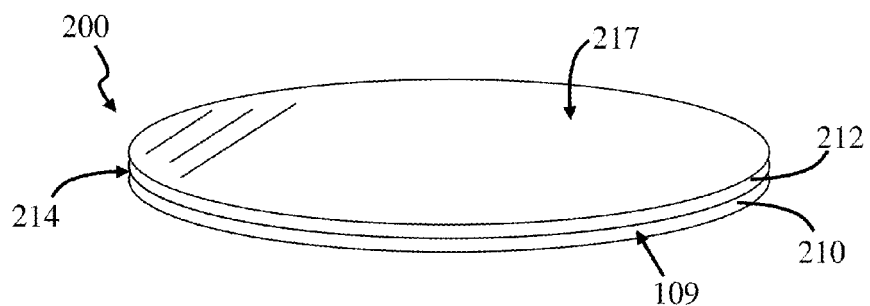
Figure 1C:
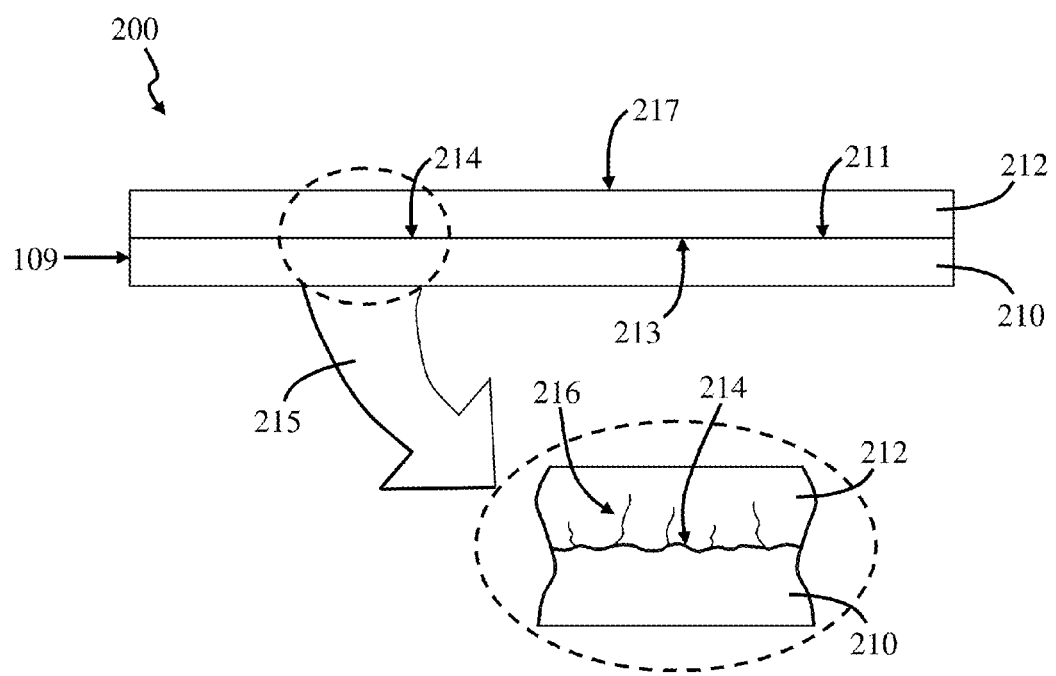
FIG. 1c is a side view of the grown semiconductor structure of FIG. 1b.

Portions of gaseous semiconductor material 203 engage surface 211 to form agglomerated semiconductor material 204 and 205. Portions of gaseous semiconductor material 203 engage surface 211 to form a grown semiconductor layer 212 on surface 211 of substrate 210, as shown in FIG. 1b, and a growth interface 214, as shown in FIG. 1c. FIG. 1b is a perspective view of substrate 210 and grown semiconductor layer 212, and FIG. 1c is a side view of grown semiconductor structure 200, as shown in FIG. 1b. Grown semiconductor layer 212 can be formed on substrate 210 in many different ways, such as by chemical vapor deposition, molecular beam epitaxy and sputtering, among others. It should be noted that, if desired, another semiconductor layer can be grown on a surface 217 of semiconductor layer 212 so that a stack of semiconductor regions is formed. More information regarding forming a stack of semiconductor regions is provided below with FIGS. 3a, 3b and 3c and FIGS. 4a, 4b and 4c.

As shown in FIG. 1c, a surface 213 of grown semiconductor layer 212 faces surface 211 of substrate 210, wherein surface 213 is opposed to surface 217. In particular, surface 213 is formed in response to the agglomeration of growth material on surface 211 so that a growth interface 214 is formed in response. Growth interface 214 is formed in response to gaseous semiconductor material 203 agglomerating on surface 211. In this example, growth interface 214 is formed in response to agglomerated semiconductor material 204 and 205 forming on surface 211, as shown in FIG. 1a. In this way, a grown semiconductor structure is fabricated using growth.

As indicated by an indication arrow 215, a growth defect 216 is formed in response to forming growth interface 214. Growth defect 216 can be of many different types, such as a dislocation. It should be noted that, in general, a number of growth defects 216 are formed in response to forming growth interface 214. The quality of growth interface 216 increases and decreases in response to decreasing and increasing, respectively, the number of growth defects 216.

Figure 2A:
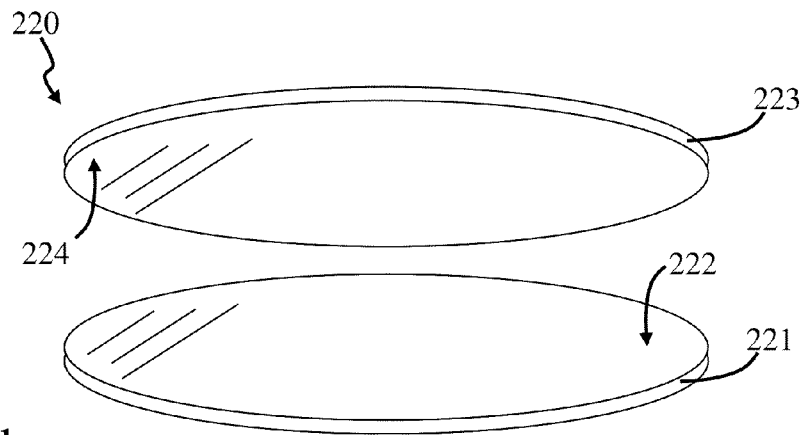
FIG. 2a is a perspective view of a partially fabricated bonded semiconductor structure.

FIG. 2a is a perspective view of a partially fabricated bonded semiconductor structure 220. Bonded semiconductor structure 220 includes substrates 221 and 223. Substrates 221 and 223 can be of many different types, such as semiconductor substrates. Substrates 221 and 223 can include many different layer structures. For example, in some embodiments, substrates 221 and 223 each include conductive bonding layers adjacent to surfaces 222 and 224 of substrates 221 and 223, respectively. It should be noted that, if desired, substrate 223 can include a stack of semiconductor regions. The stack of semiconductor regions of substrate 223 can be formed in many different ways, several of which will be discussed in more detail with FIGS. 3a, 3b and 3c and FIGS. 4a, 4b and 4c.

Figure 2B:
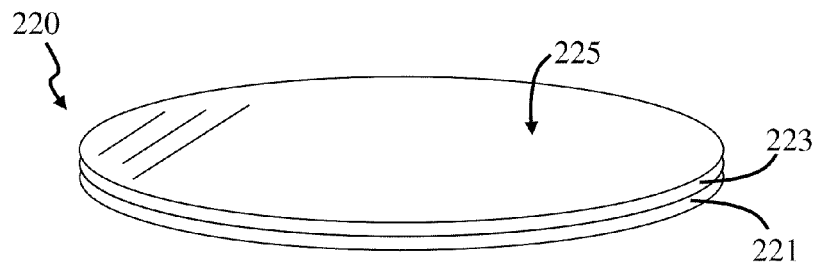
Figure 2C:
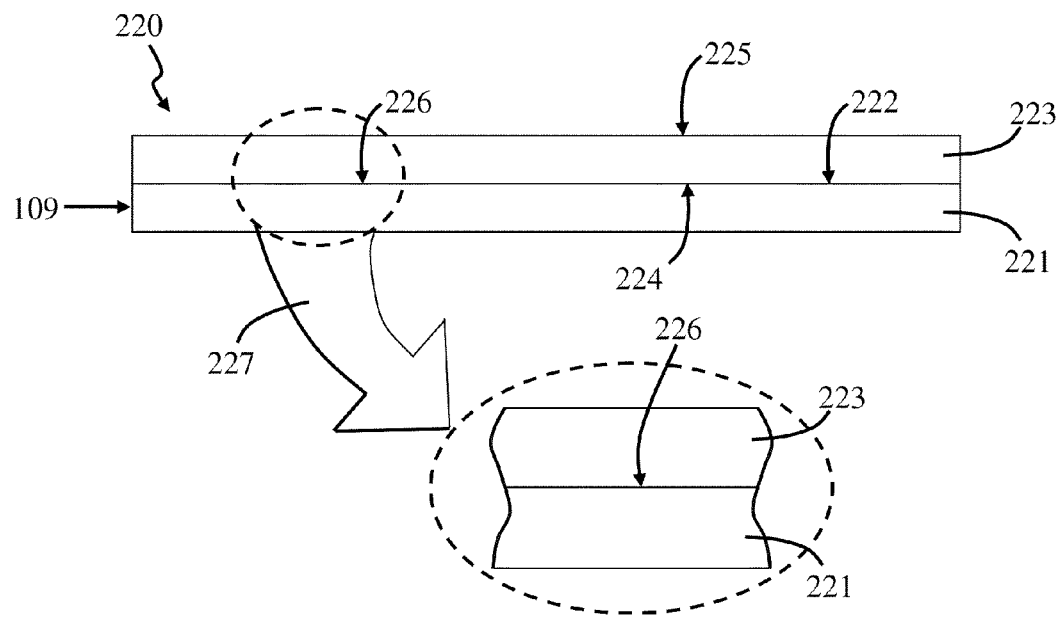
FIG. 2c is a side view of the bonded semiconductor structure of FIG. 2b.

As shown in FIGS. 2b and 2c, substrates 221 and 223 are moved towards each other so that a bonding interface 226 is formed in response. In particular, surfaces 222 and 224 of substrates 221 and 223, respectively, are moved towards each other so that bonding interface 226 is formed in response to surfaces 222 and 224 being engaged. FIG. 2b is a perspective view of substrates 221 and 223 bonded to each other, and FIG. 2c is a side view of substrates 221 and 223 bonded to each other, as shown in FIG. 2b.

In FIG. 2c, surface 222 of substrate 221 faces surface 224 of substrate 223. In particular, surface 221 engages surface 224 so that bonding interface 226 is formed in response. It should be noted that bonding interface 226 is not formed in response to a gaseous semiconductor material engaging surface 222. In particular, bonding interface 226 is not formed in response to agglomerating semiconductor material on surface 222. In this way, a bonded semiconductor structure is fabricated using bonding.

As indicated by an indication arrow 227, a growth defect is not formed in response to forming bonding interface 226. It should be noted that a signal experiences less attenuation in response to flowing through a bonding interface, and the signal experiences more attenuation in response to flowing through a growth interface. For example, a current signal experiences less attenuation in response to flowing through a bonding interface, and the current signal experiences more attenuation in response to flowing through a growth interface. Further, the noise of a signal increases more in response to flowing through a growth interface, and the noise of the signal increases less in response to flowing through a bonding interface.

It should also be noted that portions of the semiconductor structures discussed below are fabricated using growth, and other portions are fabricated using bonding. More information regarding bonding and growth interfaces can be found in related U.S. patent application Ser. No. 11/606,523, which is referenced above. Information regarding bonding and growth interfaces can also be found in U.S. Pat. Nos. 5,152,857, 5,695,557, 5,980,633 and 6,534,382.

A bonding interface is an interface that is formed in response to bonding material layers together. In one example of forming a bonding interface, first and second material layers are formed as separate layers, and moved towards each other so they engage each other and the bonding interface is formed in response. In this way, a bonding interface is established. It should be noted that heat is generally applied to the first and/or second material layers to facilitate the formation of the bonding interface. In a metal-to-metal bonding interface, the first and second material layers that are bonded together are conductive materials, such as metals. In a metal-to-dielectric bonding interface, one of the first and second material layers is a conductive material, and the other one is a dielectric material. In a metal-to-semiconductor bonding interface, one of the first and second material layers is a conductive material, and the other one is a semiconductor material.

A growth interface is an interface that is formed in response to growing a material layer on another material layer. In one example of forming a growth interface, a third material layer is formed, and a fourth material layer is grown on the third material layer so that the growth interface is formed in response. In this way, a growth interface is established. Hence, when forming a growth interface, third and fourth material layers are not formed as separate layers, and moved to engage each other.

In a metal-to-metal growth interface, the third and fourth material layers are conductive materials, such as metals. In a metal-to-dielectric growth interface, one of the third and fourth material layers is a conductive material, and the other one is a dielectric material. In a metal-to-semiconductor growth interface, one of the third and fourth material layers is a conductive material, and the other one is a semiconductor material. In a dielectric-to-dielectric growth interface the third and fourth materials are dielectric materials.

It should be noted that, in general, it is difficult to establish a metal-to-semiconductor growth interface, wherein the semiconductor material is grown on the metal layer. Further, it is difficult to grow a crystalline semiconductor material layer on a metal layer using semiconductor growth techniques, such as chemical vapor deposition. In most instances, the metal layer is formed on the semiconductor material. It is difficult to grow semiconductor material on a metal layer because metal layers do not operate as a very good seed layer for the semiconductor material. Hence, a significant amount of the semiconductor material will not agglomerate on the metal layer.

It is difficult to grow crystalline semiconductor material on the metal layer because metal layers tend to not be crystalline, and semiconductor material tends to have the crystal structure of the material it is formed on. Hence, if a semiconductor material is formed on a metal layer that includes non-crystalline conductive material, then the semiconductor material will also have a non-crystalline crystal structure and poor material quality. Thus, it is useful to bond crystalline semiconductor material to a metal layer to form a metal-to-semiconductor bonding interface.

In general, bonding and growth interfaces have different types and amounts of defects. For example, dislocations often extend from a growth interface in the direction of material growth. The difference between bonding and growth interfaces can be determined in many different ways, such as by using Transmission Electron Microscopy (TEM) to determine the type and amount of defects proximate to the interface. Information regarding TEM can be found in U.S. Pat. Nos. 5,892,225, 6,531,697, 6,822,233 and 7,002,152.

Figure 3A:
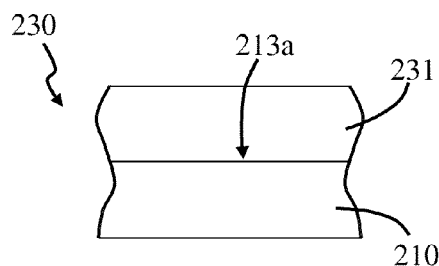
FIGS. 3a, 3b and 3c are side views of steps of fabricating a semiconductor structure, wherein the semiconductor structure includes a stack of device structure layers formed using growth.
Figure 3B:
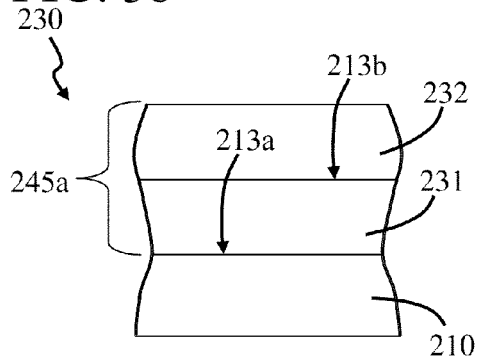
Figure 3C:
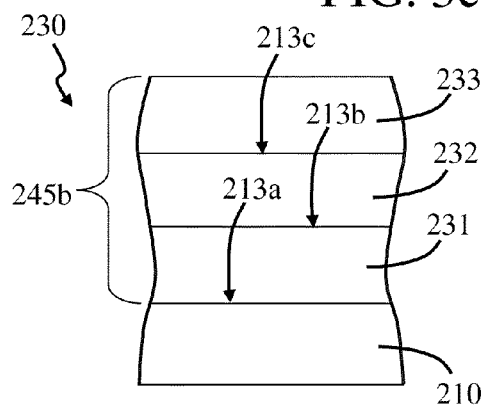

FIGS. 3a, 3b and 3c are side views of steps of fabricating a semiconductor structure 230, wherein structure 230 includes a stack of semiconductor regions formed using growth. It should be noted that, in this example, the stack of semiconductor regions generally includes two or more semiconductor layers. In this example, a semiconductor layer 231 is grown on substrate 210 so that a growth interface 213a is formed therebetween, as shown in FIG. 3a. A semiconductor layer 232 is grown on semiconductor layer 231 so that a growth interface 213b is formed therebetween, as shown in FIG. 3b. In FIG. 3b, a stack 245a includes semiconductor layers 231 and 232, and growth interfaces 213a and 213b. A semiconductor layer 233 is grown on semiconductor layer 232 so that a growth interface 213c is formed therebetween, as shown in FIG. 3c. In FIG. 3c, a stack 245b includes semiconductor layers 231, 232 and 233, and growth interfaces 213a, 213b and 213c. In this way, a stack of semiconductor regions is fabricated using growth. It should be noted that semiconductor layers 231, 232 and 233 can have many different doping types, several of which are discussed in more detail below.

Figure 4A:
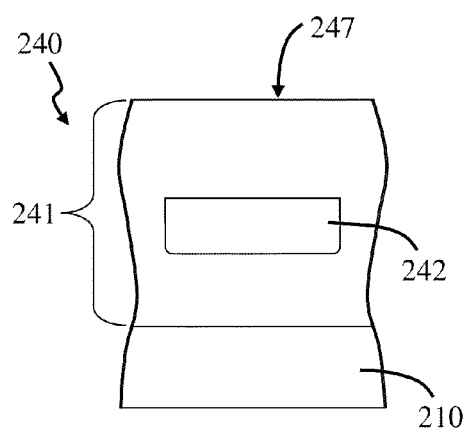
FIGS. 4a, 4b and 4c are side views of steps of fabricating a semiconductor structure, wherein the semiconductor structure includes a stack of device structure layers formed using ion implantation.
Figure 4B:
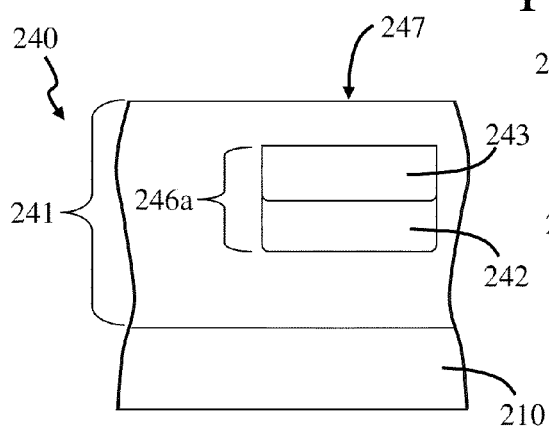
Figure 4C:
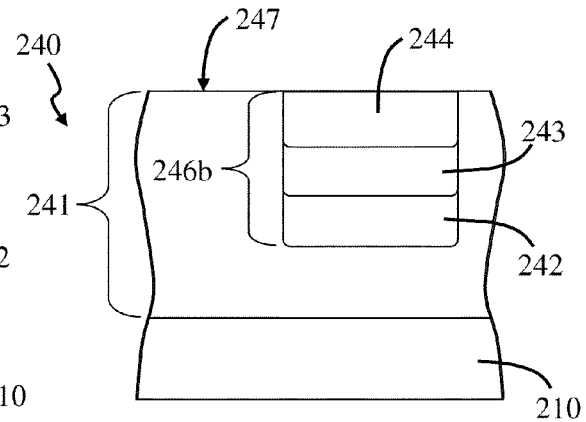

FIGS. 4a, 4b and 4c are side views of steps of fabricating a semiconductor structure 240, wherein structure 240 includes a stack of semiconductor regions formed using ion implantation. It should be noted that, in this example, the stack of semiconductor regions generally includes two or more semiconductor regions formed by ion implantation, wherein the ion implanted semiconductor regions are formed in a semiconductor layer.

In this example, a semiconductor layer 241 is grown on substrate 210, wherein semiconductor layer 241 has a surface 247 positioned away from substrate 210. Implanted regions 242 and 243 are formed in semiconductor layer 241, as shown in FIGS. 4a and 4b. Implanted region 242 is formed in response to introducing a first dopant into semiconductor layer 241 through surface 247. Further, implanted region 243 is formed in response to introducing a second dopant into semiconductor layer 241 through surface 247. In this example, implanted region 242 is positioned between substrate 210 and implanted region 243. Further, implanted region 243 is positioned between surface 247 and implanted region 242. In FIG. 4b, a stack 246a includes semiconductor regions 242 and 243.

An implanted region 244 is formed in semiconductor layer 241, as shown in FIG. 4c. Implanted region 244 is formed in response to introducing a third dopant into semiconductor layer 241 through surface 247. In this example, implanted region 244 is positioned between substrate 210 and implanted regions 242 and 243. Further, implanted region 244 is positioned between surface 247 and implanted regions 242 and 243. In FIG. 4c, a stack 246b includes semiconductor regions 242, 243 and 244. In this way, a stack of semiconductor regions is fabricated using ion implantation. It should be noted that semiconductor regions 242, 243 and 244 can have many different doping types, several of which are discussed in more detail below. It should also be noted that a stack of semiconductor regions can be fabricated using one or more of the growth and implantation steps discussed above. For example, a semiconductor layer with a first conductivity type can be grown and implanted with an implant species to form a semiconductor region with a second conductivity type, wherein the semiconductor layer includes the semiconductor region with the second conductivity type.

FIGS. 5a-5k are views of steps of manufacturing a bonded semiconductor structure 100. More information regarding how to make and use a bonded semiconductor structure can be found in the above-identified U.S. Patents and Patent Applications by the same inventor as this disclosure, which are incorporated herein by reference.

Figure 5A:
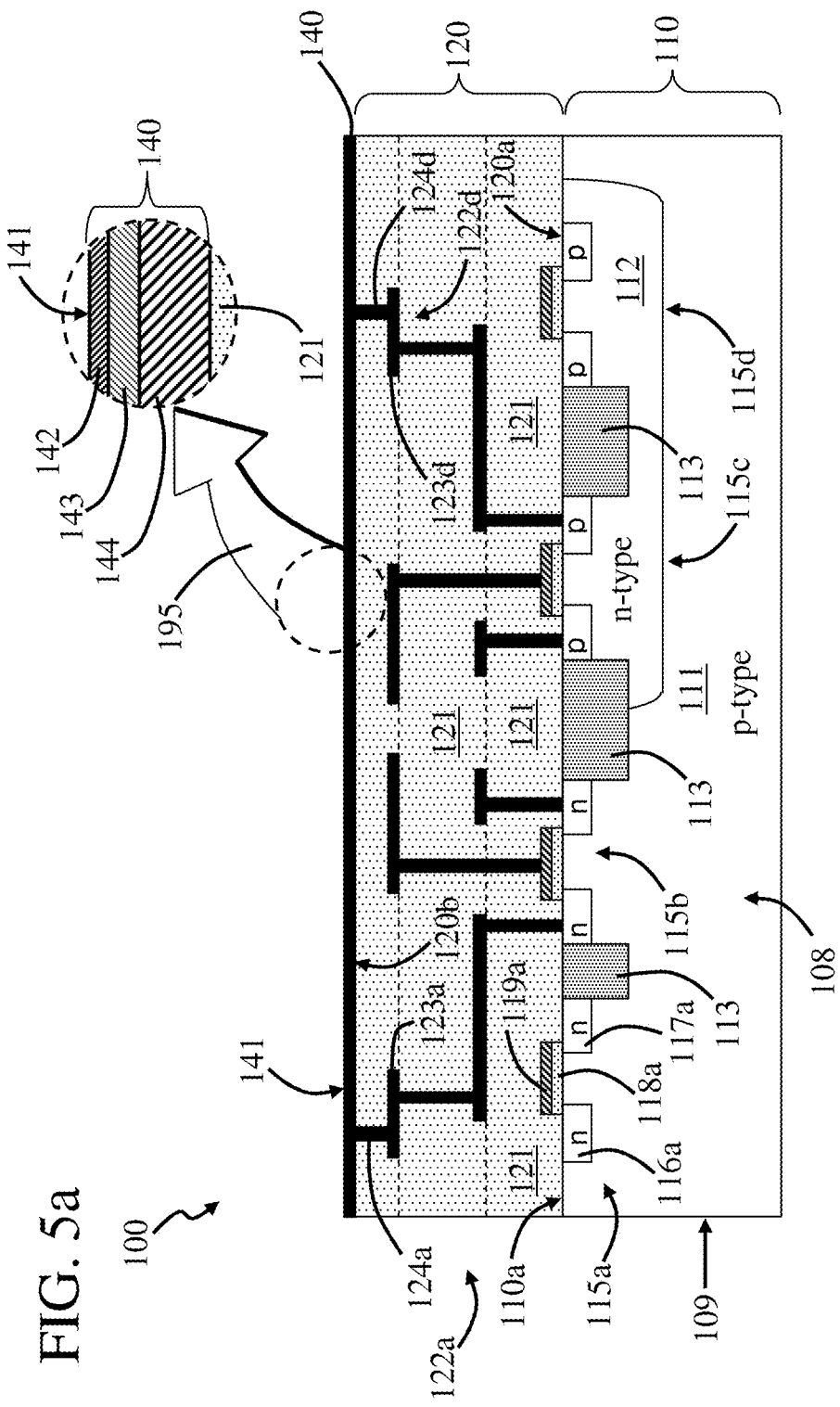

FIG. 5a is a side view of partially fabricated bonded semiconductor structure 100. In this embodiment, bonded semiconductor structure 100 includes a support substrate 110 having a support substrate body 111, wherein support substrate 110 carries an interconnect region 120. Support substrate 110 is bounded by an outer sidewall 109 which extends around its outer periphery. Support substrate 110 can be of many different types, such as a semiconductor wafer which carries an electronic circuit 108. Electronic circuit 108 can be of many different types, such as a complementary metal oxide semiconductor (CMOS) circuit. A CMOS circuit includes PMOS and NMOS devices in communication with each other in a well-known manner. More information regarding electronic circuits carried by support substrates can be found in the above-identified U.S. Patents and Patent Applications by the same inventor as this disclosure, which are incorporated herein by reference. Electronic circuit 108 can operate in many different ways. For example, electronic circuit 108 can operate as a processor and/or controller. More information regarding the operation of processors and controllers can be found in the above-identified U.S. Patents and Patent Applications by the same inventor as this disclosure, which are incorporated herein by reference.

In this embodiment, electronic circuit 108 includes a transistor 115a, which includes a source 116a and drain 117a which extend through support substrate body 111. Further, transistor 115a includes a control dielectric 118a which extends along surface 110a between source 116a and drain 117a. In this embodiment, transistor 115a includes a control terminal 119a which is electrically coupled to support substrate body 111 through control dielectric 118a. In particular, control terminal 119a is electrically coupled to a portion of support substrate body 111 between source 116a and drain 117a through control dielectric 118a. The conductivity of the portion of support substrate body 111 between source 116a and drain 117a is adjustable in response to a signal provided to control terminal 119a. In this way, transistor 115a operates as a metal oxide semiconductor field effect transistor.

In this embodiment, electronic circuit 108 includes a transistor 115b, which includes a source 116b and drain 117b which extend through support substrate body 111. Further, transistor 115b includes a control dielectric 118b which extends along surface 110a between source 116b and drain 117b. In this embodiment, transistor 115b includes a control terminal 119b which is electrically coupled to support substrate body 111 through control dielectric 118b. In particular, control terminal 119b is electrically coupled to a portion of support substrate body 111 between source 116b and drain 117b through control dielectric 118b. The conductivity of the portion of support substrate body 111 between source 116b and drain 117b is adjustable in response to a signal provided to control terminal 119b. In this way, transistor 115b operates as a metal oxide semiconductor field effect transistor.

In this embodiment, electronic circuit 108 includes a transistor 115c (FIG. 5c), which includes a source 116c and drain 117c which extend through support substrate body 111. Further, transistor 115c includes a control dielectric 118c which extends along surface 110a between source 116c and drain 117c. In this embodiment, transistor 115c includes a control terminal 119c which is electrically coupled to support substrate body 111 through control dielectric 118c. In particular, control terminal 119c is electrically coupled to a portion of support substrate body 111 between source 116c and drain 117c through control dielectric 118c. The conductivity of the portion of support substrate body 111 between source 116c and drain 117c is adjustable in response to a signal provided to control terminal 119c. In this way, transistor 115c operates as a metal oxide semiconductor field effect transistor.

In this embodiment, electronic circuit 108 includes a transistor 115d (FIG. 5c), which includes a source 116d and drain 117d which extend through support substrate body 111. Further, transistor 115d includes a control dielectric 118d which extends along surface 110a between source 116d and drain 117d. In this embodiment, transistor 115d includes a control terminal 119d which is electrically coupled to support substrate body 111 through control dielectric 118d. In particular, control terminal 119d is electrically coupled to a portion of support substrate body 111 between source 116d and drain 117d through control dielectric 118d. The conductivity of the portion of support substrate body 111 between source 116d and drain 117d is adjustable in response to a signal provided to control terminal 119d. In this way, transistor 115d operates as a metal oxide semiconductor field effect transistor.

It should be noted that transistors 115c and 115d extend through a well region 112 of support substrate body 111. Hence, transistors 115a and 115b are different types of transistors from transistors 115c and 115d. In this particular embodiment, transistors 115a and 115b are NMOS transistors because support substrate body 111 is doped p-type, and transistors 115c and 115d are PMOS transistors because well region 112 is doped n-type. It should also be noted that transistors 115a, 115b, 115c and 115d are separated from each other by an isolation region 113.

As will be discussed in more detail below, interconnect region 120 includes a conductive line which extends through a dielectric material region 121. It should be noted that the conductive line is typically in communication with the electronic circuit carried by support substrate 110. The dielectric material of interconnect region 120 can be of many different types, such as silicon dioxide and silicon nitride, among others. A dielectric material operates as a polarizable insulator, wherein the flow of a current therethrough is restricted. The dielectric material generally has a non-crystalline atomic structure. For example, the dielectric material can have a polycrystalline and amorphous atomic structure.

In this embodiment, interconnect region 120 is formed on a support substrate surface 110a, wherein interconnect region 120 includes a surface 120a, which faces support substrate 110, and a surface 120b, which faces away from support substrate 100. In this embodiment, interconnect region 120 is formed using conventional processing techniques, such as photolithography, material deposition and material etching. It should be noted that portions of surface 120b are conductive and other portions of surface 120b are insulative. The portions of surface 120b that are conductive correspond to portions of the conductive line(s) of interconnect region 120 that are adjacent to surface 120b. The portions of surface 120b that are insulative correspond to portions of dielectric material region 121 that are adjacent to surface 120b.

In this embodiment, interconnect region 120 includes a conductive line 122a, which includes a conductive via and conductive interconnect in communication with each other. For example, in this embodiment, conductive line 122a includes a conductive via 124a in communication with a conductive interconnect 123a. Conductive via 124a is in communication with conductive interconnect 123a when a signal is capable of flowing between conductive via 124a and conductive interconnect 123a. In this particular embodiment, conductive via 124a is connected to conductive interconnect 123a. Conductive via 124a is connected to conductive interconnect 123a when conductive via 124a is engaged with conductive interconnect 123a. Conductive line 122a is in communication with electronic circuit 108. In this embodiment, conductive line 122a is in communication with transistor 115b. In particular, conductive line 122a is in communication with source 116b of transistor 115b.

In this embodiment, interconnect region 120 includes a conductive line 122b (FIG. 5d), which includes a conductive via and conductive interconnect in communication with each other. For example, in this embodiment, conductive line 122b includes a conductive via 124b in communication with a conductive interconnect 123b. Conductive via 124b is in communication with conductive interconnect 123b when a signal is capable of flowing between conductive via 124b and conductive interconnect 123b. In this particular embodiment, conductive via 124b is connected to conductive interconnect 123b. Conductive via 124b is connected to conductive interconnect 123b when conductive via 124b is engaged with conductive interconnect 123b. Conductive line 122b in communication with electronic circuit 108. In this embodiment, conductive line 122b is in communication with transistor 115b. In particular, conductive line 122b is in communication with control terminal 119b of transistor 115b.

In this embodiment, interconnect region 120 includes a conductive line 122c (FIG. 5d), which includes a conductive via and conductive interconnect in communication with each other. For example, in this embodiment, conductive line 122c includes a conductive via 124c in communication with a conductive interconnect 123c. Conductive via 124c is in communication with conductive interconnect 123c when a signal is capable of flowing between conductive via 124c and conductive interconnect 123c. In this particular embodiment, conductive via 124c is connected to conductive interconnect 123c. Conductive via 124c is connected to conductive interconnect 123c when conductive via 124c is engaged with conductive interconnect 123c. Conductive line 122c is in communication with electronic circuit 108. In this embodiment, conductive line 122c is in communication with transistor 115c. In particular, conductive line 122c is in communication with control terminal 119b of transistor 115b.

In this embodiment, interconnect region 120 includes a conductive line 122d, which includes a conductive via and conductive interconnect in communication with each other. For example, in this embodiment, conductive line 122d includes a conductive via 124d in communication with a conductive interconnect 123d. Conductive via 124d is in communication with conductive interconnect 123d when a signal is capable of flowing between conductive via 124d and conductive interconnect 123d. In this particular embodiment, conductive via 124c is connected to conductive interconnect 123d. Conductive via 124d is connected to conductive interconnect 123d when conductive via 124d is engaged with conductive interconnect 123d. Conductive line 122d is in communication with electronic circuit 108. In this embodiment, conductive line 122d is in communication with transistor 115c. In particular, conductive line 122d is in communication with drain 117c of transistor 115c.

In this way, interconnect region 120 includes a conductive line which extends through a dielectric material. It should be noted that the conductive line of interconnect region 120 can include many different types of conductive material, such as aluminum and tungsten, among others. The material of the conductive line is more conductive than dielectric material 121. Further, dielectric material 121 is more insulative than the material of the conductive line. More information regarding interconnect regions and the formation of interconnect regions can be found in the above-identified U.S. Patents and Patent Applications by the same inventor as this disclosure, which are incorporated herein by reference.

In this embodiment, bonded semiconductor structure 100 includes a conductive bonding region 140. As will be discussed in more detail below, conductive bonding region 140 can operate as a bit line. More information regarding bit lines can be found in the above-identified U.S. Patents and Patent Applications by the same inventor as this disclosure, which are incorporated herein by reference. Conductive bonding region 140 extends along surface 120a of interconnect region 120, and includes a bonding region surface 141 which faces away from interconnect region 120. Conductive bonding region 140 is in communication with a conductive line of interconnect region 120. In this embodiment, conductive bonding region 140 is connected to a conductive line of interconnect region 120. For example, in this embodiment, conductive bonding region 140 is in communication with conductive lines 122a and 122d. In particular, conductive bonding region 140 is in communication with conductive vias 124a and 124d. It should be noted that, in FIG. 5a, conductive bonding region 140 is in communication with transistors 115b and 115c through conductive lines 122a and 122d, respectively. More information regarding conductive bonding regions and the formation of conductive bonding regions can be found in the above-identified U.S. Patents and Patent Applications by the same inventor as this disclosure, which are incorporated herein by reference.

In this embodiment, and as indicated by an indication arrow 195, conductive bonding region 140 includes a conductive layer 144, barrier layer 143 and bonding layer 142. Conductive layer 144 is positioned adjacent to interconnect region 120. In particular, conductive layer 144 is positioned on surface 120b of interconnect region 120. Conductive layer 144 is adjacent to the conductive and insulative portions of surface 120b. Barrier layer 143 is spaced from interconnect region 120 by conductive layer 144. Bonding layer 142 is spaced from conductive layer by barrier layer 143. Barrier layer 143 extends between conductive layer 144 and bonding layer 142.

In this embodiment, conductive layer 144 is thicker than barrier layer 143. Further, conductive layer 144 is thicker than bonding layer 142. In this embodiment, bonding layer 142 is thicker than barrier layer 143. Further, bonding layer 142 is thinner than conductive layer 144. It should be noted that the resistivity of a layer increases and decreases as the thickness of the layer decreases and increases, respectively. The thicknesses of layers 142, 143 and 144 are denoted as thicknesses $t_1$, $t_2$ and $t_3$, respectively, in FIG. 7a.

In this embodiment, conductive layer 144 is more conductive than barrier layer 143. Conductive layer 144 can be made more conductive than barrier layer 143 in many different ways. In this embodiment, conductive layer 144 is more conductive than barrier layer 143 because it includes a material that is more conductive than the material of barrier layer 143. Further, conductive layer 144 is more conductive than barrier layer 143 because it is thicker than barrier layer 143.

In this embodiment, conductive layer 144 is more conductive than bonding layer 142. Conductive layer 144 can be made more conductive than bonding layer 142 in many different ways. In this embodiment, conductive layer 144 is more conductive than bonding layer 142 because it includes a material that is more conductive than the material of bonding layer 142. Further, conductive layer 144 is more conductive than bonding layer 142 because it is thicker than bonding layer 142. It should be noted that the material of bonding layer 142 can be chosen for its ability to form a bonding interface with a desired bonding strength with the material of material transfer region 133.

In this embodiment, bonding layer 142 is more conductive than barrier layer 143. Bonding layer 142 can be made more conductive than barrier layer 143 in many different ways. In this embodiment, bonding layer 142 is more conductive than barrier layer 143 because it includes a material that is more conductive than the material of barrier layer 143. Further, bonding layer 142 is more conductive than barrier layer 143 because it is thicker than barrier layer 143.

In this embodiment, barrier layer 143 is more resistive than conductive layer 144. Barrier layer 143 can be made more resistive than conductive layer 144 in many different ways. In this embodiment, barrier layer 143 is more resistive than conductive layer 144 because it includes a material that is more resistive than the material of conductive layer 144. Further, barrier layer 143 is more resistive than conductive layer 144 because it is thinner than conductive layer 144.

In this embodiment, barrier layer 143 is more resistive than bonding layer 142. Barrier layer 143 can be made more resistive than bonding layer 142 in many different ways. In this embodiment, barrier layer 143 is more resistive than bonding layer 142 because it includes a material that is more resistive than the material of bonding layer 142. Further, barrier layer 143 is more resistive than bonding layer 142 because it is thinner than bonding layer 142.

The material of conductive bonding region 140 can be of many different types, such as the refractory metals and alloys thereof. An example of an alloy of the refractory metals includes refractory metal nitrides. An example of a refractory metal is tantalum (Ta) and the corresponding refractory metal nitride is tantalum nitride (TaN). In one embodiment, bonding layer 142 includes tantalum, barrier layer 143 includes tantalum nitride. In one embodiment, bonding layer 142 includes tantalum, barrier layer 143 includes tantalum nitride and conductive layer 144 includes a material that is more conductive than tantalum.

In one embodiment, bonding layer 142 includes tantalum, barrier layer 143 includes tantalum nitride and conductive layer 144 includes a material that is less conductive than tantalum. However, the thickness of conductive layer 144 is chosen so that conductive layer 144 is more conductive than bonding layer 142. Further, the thickness of conductive layer 144 is chosen so that conductive layer 144 is more conductive than barrier layer 143.

An example of a refractory metal is tantalum (Ti) and the corresponding refractory metal nitride is tantalum nitride (TiN). In one embodiment, bonding layer 142 includes titanium, barrier layer 143 includes titanium nitride. In one embodiment, bonding layer 142 includes titanium, barrier layer 143 includes titanium nitride and conductive layer 144 includes a material that is more conductive than titanium.

In one embodiment, bonding layer 142 includes titanium, barrier layer 143 includes titanium nitride and conductive layer 144 includes a material that is less conductive than titanium. In one embodiment, bonding layer 142 includes titanium, barrier layer 143 includes titanium nitride and conductive layer 144 includes a material that is less conductive than titanium. However, the thickness of conductive layer 144 is chosen so that conductive layer 144 is more conductive than bonding layer 142. Further, the thickness of conductive layer 144 is chosen so that conductive layer 144 is more conductive than barrier layer 143.

As mentioned above, conductive bonding region 140 is in communication with a conductive line of interconnect region 120, and bonding region 140 includes conductive layer 144, barrier layer 143 and bonding layer 142. In some embodiments, conductive bonding region 140 is connected to a conductive line of interconnect region 120. Conductive bonding region 140 is connected to the conductive line of interconnect region 120 when conductive bonding region 140 is engaged with the conductive line of interconnect region 120. In this embodiment, conductive line 122a is in communication with bonding layer 142 through conductive layer 144 and barrier layer 143. Conductive line 122a is in communication with bonding layer 142 through conductive layer 144 and barrier layer 143 when a signal flowing between conductive line 122a and bonding layer 142 flows through conductive layer 144 and barrier layer 143.

Further, conductive line 122a is in communication with barrier layer 143 through conductive layer 144. Conductive line 122a is in communication with barrier layer 143 through conductive layer 144 when a signal flowing between conductive line 122a and barrier layer 143 flows through conductive layer 144. In some embodiments, conductive line 122b is in communication with bonding layer 142 through conductive layer 144 and barrier layer 143. Conductive line 122b is in communication with bonding layer 142 through conductive layer 144 and barrier layer 143 when a signal flowing between conductive line 122b and bonding layer 142 flows through conductive layer 144 and barrier layer 143.

Further, in some embodiments, conductive line 122b is in communication with barrier layer 143 through conductive layer 144. Conductive line 122b is in communication with barrier layer 143 through conductive layer 144 when a signal flowing between conductive line 122b and barrier layer 143 flows through conductive layer 144. In some embodiments, conductive line 122c is in communication with bonding layer 142 through conductive layer 144 and barrier layer 143. Conductive line 122c is in communication with bonding layer 142 through conductive layer 144 and barrier layer 143 when a signal flowing between conductive line 122c and bonding layer 142 flows through conductive layer 144 and barrier layer 143.

Further, in some embodiments, conductive line 122c is in communication with barrier layer 143 through conductive layer 144. Conductive line 122c is in communication with barrier layer 143 through conductive layer 144 when a signal flowing between conductive line 122c and barrier layer flows through conductive layer 144.

In this embodiment, conductive line 122d is in communication with bonding layer 142 through conductive layer 144 and barrier layer 143. Conductive line 122d is in communication with bonding layer 142 through conductive layer 144 and barrier layer 143 when a signal flowing between conductive line 122d and bonding layer 142 flows through conductive layer 144 and barrier layer 143. Further, conductive line 122d is in communication with barrier layer 143 through conductive layer 144. Conductive line 122d is in communication with barrier layer 143 through conductive layer 144 when a signal flowing between conductive line 122d and barrier layer 143 flows through conductive layer 144.

As mentioned above, conductive line 122a is in communication with transistor 115b, and bonding region 140 includes conductive layer 144, barrier layer 143 and bonding layer 142. In this embodiment, transistor 115b is in communication with bonding layer 142 through conductive line 122a, conductive layer 144 and barrier layer 143. Transistor 115b is in communication with bonding layer 142 through conductive line 122a, conductive layer 144 and barrier layer 143 when a signal flowing between transistor 115b and bonding layer 142 flows through conductive line 122a, conductive layer 144 and barrier layer 143. Further, transistor 115b is in communication with barrier layer 143 through conductive line 122a and conductive layer 144. Transistor 115b is in communication with barrier layer 143 through conductive line 122a and conductive layer 144 when a signal flowing between transistor 115 and barrier layer 143 flows through conductive line 122a and conductive layer 144.

As mentioned above, conductive line 122d is in communication with transistor 115c, and bonding region 140 includes conductive layer 144, barrier layer 143 and bonding layer 142. In this embodiment, transistor 115c is in communication with bonding layer 142 through conductive line 122d, conductive layer 144 and barrier layer 143. Transistor 115c is in communication with bonding layer 142 through conductive line 122d, conductive layer 144 and barrier layer 143 when a signal flowing between transistor 115c and bonding layer 142 flows through conductive line 122d, conductive layer 144 and barrier layer 143. Further, transistor 115c is in communication with barrier layer 143 through conductive line 122d and conductive layer 144. Transistor 115c is in communication with barrier layer 143 through conductive line 122d and conductive layer 144 when a signal flowing between transistor 115c and barrier layer 143 flows through conductive line 122d and conductive layer 144.

FIG. 5b is a side view of a material transfer structure 130. In this embodiment, material transfer structure 130 includes a support substrate 131 which carries material transfer region 133. In this embodiment, material transfer structure 130 includes a detach region 132 which extends between support substrate 131 and material transfer region 133. Material transfer region 133 includes a surface 134a which away from detach region 132, and a surface 134b which faces detach region 132. In some embodiments, surface 134a is a polished surface. Surface 134a can be polished in many different ways, such as by using chemical mechanical polishing.

As will be discussed in more detail below, detach region 132 allows material transfer region 133 to be detached from support substrate 131. Detach region 132 can include many different types of material, such as porous silicon. More information regarding detach region 132 can be found in the above-identified U.S. Patents and Patent Applications by the same inventor as this disclosure, which are incorporated herein by reference. More information regarding porous silicon can be found in the above-identified U.S. Patents and Patent Applications by the same inventor as this disclosure, which are incorporated herein by reference. More information regarding porous silicon can be found in U.S. Pat. No. 5,439,843, the contents of which are incorporated by reference as though fully set forth herein.

Material transfer region 133 can include many different types of material. In some embodiments, material transfer region 133 include a dielectric material. A dielectric material operates as a polarizable insulator, wherein the flow of a current therethrough is restricted. The dielectric material generally has a non-crystalline atomic structure. For example, the dielectric material can have a polycrystalline and amorphous atomic structure. In some embodiments, material transfer region 133 consists essentially of a dielectric material. In some embodiments, material transfer region 133 consists of a dielectric material. The dielectric material can be of many different types, such as silicon dioxide and silicon nitride.

In some embodiments, material transfer region 133 includes a semiconductor material. A semiconductor material operates as a semiconductor, wherein the conductivity of the semiconductor material is adjustable in response to adjusting the type and amount of impurities therein. The type and amount of impurities of the semiconductor material determine the type of charges that are conducted through it. For example, in some situations, the semiconductor material includes impurities which allow negative charges to flow therethrough (i.e. n-type semiconductor material), and, in other situations, the semiconductor material includes impurities which allow positive charges to flow therethrough (i.e. p-type semiconductor material). The atomic structure of the semiconductor material can be of many different types, such as crystalline, polycrystalline and amorphous.

In some embodiments, material transfer region 133 consists essentially of a semiconductor material. In some embodiments, material transfer region 133 consists of a semiconductor material. The semiconductor material can be of many different types, such as silicon, gallium arsenide, gallium nitride and alloys thereof. An example of an alloy of silicon includes silicon germanium and silicon carbon. An example of an alloy of gallium arsenide includes aluminum gallium arsenide and indium gallium arsenide, among others. An example of an alloy of gallium nitride includes indium gallium nitride and aluminum gallium nitride, among others.

In embodiments in which material transfer region 133 includes gallium arsenide or an alloy thereof, support substrate 131 and detach region 132 can include alloys of gallium arsenide, wherein the material of detach region 132 has a weaker mechanical strength compared to the material of material transfer region 133.

In embodiments in which material transfer region 133 includes gallium nitride or an alloy thereof, support substrate 131 and detach region 132 can include alloys of gallium nitride, wherein the material of detach region 132 has a weaker mechanical strength compared to the material of material transfer region 133.

In some embodiments, material transfer region 133 includes a single crystalline semiconductor material. In some embodiments, material transfer region 133 consists essentially of a single crystalline semiconductor material. In some embodiments, material transfer region 133 consists of a single crystalline semiconductor material.

In some embodiments, material transfer region 133 includes a stack of semiconductor layers. For example, as indicated by a substitution arrow 196 in FIG. 5b, material transfer region 133 includes a stack 150 of semiconductor material layers. In this particular embodiment, stack 150 includes a semiconductor layer 156 adjacent to detach region 132, a semiconductor layer 155 adjacent to semiconductor layer 155 and a semiconductor layer 154 adjacent to semiconductor layer 155. In this way, stack 150 includes three semiconductor layers. It should be noted however, that stack 150 generally includes one or more semiconductor layers. More information regarding stack 150 and the number of layers included therein can be found in the above-identified U.S. Patents and Patent Applications by the same inventor as this disclosure, which are incorporated herein by reference.

In some embodiments, each layer in stack 150 includes semiconductor material. In some embodiments, each layer in stack 150 consists essentially of semiconductor material. In some embodiments, each layer in stack 150 consists essentially of semiconductor material. In some embodiments, stack 150 includes a semiconductor layer which consists of semiconductor material. In some embodiments, stack 150 includes a semiconductor layer which consists essentially of semiconductor material.

Figure 5D:
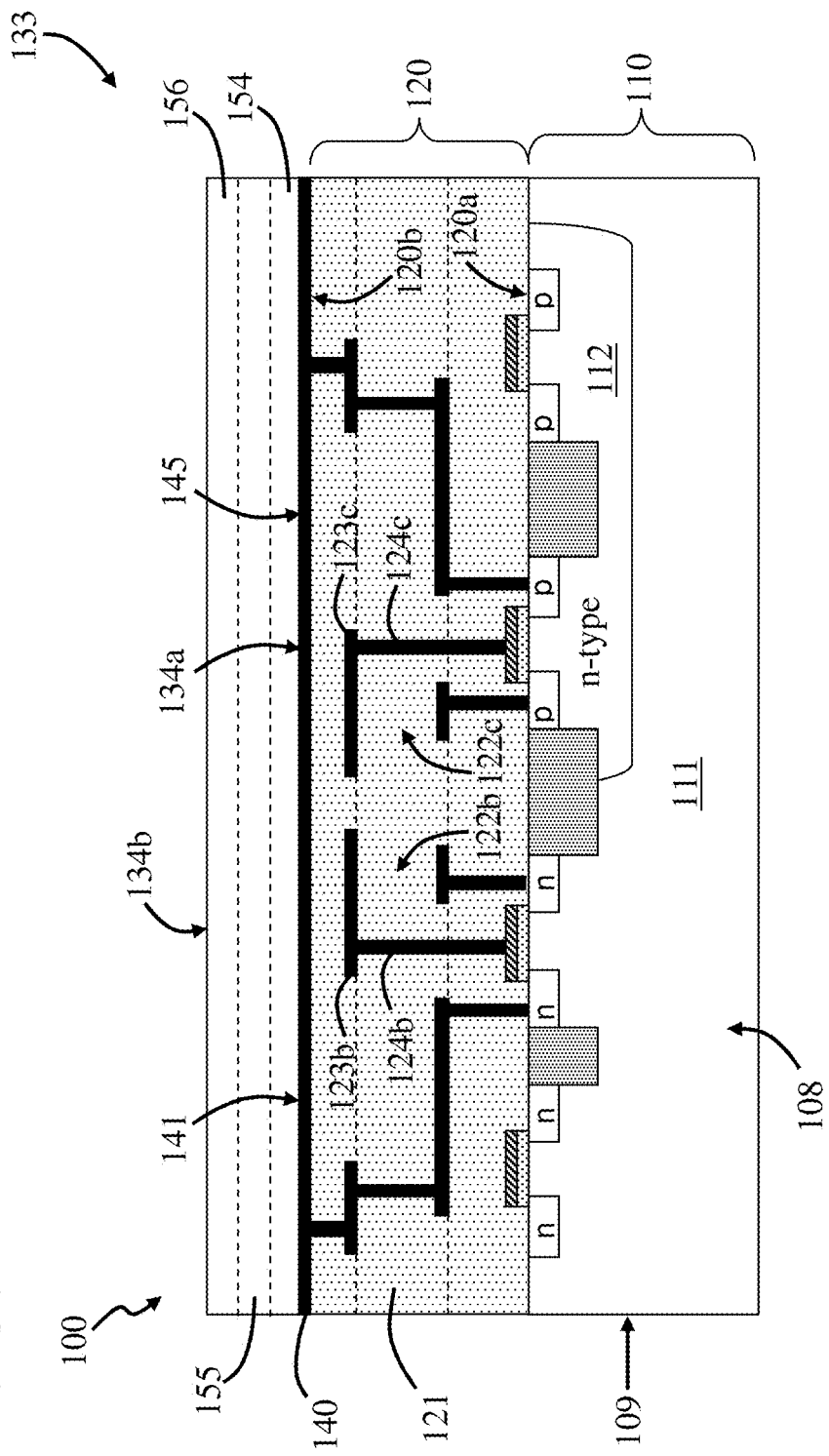

FIGS. 5c and 5d are side views of material transfer structure 130 and interconnect region 120 carried by support substrate 110. In FIG. 5c, material transfer structure 130 is decoupled from interconnect region 120 and, in FIG. 5d, material transfer structure 130 is coupled to interconnect region 120. Material transfer region 133 can be coupled to interconnect region 120 in many different ways. In this embodiment, material transfer region 133 is coupled to interconnect region 120 through bonding. In this way, semiconductor structure 100 is a bonded semiconductor structure.

A bonding interface 145 is formed in response to coupling material transfer region 133 to interconnect region 120 through bonding. In this embodiment, material transfer region 133 is positioned so interconnect region 120 extends between support substrate 110 and material transfer region 133. In this embodiment, material transfer region 133 is positioned so it extends between detach region 132 and interconnect region 120.

In this embodiment, bonding interface 145 is formed between dielectric material region surface 121b and a material transfer region surface 134a of material transfer region 133. Material transfer region surface 134a faces support substrate 110 and interconnect region 120, and material transfer region surface 134a faces away from detach region 132.

Bonding interface 145 can be of many different types, such as those mentioned above. In this embodiment, bonding interface 145 is a metal-semiconductor bonding interface. Bonding interface 145 is a metal-semiconductor bonding interface when material transfer region 133 includes semiconductor material adjacent to surface 134a and conductive bonding region 140 includes a metal material adjacent to bonding region surface 141. Bonding interface 145 is a metal-semiconductor bonding interface when material transfer region 133 includes semiconductor material adjacent to surface 134a and bonding layer 144 includes a metal material.

In some embodiments, bonding interface 145 is a metal-dielectric bonding interface. Bonding interface 145 is a metal-dielectric bonding interface when material transfer region 133 includes dielectric material adjacent to surface 134a and conductive bonding region 140 includes a metal material adjacent to bonding region surface 141. Bonding interface 145 is a metal-dielectric bonding interface when material transfer region 133 includes dielectric material adjacent to surface 134a and bonding layer 144 includes a metal material.

In this embodiment, bonding layer 142 is positioned adjacent to material transfer region 133. In particular, bonding layer 142 is coupled to surface 134a of material transfer region 133. Bonding interface 145 is formed between material transfer region 133 and bonding layer 142. Barrier layer 143 is spaced from material transfer region 133 by bonding layer 142. In this way, bonding layer 142 extends between barrier layer 143 and material transfer region 133. Conductive layer 144 is spaced from material transfer region 133 by bonding layer 142 and barrier layer 143. In this way, barrier layer 143 extends between the conductive layer 144 and material transfer region 133. Further, bonding layer 142 extends between the conductive layer 144 and material transfer region 133.

In some embodiments, surface 134b is polished after bonding interface 145 is formed. Surface 134b can be polished in many different ways, such as by using chemical mechanical polishing. As mentioned above, surface 134a can be polished. Hence, in some embodiments, surfaces 134a and 134b are polished so that material transfer region 133 includes opposed polished surfaces. It should be noted that material transfer region 133 can include opposed polished surfaces in the other embodiments discussed herein.

In FIG. 5e, material transfer region 133 is processed to form a vertically oriented semiconductor device. The vertically oriented semiconductor device can be of many different types, such as those disclosed in more detail in the above-identified U.S. Patents and Patent Applications by the same inventor as this disclosure, which are incorporated herein by reference. In some embodiments, material transfer region 133 is processed to form a vertically oriented semiconductor device which does not include a base support structure. However, in this embodiment, material transfer region 133 is processed to form a vertically oriented semiconductor device which does include a base support structure.

In this embodiment, material transfer region 133 and conductive bonding region 140 are etched through to surface 120b of interconnect region 120 to form a material transfer region island 133a. Material transfer region 133 is etched to from an etched sidewall. Material transfer region 133 and conductive bonding region 140 can be etched in many different ways, such as by using wet and/or dry etching. It should be noted that a plurality of material transfer region islands 133a can be formed, if desired, as discussed in more detail with FIGS. 6a-6j. However, a single material transfer region island 133a is shown in FIG. 5e for illustrative purposes.

Material transfer region islands 133a is coupled to interconnect region 120 through conductive bonding region 140. Material transfer region islands 133a is coupled to interconnect region 120 through bonding interface 145. Material transfer region island 133a is coupled to interconnect region 120 through conductive layer 144, barrier layer 143 and bonding layer 142. As will be discussed in more detail presently, material transfer region island 133a is processed to form a mesa structure, which is included in the vertically oriented semiconductor device.

As mentioned above, in some embodiments, surfaces 134a and/or 134b are polished surfaces. Hence, in some embodiments, the material transfer region island 133a includes polished surface 134a. In some embodiments, material transfer region island 133a includes polished surface 134b. Further, in some embodiments, material transfer region island 133a includes polished surfaces 134a and 134b.

In FIG. 5f, material transfer region island 133a is processed to form mesa structures 152a and 152b. FIG. 5g is a perspective view of material transfer region island 133a of FIG. 5f, and mesa structures 152a and 152b. It should be noted that mesa structures 152a and 152b are shown in phantom in FIG. 5e. Further, it should be noted that one or more mesa structures are typically formed. However, two mesa structures are shown in FIG. 5f for illustrative purposes, so that a mesa structure array 159 includes two mesa structures. It should also be noted that the number of mesa structures formed generally corresponds to the number of vertically oriented semiconductor devices formed.

In this embodiment, mesa structure 152a includes a portion 156a of device structure layer 156, a portion 155a of device structure layer 155 and a portion 154a of device structure layer 154, wherein portions 156a, 155a and 154a are carried by layer 153. It should be noted that portion 154a is adjacent to device structure layer 153, portion 155a is carried by portion 154a and device structure portion 156a is carried by portions 154a and 155a. As will be discussed in more detail below, mesa structure 152a is processed to form a vertically oriented semiconductor device 157a.

In this embodiment, mesa structure 152b includes a portion 156b of device structure layer 156, a portion 155b of device structure layer 155 and a portion 154b of device structure layer 154, wherein portions 156b, 155b and 154b are carried by device structure layer 153. It should be noted that portion 154b is adjacent to device structure layer 153, portion 155b is carried by portion 154b and portion 156b is carried by portions 154b and 155b. As will be discussed in more detail below, mesa structure 152b is processed to form a vertically oriented semiconductor device 157b. It should be noted that mesa structures 152a and 152b are carried by device layer structure 153, which is a portion of device layer structure 154 adjacent to conductive bonding layer 140. Mesa structures 152a and 152b extend from device structure layer 153 away from device structure layer 153. Device structure layer 153 operates as a base support structure because it supports mesa structures 152a and 152b.

As mentioned above, in some embodiments, surfaces 134a and/or 134b are polished surfaces. Hence, in some embodiments, mesa structure 152a includes polished surface 134a. Further, in some embodiments, mesa structure 152b includes polished surface 134b. In some embodiments, device structure layer 153 includes polished surface 134a. In some embodiments, mesa structure 152a includes polished surface 134b and device structure layer 153 includes polished surface 134a. In some embodiments, mesa structure 152b includes polished surface 134b and device structure layer 153 includes polished surface 134a. In some embodiments, mesa structures 152a and 152b include polished surface 134b and device structure layer 153 includes polished surface 134a.

In FIG. 5h, a dielectric material region 161 is formed adjacent to layer 153 and mesa structures 152a and 152b. In this embodiment, a control terminal 160 is formed on dielectric material region 161. As will be discussed in more detail below, dielectric material region 161 is used as a control dielectric for vertically oriented semiconductor devices 157a and 157b, and control terminal 160 is used as a control terminal for vertically oriented semiconductor devices 157a and 157b. Control terminal 160 is used to control the conductivity of mesa structures 152a and 152b through dielectric material region 161. In this way, control terminal 160 operates as a word line. More information regarding word lines is provided below, and can be found in the above-identified U.S. Patents and Patent Applications by the same inventor as this disclosure, which are incorporated herein by reference.

Dielectric material region 161 and control terminal 160 are formed using conventional processing techniques, such as photolithography, material deposition and material etching. Dielectric material region 161 can include many different types of dielectric material, such as silicon dioxide. Control terminal 160 can include many different types of conductive material, such as tungsten, and aluminum, among others.

As mentioned above, in some embodiments, surfaces 134a and/or 134b are polished surfaces. Hence, in some embodiments, vertically oriented semiconductor device 157a includes polished surface 134a. Further, in some embodiments, vertically oriented semiconductor devices 157b includes polished surface 134b. In some embodiments, device structure layer 153 includes polished surface 134a. In some embodiments, vertically oriented semiconductor devices 157a includes polished surface 134b and device structure layer 153 includes polished surface 134a. In some embodiments, vertically oriented semiconductor devices 157b includes polished surface 134b and device structure layer 153 includes polished surface 134a. In some embodiments, vertically oriented semiconductor devices 157a and 157b include polished surface 134b and device structure layer 153 includes polished surface 134a. It should be noted that the other vertically oriented semiconductor devices discussed herein can include one or more polished surfaces.

Figure 5I:
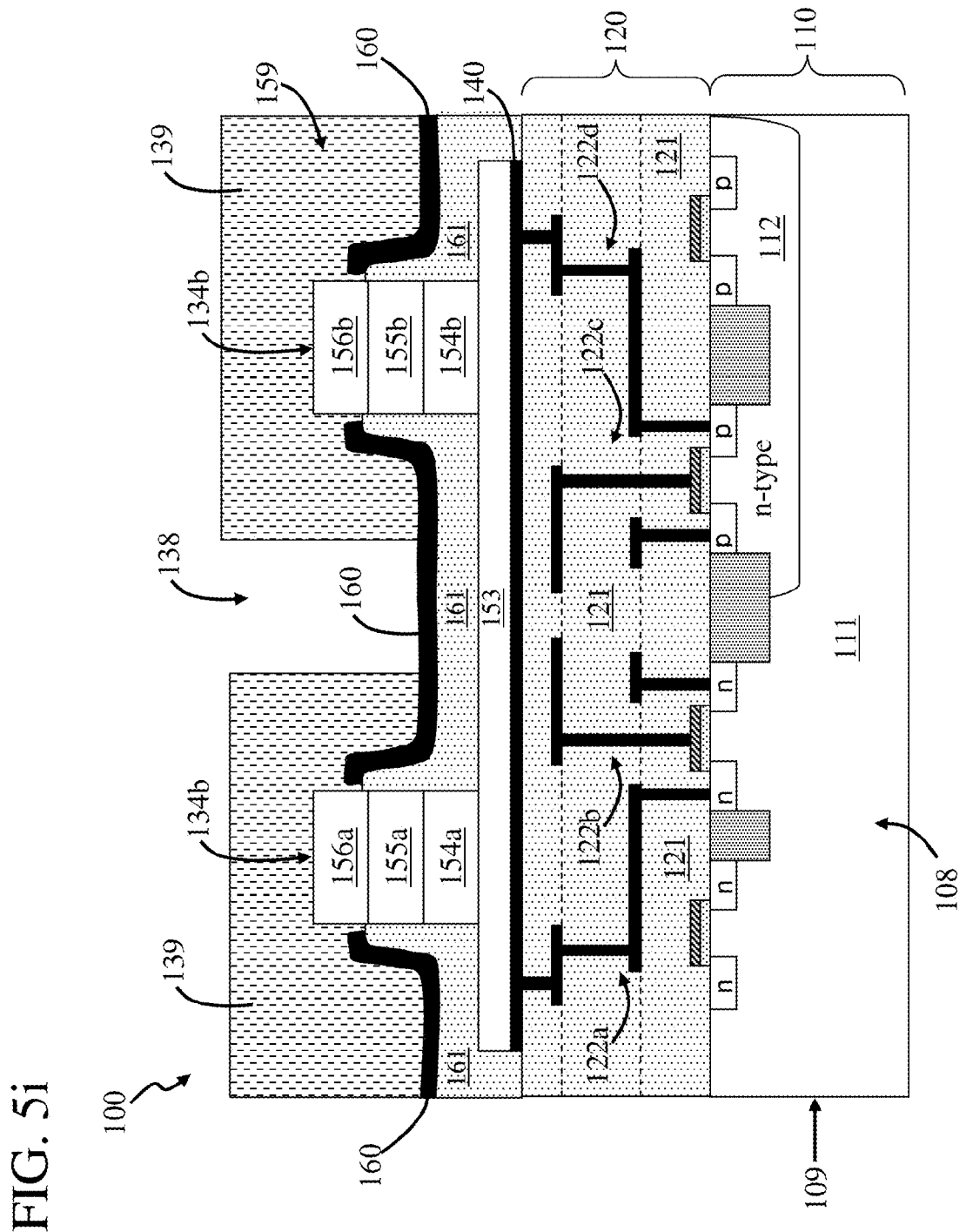

In FIG. 5i, a mask region 139 is formed on control terminal 160 and processed to form a trench 138 therethrough. Mask region 139 can include many different materials, such as a photoresist. Trench 138 is formed so it extends between mesa structures 152a and 152b, and is aligned with conductive lines 122*b* and 122*c*. As will be discussed in more detail below, trench 138 is formed to allow connections to conductive lines 122*b* and 122*c*.

Figure 5J:
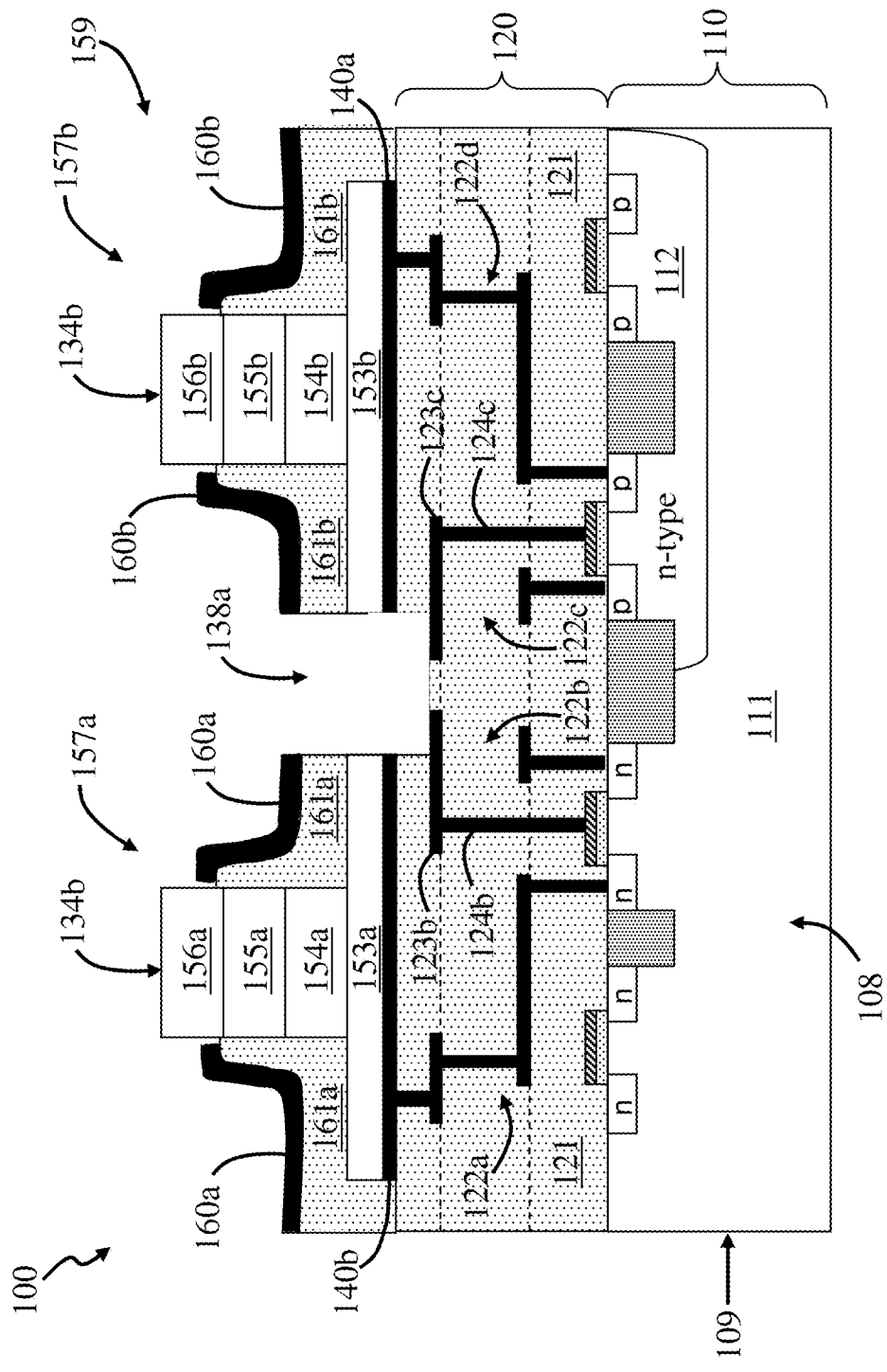

In FIG. 5*j*, control terminal 160, dielectric material region 160, layer 153, conductive bonding region 140, and dielectric material region 121 are etched through to conductive lines 122*b* and 122*c*. A portion of layer 153 proximate to mesa structure 152*a* that is not etched is denoted as layer 153*a*. A portion of dielectric material region 161 proximate to mesa structure 152*a* that is not etched is denoted as dielectric material region 161*a*. A portion of control terminal 160 proximate to mesa structure 152*a* that is not etched is denoted as control terminal 160*a*. A portion of layer 153 proximate to mesa structure 152*b* that is not etched is denoted as layer 153*b*. A portion of dielectric material region 161 proximate to mesa structure 152*b* that is not etched is denoted as dielectric material region 161*b*. A portion of control terminal 160 proximate to mesa structure 152*b* that is not etched is denoted as control terminal 160*b*.

Figure 5K:
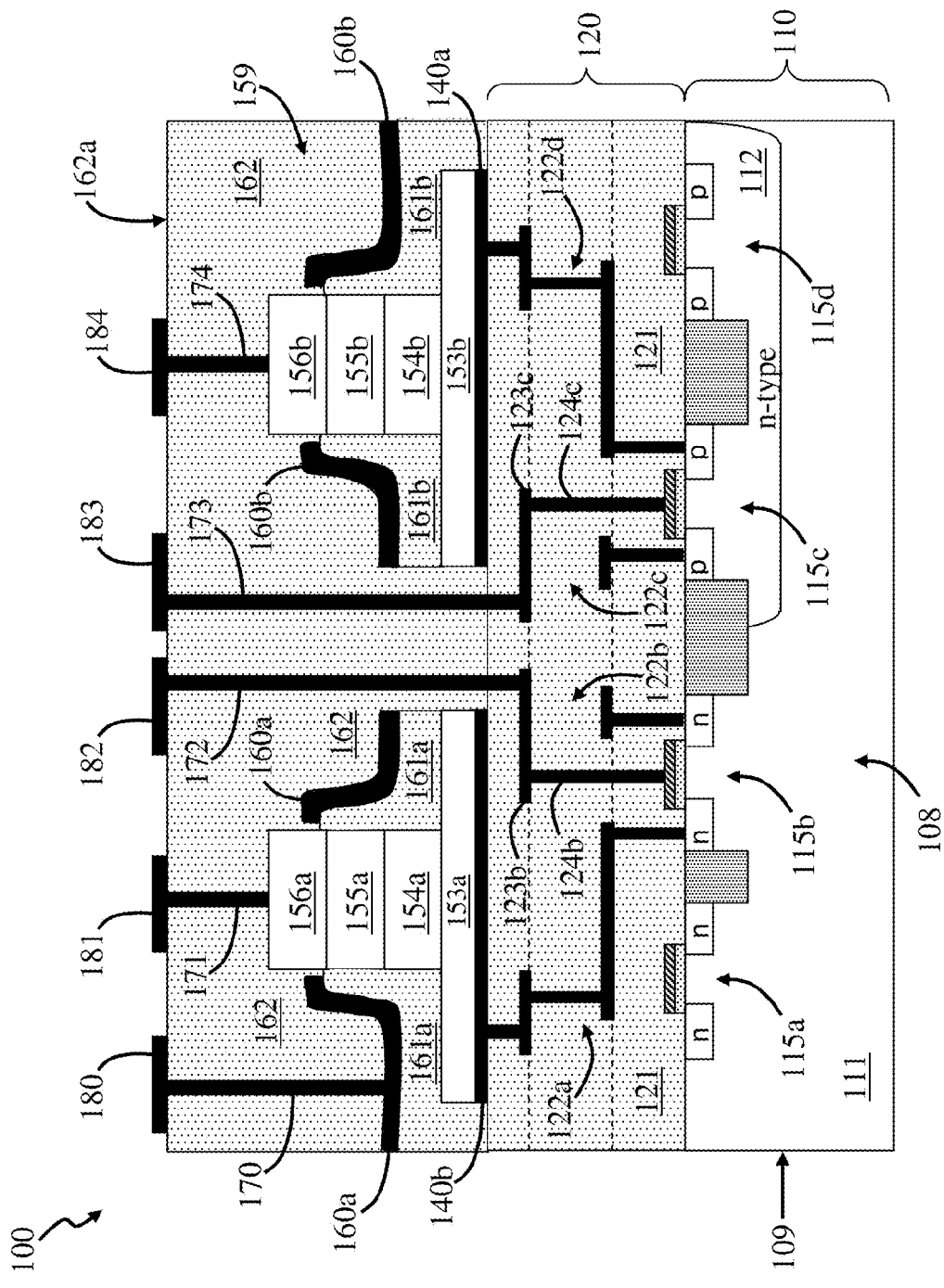

In FIG. 5*k*, a dielectric material region 162 is formed on mesa structures 152*a* and 152*b* and through trench 138. Dielectric material region 162 can include many different types of dielectric material, such as silicon dioxide. In this embodiment, a conductive line 172 is formed through dielectric material regions 121 and 162 so it is in communication with conductive line 122*b*. Further, a conductive line 173 is formed through dielectric material regions 121 and 162 so it is in communication with conductive line 122*c*. Conductive lines 172 and 173 extend between conductive lines 122*b* and 122*c*, respectively, and a surface 162*a* of dielectric material region 162. In this embodiment, a conductive line 170 is formed through dielectric material region 162 so it is in communication with control terminal 160*a*. Conductive line 170 extends between control terminal 160*a* and surface 162*a*. Further, a conductive line 171 is formed through dielectric material region 162 so it is in communication with layer 156*a*. Conductive line 171 extends between layer 156*a* and surface 162*a*. In this embodiment, a conductive line 174 is formed through dielectric material region 162 so it is in communication with layer 156*b*. Conductive line 171 extends between layer 156*b* and surface 162*a*.

In this embodiment, conductive contacts 180, 181, 182, 183 and 184 are formed on surface 162*a*. Conductive contacts 180, 181, 182, 183 and 184 are in communication with conductive lines 170, 171, 172, 173 and 174, respectively. It should be noted that contacts 180, 181, 182, 183 and 184 can operate as reference potentials when vertically oriented semiconductor devices 157*a* and 157*b* are memory devices. More information regarding vertically oriented semiconductor devices that operate as memory devices can be found in the above-identified U.S. Patents and Patent Applications by the same inventor as this disclosure, which are incorporated herein by reference.

FIGS. 6*a*-6*j* are views of steps of manufacturing a bonded semiconductor structure 101. More information regarding manufacturing a bonded semiconductor structure can be found in the above-identified U.S. Patents and Patent Applications by the same inventor as this disclosure, which are incorporated herein by reference.

Figure 6A:
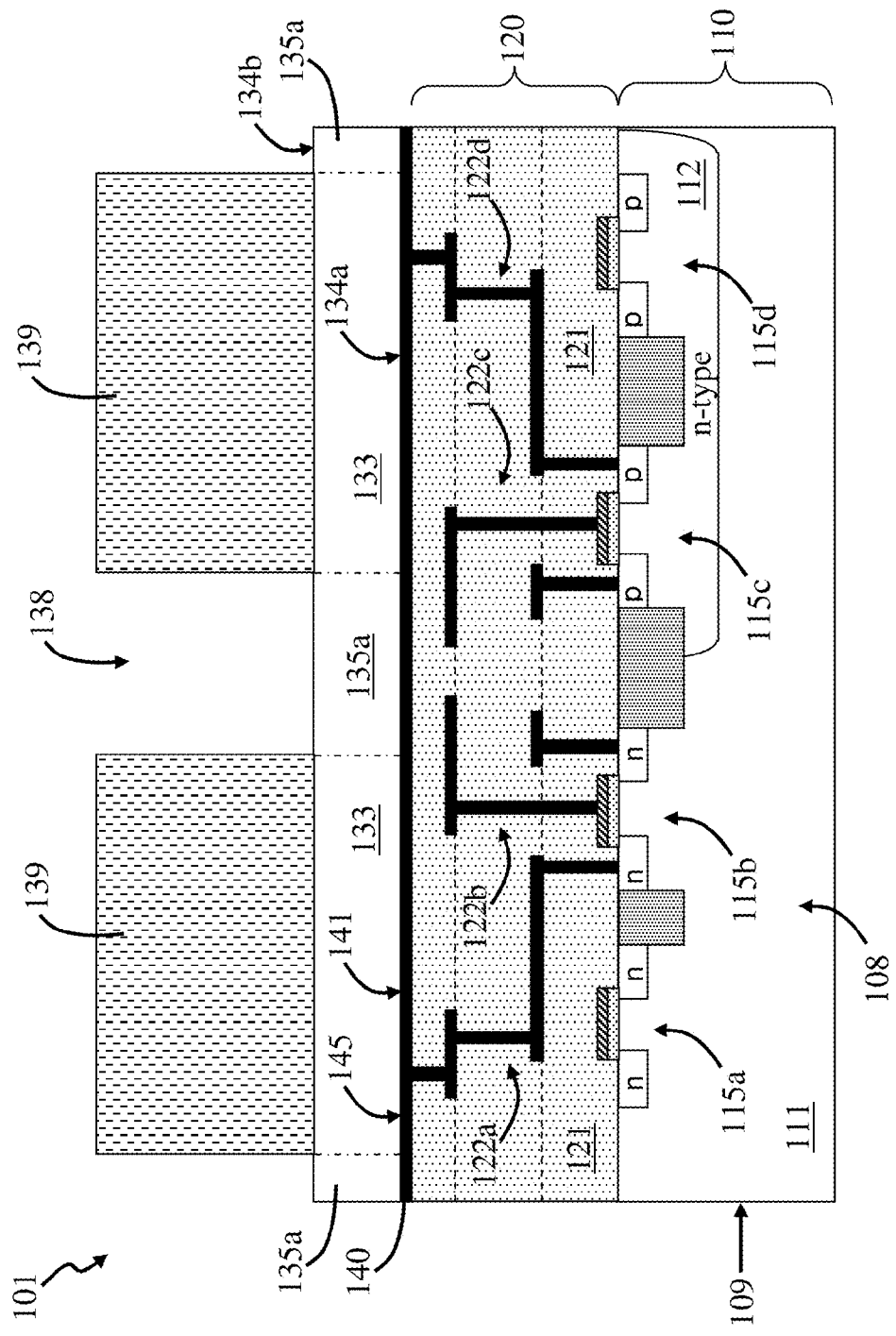

FIG. 6*a* is a side view of partially fabricated bonded semiconductor structure 101. In this embodiment, bonded semiconductor structure 101 includes support substrate 110 which carries interconnect region 120, as described in more detail above with FIGS. 5*a*-5*k*. In this embodiment, bonded semiconductor structure 101 includes material transfer region 133 coupled to interconnect region 120 through conductive bonding region 140, as shown in FIG. 5*d*. In this embodiment, conductive bonding region 140 includes conductive layer 144, barrier layer 143 and bonding layer 142. In this embodiment, material transfer region 133 is coupled to interconnect region 120 through bonding interface 145, which is established by conductive bonding region 140. In particular, bonding interface 145 is established by bonding layer 142 with material transfer region.

In FIG. 6*a*, material transfer region 133 is processed to form a plurality of islands and, as will be discussed in more detail below, the plurality of islands will be processed to form an array of vertically oriented semiconductor devices. The vertically oriented semiconductor devices can be of many different types, such as those disclosed in more detail in the above-identified U.S. Patents and Patent Applications by the same inventor as this disclosure, which are incorporated herein by reference. As will be discussed in more detail presently, material transfer region 133 is processed to form vertically oriented semiconductor devices which include a base support structure.

In this embodiment, mask region 139 is formed on surface 134*b* of material transfer region 133. In this embodiment, trench 138 is formed through mask region 139 to surface 134*b*. Trench 138 is formed so it is aligned with conductive lines 122*b* and 122*c*. As will be discussed in more detail below, trench 138 is formed to allow connections to conductive lines 122*b* and 122*c*. Further, as will be discussed in more detail below, trench 138 is patterned to allow the removal of portions 135*a* of material transfer region 133.

Figure 6B:
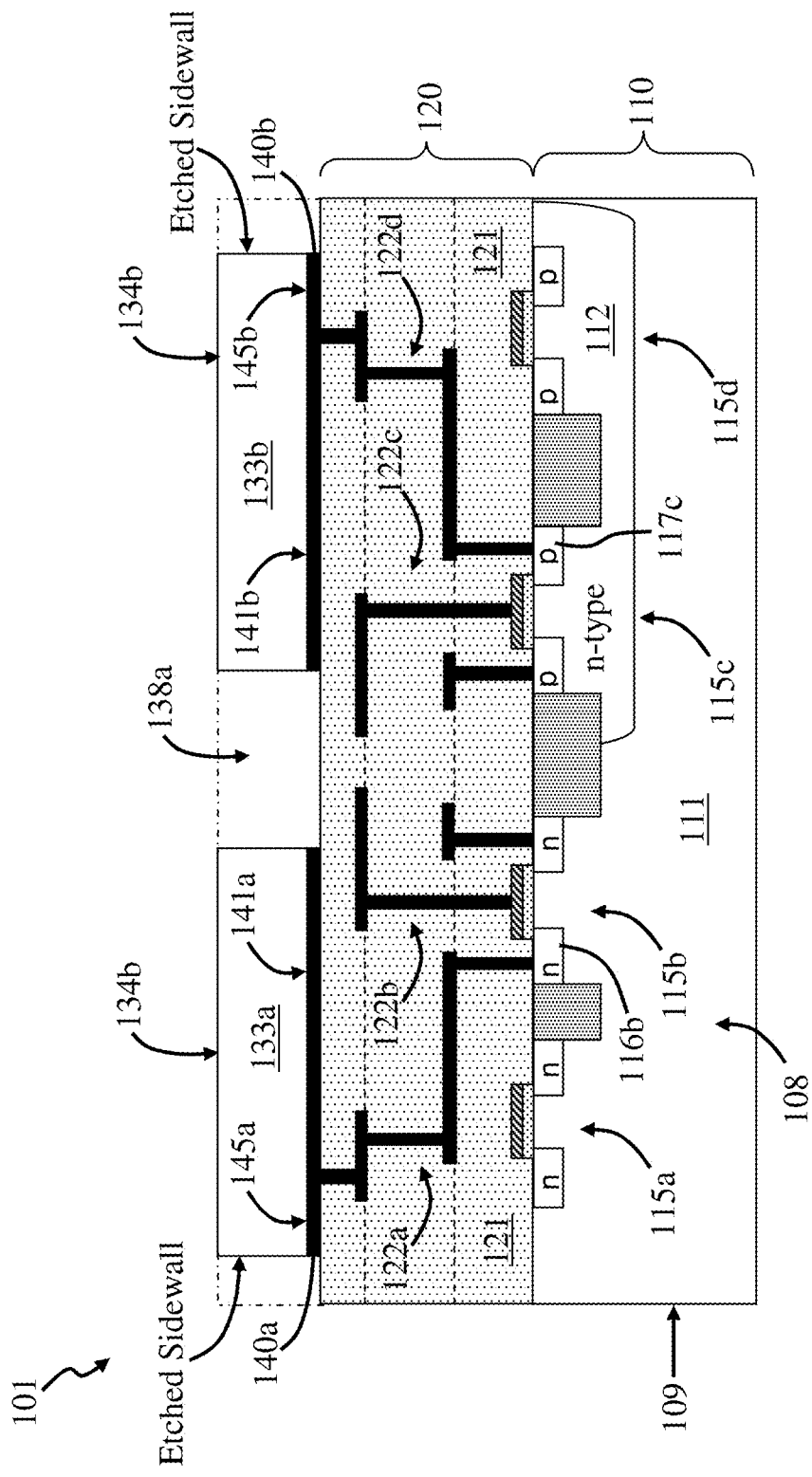
Figure 6C:
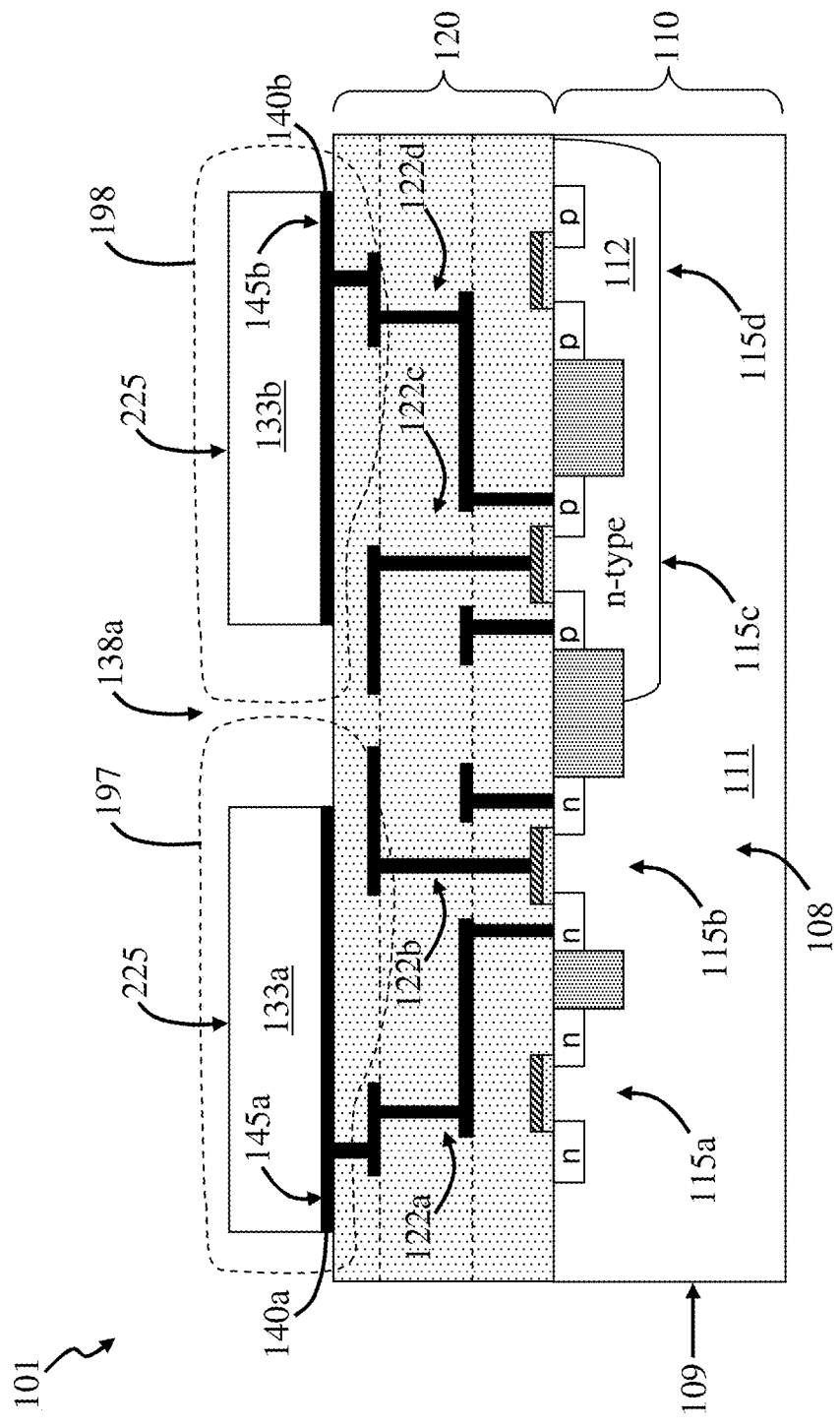

In FIG. 6*b*, material transfer region 133 and conductive bonding region 140 are etched through to surface 120*b* of interconnect region 120 to form material transfer region islands 133*a* and 133*b*. Material transfer region islands 133*a* and 133*b* are formed in response to etching portions 135*a* of material transfer region 133. Portions 135*a* are etched so that they are removed from material transfer region 133. It should be noted that portions 135*a* are not covered by mask region 139. In this way, trench 138 is patterned to allow the removal of portions 135*a* of material transfer region 133. Mask region 139 is removed after portions 135*a* are etched, as shown in FIG. 6*c*. Material transfer region 133 is etched to form a trench 138*a* which extends between material transfer region islands 133*a* and 133*b*, wherein trench 138*a* extends between etched sidewalls.

In this embodiment, material transfer region island 133*a* is coupled to interconnect region 120 through a conductive bonding region 140*a*. Conductive bonding region 140*a* is a portion of conductive bonding region 140 between material transfer region island 133*a* and interconnect region 120. Material transfer region island 133*a* is coupled to interconnect region 120 through a bonding interface 145*a*. Bonding interface 145*a* is a portion of bonding interface 145 between material transfer region island 133*a* and interconnect region 120. Material transfer region island 133*a* is coupled to interconnect region 120 through a conductive layer 144, barrier layer 143 and bonding layer 142 of conductive bonding region 140*a*. As will be discussed in more detail presently, material transfer region island 133*a* is processed to form a mesa structure.

In this embodiment, material transfer region island 133*a* is in communication with electronic circuit 108. In particular, material transfer region island 133*a* is in communication with transistor 115*b*. In this embodiment, material transfer region island 133*a* is in communication with source 116*b* of transistor 115*b* through conductive line 122*b* and conductive bonding region 140*a*.

In this embodiment, material transfer region island 133*b* is coupled to interconnect region 120 through a conductive bonding region 140b. Conductive bonding region 140b is a portion of conductive bonding region 140 between material transfer region island 133b and interconnect region 120. Material transfer region island 133b is coupled to interconnect region 120 through a bonding interface 145b. Bonding interface 145b is a portion of bonding interface 145 between material transfer region island 133b and interconnect region 120. Material transfer region island 133b is coupled to interconnect region 120 through a conductive layer 144, barrier layer 143 and bonding layer 142 of conductive bonding region 140b. As will be discussed in more detail presently, material transfer region island 133b is processed to form a mesa structure. It should be noted that, in this embodiment, bonded semiconductor structure 101 includes two bonding interfaces because it includes bonding interfaces 145a and 145b. In this embodiment, the number of bonding interfaces of bonded semiconductor structure 101 corresponds to the number of islands bonded to interconnect region 120.

In this embodiment, material transfer region island 133b is in communication with electronic circuit 108. In particular, material transfer region island 133b is in communication with transistor 115c. In this embodiment, material transfer region island 133b is in communication with drain 117c of transistor 115c through conductive line 122c and conductive bonding region 140b.

Figure 6D:
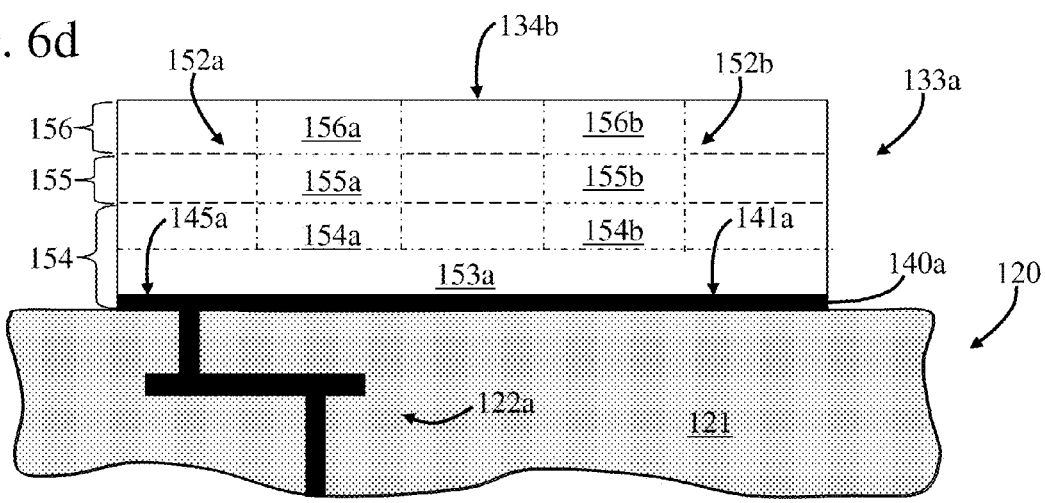

FIG. 6d is a view of a region 197 of FIG. 6c. In FIG. 6d, material transfer region island 133a is processed to form a plurality of vertically oriented semiconductor devices, which are shown in phantom. The vertically oriented semiconductor devices can be of many different types, such as those disclosed in more detail in the above-identified U.S. Patents and Patent Applications by the same inventor as this disclosure, which are incorporated herein by reference. As will be discussed in more detail below, material transfer region island 133a is processed to form vertically oriented semiconductor devices which include a base support structure. In this embodiment, material transfer region island 133a includes portions of device structure layers 154, 155 and 156 which have not been etched away.

Figure 6E:
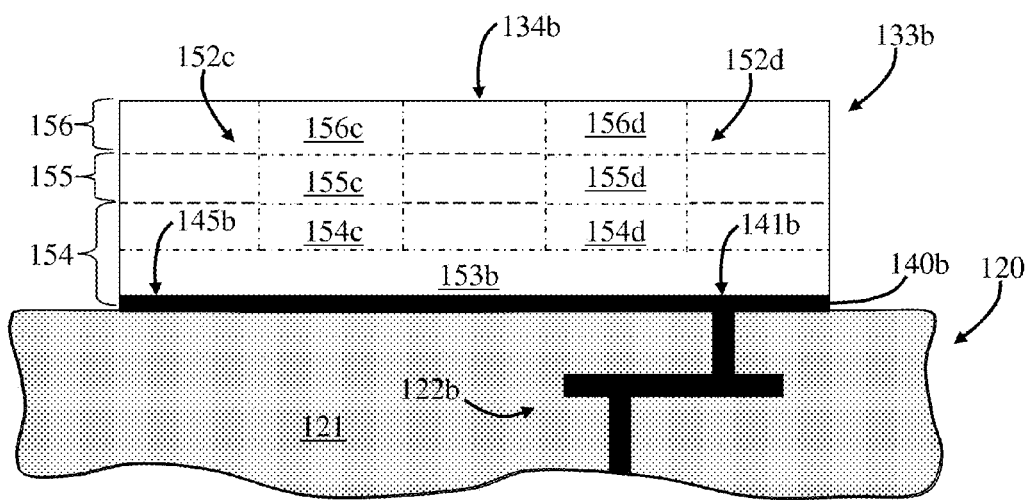

FIG. 6e is a view of a region 198 of FIG. 6c. In FIG. 6e, material transfer region island 133b is processed to form a plurality of vertically oriented semiconductor devices, which are shown in phantom. The vertically oriented semiconductor devices can be of many different types, such as those disclosed in more detail in the above-identified U.S. Patents and Patent Applications by the same inventor as this disclosure, which are incorporated herein by reference. As will be discussed in more detail presently, material transfer region island 133b is processed to form vertically oriented semiconductor devices which include a base support structure. In this embodiment, material transfer region island 133b includes portions of device structure layers 154, 155 and 156 which have not been etched away.

Figure 6F:
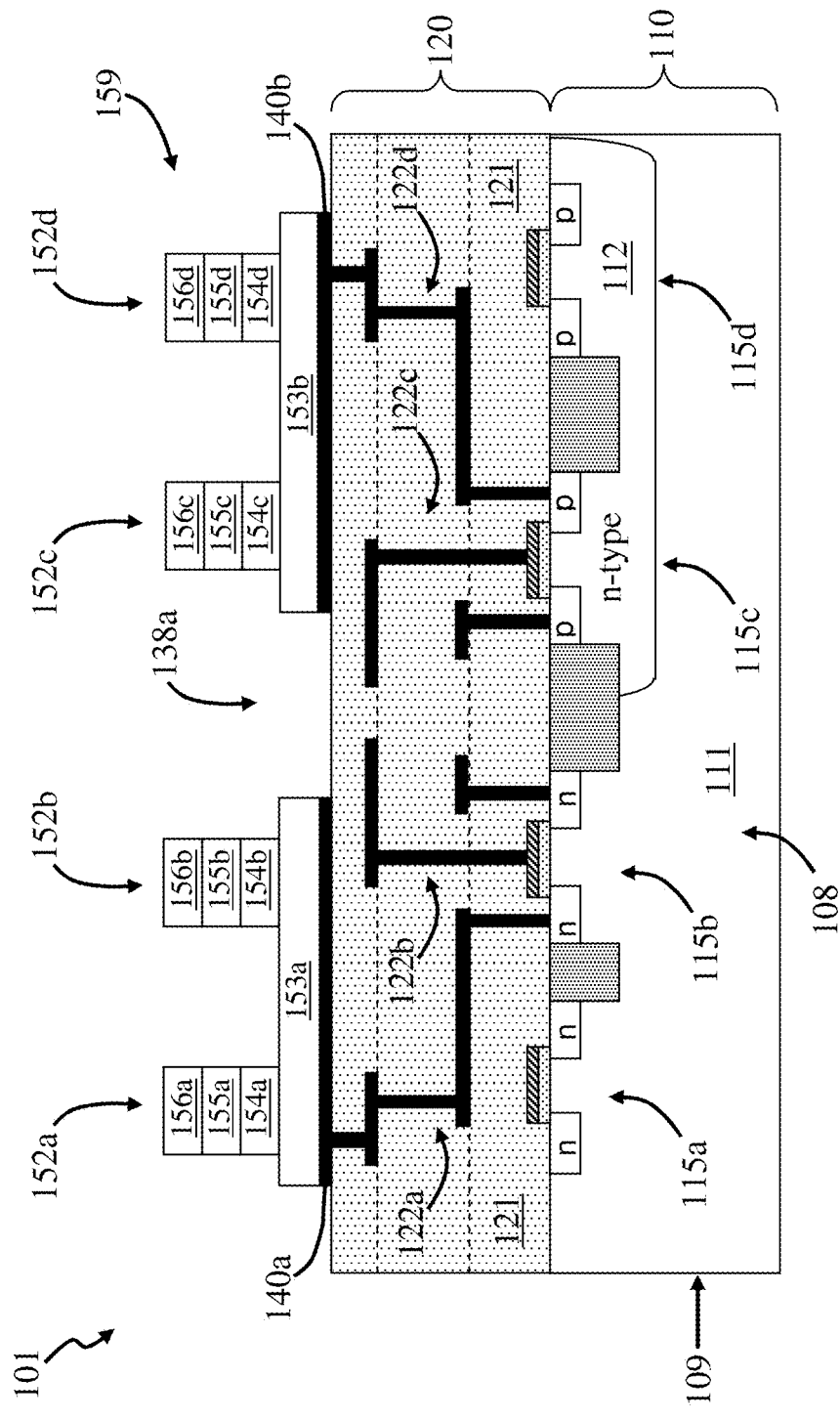

In FIG. 6f, material transfer region island 133a is processed to form mesa structures 152a and 152b. FIG. 6g is a perspective view of material transfer region island 133a of FIG. 6f, and mesa structures 152a and 152b. It should be noted that mesa structures 152a and 152b are shown in phantom in FIG. 6d. Further, it should be noted that one or more mesa structures are typically formed with material transfer region island 133a. However, two mesa structures are shown for illustrative purposes.

In this embodiment, mesa structure 152a includes a portion 156a of device structure layer 156, a portion 155a of device structure layer 155 and portions 154a and 153a of device structure layer 154, wherein portions 156a, 155a and 154a are carried by portion 153a. It should be noted that portion 154a is adjacent to portion 153a, portion 155a is carried by portion 154a and portion 156a is carried by portions 154a, 155a and 153a. It should also be noted that portion 153a is wider than portions 154a, 155a and 156a so that portion 153a operates as a base support structure. Bonding interface 145a is established between conductive bonding region 140a and portion 153a. In particular, bonding interface 145a is established between bonding layer 142 of conductive bonding region 140a and portion 153a. As will be discussed in more detail below, mesa structure 152a is processed to form a vertically oriented semiconductor device 157a.

In this embodiment, mesa structure 152b includes a portion 156b of device structure layer 156, a portion 155b of device structure layer 155 and portions 154b and 153b of device structure layer 154, wherein portions 156b, 155b and 154b are carried by portion 153b. It should be noted that portion 154b is adjacent to portion 153b, portion 155b is carried by portion 154b and portion 156b is carried by portions 154b, 155b and 153b. It should also be noted that portion 153b is wider than portions 154b, 155b and 156b so that portion 153b operates as a base support structure. Bonding interface 145b is established between conductive bonding region 140b and portion 153b. In particular, bonding interface 145b is established between bonding layer 142 of conductive bonding region 140b and portion 153b. As will be discussed in more detail below, mesa structure 152b is processed to form a vertically oriented semiconductor device 157b.

In FIG. 6f, material transfer region island 133b is processed to form mesa structures 152c and 152d. FIG. 6h is a perspective view of material transfer region island 133b of FIG. 6f, and mesa structures 152c and 152d. It should be noted that mesa structures 152c and 152d are shown in phantom in FIG. 6e. Further, it should be noted that one or more mesa structures are typically formed with material transfer region island 133b. However, two mesa structures are shown for illustrative purposes.

In this embodiment, mesa structure 152c includes a portion 156c of device structure layer 156, a portion 155c of device structure layer 155 and portions 154c and 153b of device structure layer 154, wherein portions 156c, 155c and 154c are carried by portion 153b. It should be noted that portion 154c is adjacent to portion 153b, portion 155c is carried by portion 154c and portion 156c is carried by portions 154c, 155c and 153b. It should also be noted that portion 153b is wider than portions 154c, 155c and 156c so that portion 153b operates as a base support structure. Bonding interface 145c is established between conductive bonding region 140c and portion 153b. In particular, bonding interface 145c is established between bonding layer 142 of conductive bonding region 140b and portion 153b. As will be discussed in more detail below, mesa structure 152c is processed to form a vertically oriented semiconductor device 157c.

In this embodiment, mesa structure 152d includes a portion 156d of device structure layer 156, a portion 155d of device structure layer 155 and portions 154d and 153b of device structure layer 154, wherein portions 156d, 155d and 154d are carried by portion 153b. It should be noted that portion 154d is adjacent to portion 153d, portion 155d is carried by portion 154d and portion 156d is carried by portions 154d, 155d and 153b. It should also be noted that portion 153b is wider than portions 154d, 155d and 156d so that portion 153d operates as a base support structure. Bonding interface 145b is established between conductive bonding region 140b and portion 153b. In particular, bonding interface 145b is established between bonding layer 142 of conductive bonding region 140b and portion 153b. As will be discussed in more detail below, mesa structure 152d is processed to form a vertically oriented semiconductor device 157d.

Figure 6I:
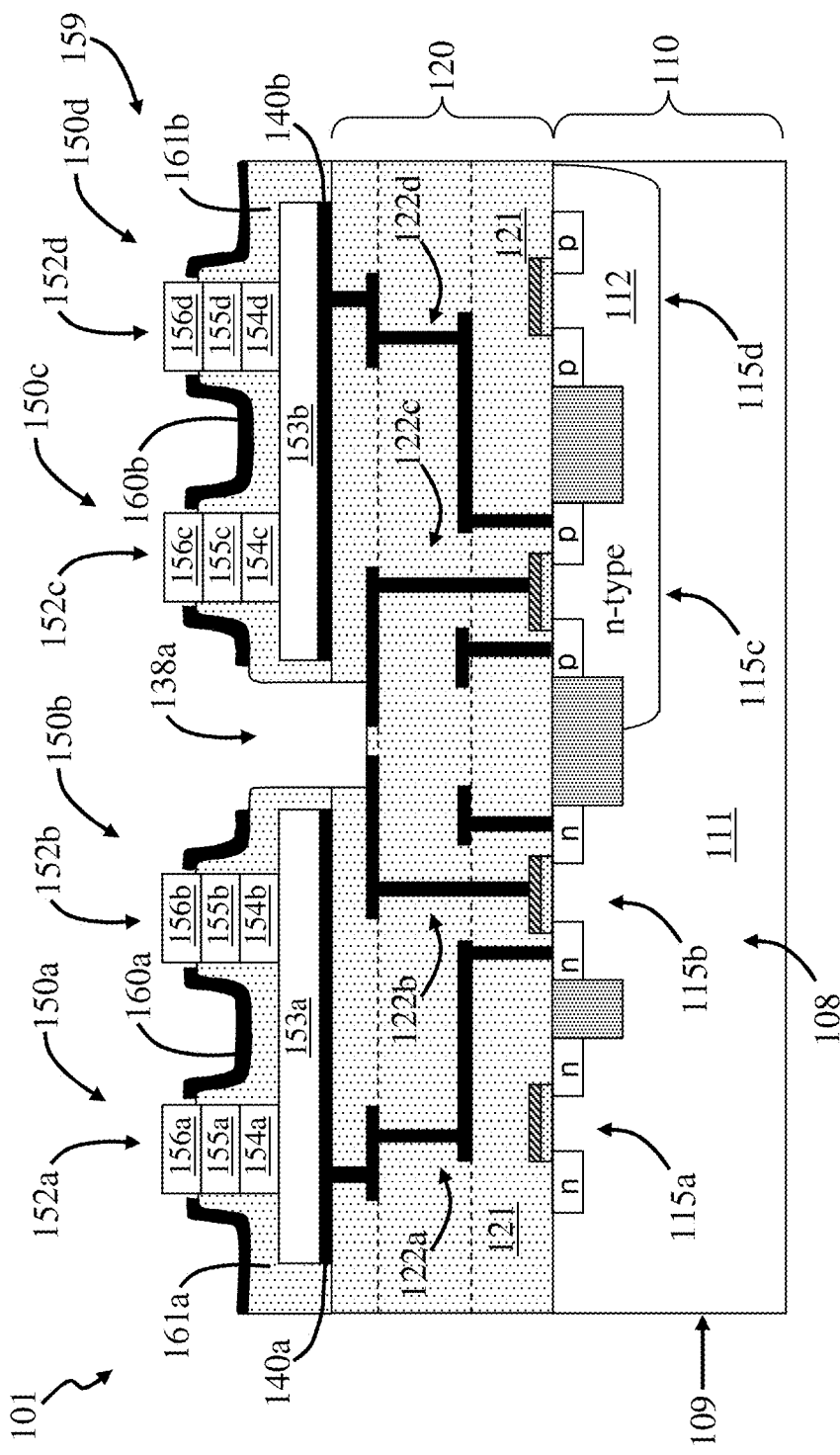

In FIG. 6i, dielectric material region 161 is formed adjacent to layer 153 and mesa structures 152a and 152b, as described in more detail above with FIG. 5h. In this embodiment, control terminal 160 is formed on dielectric material region 161, as described in more detail above with FIG. 5h. Trench 138a is formed through dielectric material regions 121 and 161 and control terminal 160. Trench 138a is formed to conductive lines 122b and 122c so that connections can be made to them. As discussed in more detail above in FIG. 5i, a mask region can be used to form trench 138a. It should be noted that portions of dielectric material region 161 proximate to mesa structures 152a and 152b are denoted as dielectric material region 161a. Portions of dielectric material region 161 proximate to mesa structures 152c and 152c are denoted as dielectric material region 161b. Further, portions of control terminal 160 proximate to mesa structures 152a and 152b are denoted as control terminal 160a. Portions of control terminal 160 proximate to mesa structures 152c and 152d are denoted as control terminal 160b.

As will be discussed in more detail below, dielectric material region 161a is used as a control dielectric for vertically oriented semiconductor devices 157a and 157b, and control terminal 160a is used as a control terminal for vertically oriented semiconductor devices 157a and 157b. Control terminal 160a is used to control the conductivity of mesa structures 152a and 152b through dielectric material region 161a.

As will be discussed in more detail below, dielectric material region 161b is used as a control dielectric for vertically oriented semiconductor devices 157c and 157d, and control terminal 160b is used as a control terminal for vertically oriented semiconductor devices 157c and 157d. Control terminal 160b is used to control the conductivity of mesa structures 152c and 152d through dielectric material region 161b.

Dielectric material regions 161a and 161b and control terminal 160a and 160b are formed using conventional processing techniques, such as photolithography, material deposition and material etching. Dielectric material regions 161a and 161b can include many different types of dielectric material, such as silicon dioxide. Control terminals 160a and 160b can include many different types of conductive material, such as tungsten, and aluminum, among others.

Figure 6J:
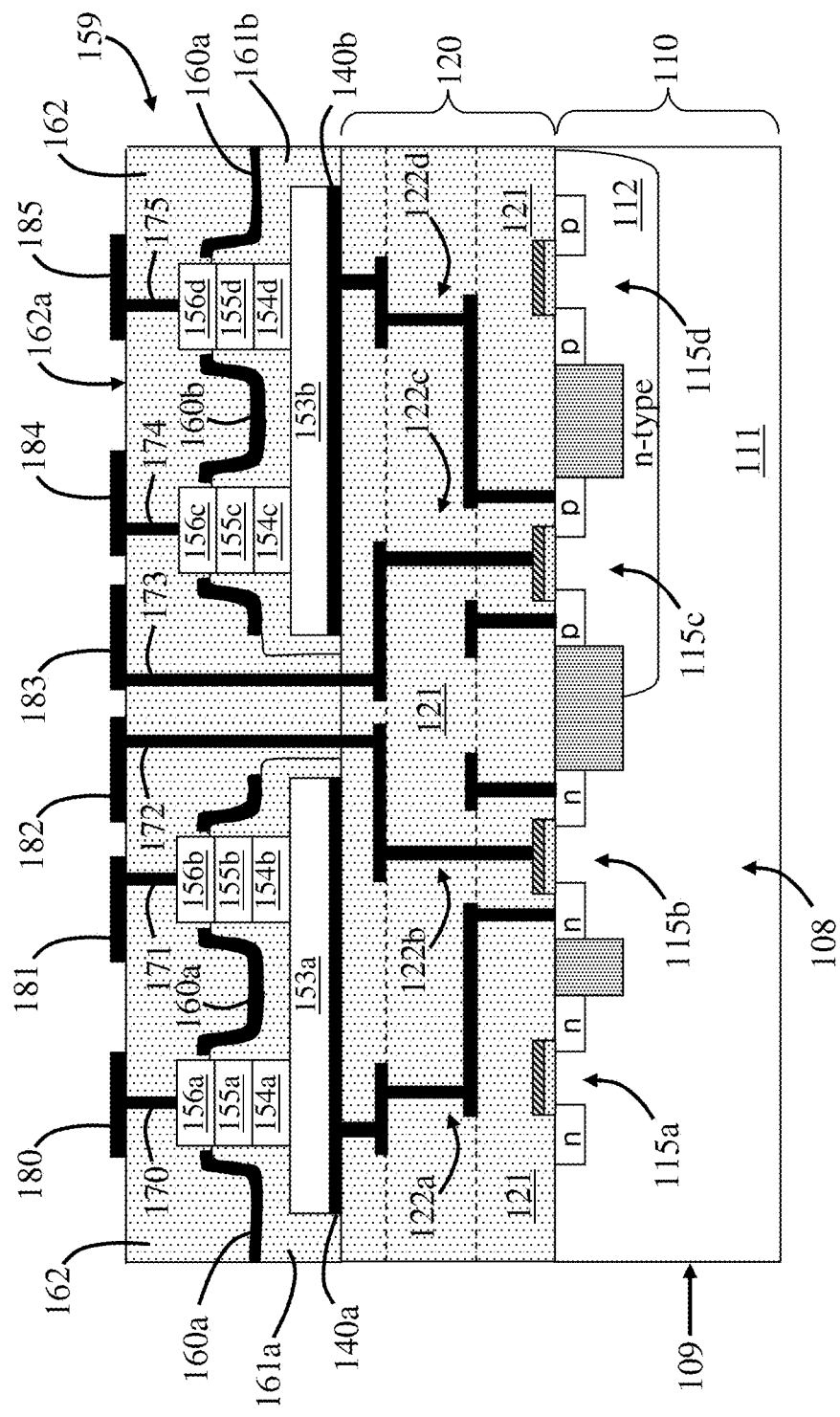

In FIG. 6j, dielectric material region 162 is formed on mesa structures 152a and 152b and through trench 138. The formation of dielectric material region 162 is discussed in more detail above with FIG. 5k. Dielectric material region 162 can include many different types of dielectric material, such as silicon dioxide. In this embodiment, conductive line 172 is formed through dielectric material regions 121 and 162 so it is in communication with conductive line 122b. Further, conductive line 173 is formed through dielectric material regions 121 and 162 so it is in communication with conductive line 122c. Conductive lines 172 and 173 extend between conductive lines 122b and 122c, respectively, and surface 162a of dielectric material region 162.

In this embodiment, conductive line 170 is formed through dielectric material region 162 so it is in communication with device structure layer 156a. Conductive line 170 extends between device structure layer 156a and surface 162a. Further, conductive line 171 is formed through dielectric material region 162 so it is in communication with device structure layer 156b. Conductive line 171 extends between device structure layer 156a and surface 162a. In this embodiment, conductive line 174 is formed through dielectric material region 162 so it is in communication with device structure layer 156c. Conductive line 171 extends between device structure layer 156c and surface 162a. In this embodiment, conductive line 175 is formed through dielectric material region 162 so it is in communication with device structure layer 156d. Conductive line 175 extends between device structure layer 156d and surface 162a.

In this embodiment, conductive contacts 180, 181, 182, 183, 184 and 185 are formed on surface 162a. Conductive contacts 180, 181, 182, 183, 184 and 185 are in communication with conductive lines 170, 171, 172, 173, 174 and 175, respectively.

FIG. 7a is a close-up view of conductive bonding region 140. In this embodiment, conductive bonding region 140 includes conductive layer 144, barrier layer 143 and bonding layer 142, wherein barrier layer 143 is positioned on conductive layer 144 and bonding layer 142 is positioned on barrier layer 143. Bonding region surface 141 is adjacent to bonding layer 142.

As mentioned above, conductive layer 144 has thickness $t_3$, barrier layer 143 has thickness $t_2$ and bonding layer 142 has thickness $t_1$. In this embodiment, thickness $t_3$ is greater than thickness $t_2$. In this way, conductive layer 144 is thicker than barrier layer 143. In this embodiment, thickness $t_3$ is greater than thickness $t_1$. In this way, conductive layer 144 is thicker than bonding layer 142. In this embodiment, thickness $t_1$ is greater than thickness $t_2$. In this way, bonding layer 142 is thicker than barrier layer 143. In this embodiment, thickness $t_1$ is less than thickness $t_3$. In this way, bonding layer 142 is thinner than conductive layer 144. As mentioned above, the resistivity of a layer increases and decreases as the thickness of the layer decreases and increases, respectively. Hence, the resistivities of conductive layer 144, barrier layer 143 and bonding layer 142 are adjustable in response to adjusting thicknesses $t_3$, $t_2$ and $t_1$, respectively.

Figure 7B:
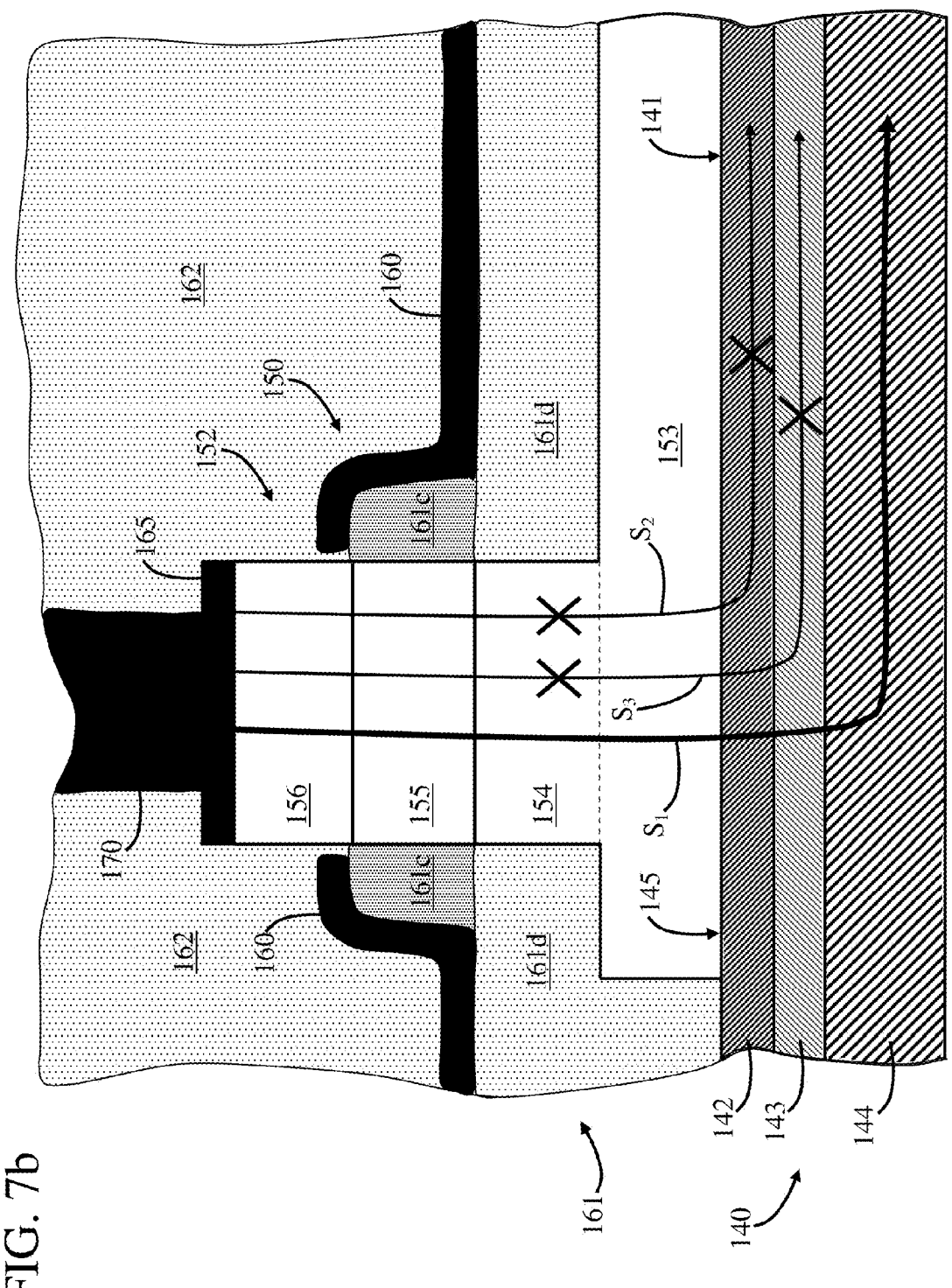

FIG. 7b is a side view of a vertically oriented semiconductor device 150 carried by conductive bonding region 140. In this embodiment, conductive bonding region 140 includes conductive bonding layer 144, barrier layer 143 and bonding layer 142 as shown in FIG. 7a. Conductive bonding region 140 operates as a bit line for vertically oriented semiconductor device 150.

In this embodiment, vertically oriented semiconductor device 150 includes device structure layer 153 adjacent to bonding region surface 141. Bonding interface 145 is established between device structure layer 153 and bonding layer 142. In this embodiment, vertically oriented semiconductor device 150 includes device structure layer 154 carried by device structure layer 153, device structure layer 155 carried by device structure layer 153 and device structure layer 154 and device structure layer 156 carried by device structure layers 153, 154 and 155.

It should be noted that device structure layers 154, 155 and 156 are included in a mesa structure 152. Mesa structure 152 extends from device structure layer 153 and away from conductive bonding region 140. Mesa structure 152 extends from device structure layer 153 and away from bonding interface 145. Mesa structure 152 extends from device structure layer 153 and away from bonding interface 145. Mesa structure 152 extends from device structure layer 153 and away from bonding layer 142. Mesa structure 152 extends from device structure layer 153 and away from barrier layer 143. Mesa structure 152 extends from device structure layer 153 and away from conductive layer 144.

In this embodiment, vertically oriented semiconductor device 150 includes a dielectric material region 161d. In this embodiment, dielectric material region 161d is adjacent to device structure layers 153 and 154.

In this embodiment, vertically oriented semiconductor device 150 includes a dielectric material region 161c. In this embodiment, dielectric material region 161c is adjacent to device structure layer 155 and dielectric material region 161b. As will be discussed in more detail below, dielectric material region 161c operates as a control dielectric.

In this embodiment, vertically oriented semiconductor device 150 includes a control terminal 160. In this embodiment, control terminal 160 is adjacent to dielectric material regions 161c and 161d. Control terminal 160 is electrically coupled to device structure layer 155 through dielectric material region 161c. The conductivity of device structure layer 155 is adjustable in response to a signal provided to control terminal 160. In particular, control terminal 160 is electrically coupled to a portion of mesa structure 152 between device structure layers 154 and 156 through dielectric material region 161c. The conductivity of the portion of mesa structure 152 between device structure layers 154 and 156 is adjustable in response to a signal provided to control terminal 160. In this way, control terminal 160 operates as a word line and vertically oriented semiconductor device 150 operates as a vertically oriented metal oxide semiconductor field effect transistor.

In this embodiment, a conductive contact 165 is in communication with device structure layer 156, and a conductive via 170 is in communication with conductive contact 165. In this embodiment, conductive contact 165 and conductive via provide a reference potential for vertically oriented semiconductor device 150.

In one mode of operation, signals $S_1$, $S_2$ and $S_3$ flow through mesa structure 152 and device structure layer 153 in response to a control signal applied to control terminal 160 and a potential difference established between conductive contact 165 and conductive bonding region 140. It should be noted that a combination of signals $S_1$, $S_2$ and $S_3$ correspond to a bit signal $S_{Bit}$. For example, in some embodiments, bit signal $S_{Bit}$ corresponds to the addition of signals $S_1$, $S_2$ and $S_3$ (i.e. $S_{Bit}=S_1, S_2$ and $S_3$). In this mode of operation, signals $S_1$, $S_2$ and $S_3$ flow through bonding interface 145 in response to the control signal applied to control terminal 160 and a potential difference established between conductive contact 165 and conductive bonding region 140. In this embodiment, signal $S_1$ flows through conductive layer 144, signal $S_2$ flows through bonding layer 142 and signal $S_3$ flows through barrier layer 143.

Signal $S_1$ has a larger amplitude than signal $S_2$. Signal $S_1$ has a larger amplitude than signal $S_2$ for many different reasons. One reason signal $S_1$ has a larger amplitude than signal $S_2$ is because, as mentioned above, conductive layer 144 has a larger conductivity than bonding layer 142. Conductive layer 144 can have a larger conductivity than bonding layer 142 for many different reasons. For example, the material of conductive layer 144 can be more conductive than the material of bonding layer 142. Further, thickness $t_3$ can be greater than thickness $t_1$. It is desirable to have signal $S_1$ be greater than signal $S_2$ so that signal $S_{Bit}$ has a smaller amplitude proximate to bonding interface 145.

Signal $S_1$ has a larger amplitude than signal $S_3$. Signal $S_1$ has a larger amplitude than signal $S_3$ for many different reasons. One reason signal $S_1$ has a larger amplitude than signal $S_3$ is because, as mentioned above, conductive layer 144 has a larger conductivity than barrier layer 143. Conductive layer 144 can have a larger conductivity than barrier layer 143 for many different reasons. For example, the material of conductive layer 144 can be more conductive than the material of barrier layer 143. Further, thickness $t_3$ can be greater than thickness $t_2$. It is desirable to have signal $S_1$ be greater than signal $S_3$ so that signal $S_{Bit}$ has a smaller amplitude proximate to bonding interface 145.

Figure 7C:
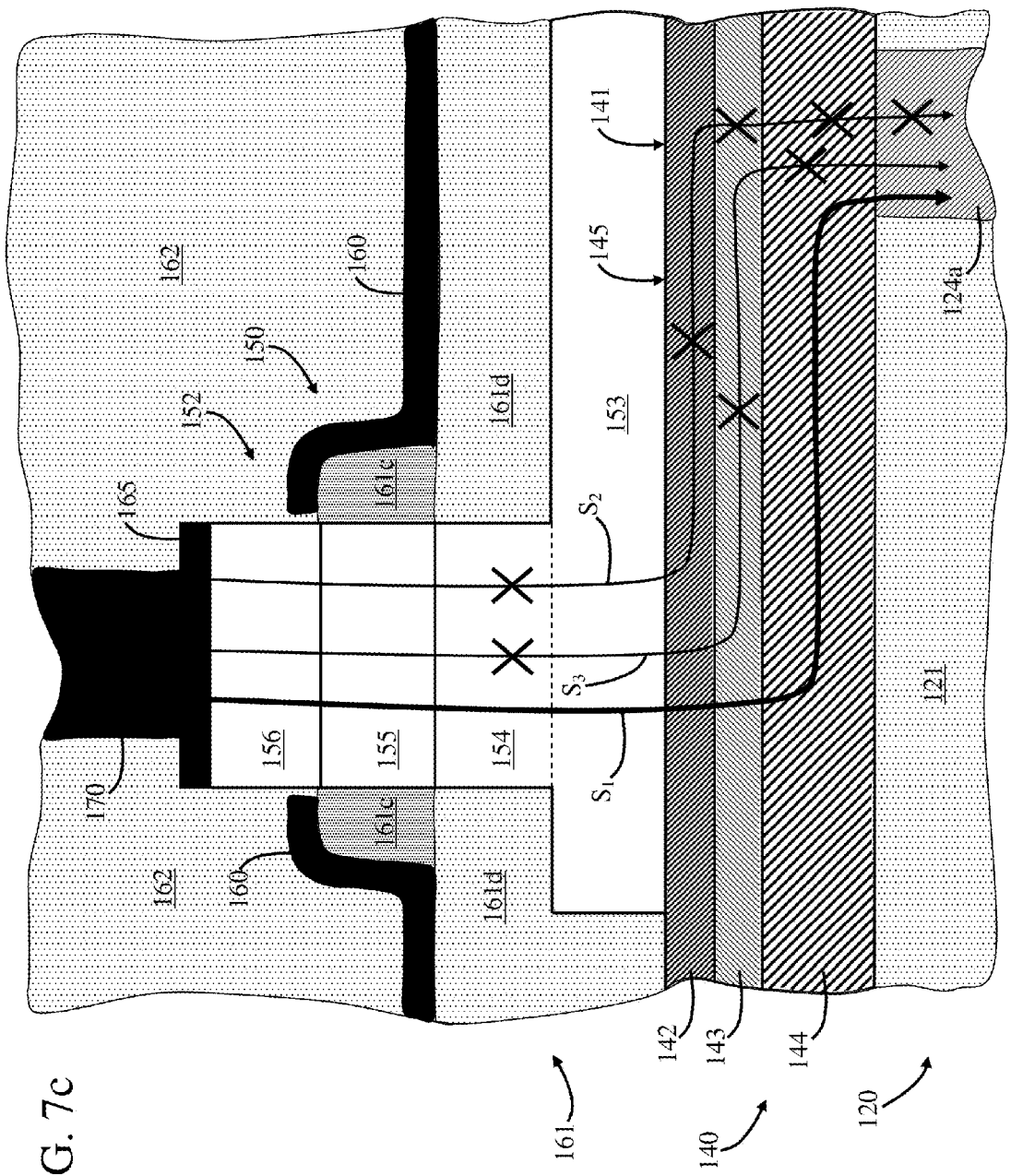
FIG. 7c is a side view of the vertically oriented semiconductor device carried by the conductive bonding region of FIG. 7b and an interconnect region.

FIG. 7c is a side view of vertically oriented semiconductor device 150 carried by conductive bonding region 140 of FIG. 7b. In this embodiment, conductive bonding region 140 includes conductive bonding layer 144, barrier layer 143 and bonding layer 142 as shown in FIG. 7b. As mentioned above, conductive bonding region 140 operates as a bit line for vertically oriented semiconductor device 150. In this embodiment, conductive via 124a of conductive line 122a extends through dielectric material region 121 and is in communication with conductive bonding region 140. In particular, conductive via 124a of conductive line 122a is in communication with conductive layer 144.

In FIG. 7c, bonding interface 145 extends between conductive via 124a and vertically oriented semiconductor device 150. Further, bonding interface 145 extends between conductive via 124a and device structure layer 153. Bonding interface 145 extends between conductive via 124a and mesa structure 152.

In FIG. 7c, conductive bonding layer 140 extends between vertically oriented semiconductor device 150 and conductive via 124a. Further, conductive bonding layer 140 extends between conductive via 124a and device structure layer 153. Conductive bonding layer 140 extends between conductive via 124a and mesa structure 152.

In FIG. 7c, conductive layer 144 extends between vertically oriented semiconductor device 150 and conductive via 124a. Further, conductive layer 144 extends between conductive via 124a and device structure layer 153. Conductive layer 144 extends between conductive via 124a and mesa structure 152.

In FIG. 7c, barrier layer 143 extends between vertically oriented semiconductor device 150 and conductive via 124a. Further, barrier layer 143 extends between conductive via 124a and device structure layer 153. Barrier layer 143 extends between conductive via 124a and mesa structure 152.

In FIG. 7c, bonding layer 142 extends between vertically oriented semiconductor device 150 and conductive via 124a. Further, bonding layer 142 extends between conductive via 124a and device structure layer 153. Bonding layer 142 extends between conductive via 124a and mesa structure 152.

In one mode of operation, signals $S_1$, $S_2$ and $S_3$ flow through mesa structure 152 and device structure layer 153 in response to the control signal applied to control terminal 160 and a potential difference established between conductive contact 165 and conductive bonding region 140. As mentioned above, the combination of signals $S_1$, $S_2$ and $S_3$ correspond to bit signal $S_{Bit}$. It is desirable for signals $S_1$, $S_2$ and $S_3$ to flow through conductive via 124a. Also, it is desirable to reduce the amplitudes of signals $S_2$ and $S_3$ flowing through conductive via 124a. In this way, the amplitude of signal $S_{Bit}$ is determined more by the amplitude of signal $S_1$, and the amplitude of signal $S_{Bit}$ is determined less by the amplitude of signals $S_2$ and $S_3$.

In this mode of operation, signals $S_1$, $S_2$ and $S_3$ flow through bonding interface 145 in response to the control signal applied to control terminal 160 and a potential difference established between conductive contact 165 and conductive bonding region 140. In this embodiment, signal $S_1$ flows through conductive layer 144, signal $S_2$ flows through bonding layer 142 and signal $S_3$ flows through barrier layer 143.

Signal $S_1$ has a larger amplitude than signal $S_2$. Signal $S_1$ has a larger amplitude than signal $S_2$ for many different reasons. One reason signal $S_1$ has a larger amplitude than signal $S_2$ is because, as mentioned above, conductive layer 144 has a larger conductivity than bonding layer 142. Conductive layer 144 can have a larger conductivity than bonding layer 142 for many different reasons. For example, the material of conductive layer 144 can be more conductive than the material of bonding layer 142. Further, thickness $t_3$ can be greater than thickness $t_1$. It is desirable to have signal $S_1$ be greater than signal $S_2$ so that signal $S_{Bit}$ has a smaller amplitude proximate to bonding interface 145.

Signal $S_1$ has a larger amplitude than signal $S_3$. Signal $S_1$ has a larger amplitude than signal $S_3$ for many different reasons. One reason signal $S_1$ has a larger amplitude than signal $S_3$ is because, as mentioned above, conductive layer 144 has a larger conductivity than barrier layer 143. Conductive layer 144 can have a larger conductivity than barrier layer 143 for many different reasons. For example, the material of conductive layer 144 can be more conductive than the material of barrier layer 143. Further, thickness $t_3$ can be greater than thickness $t_2$. It is desirable to have signal $S_1$ be greater than signal $S_3$ so that signal $S_{Bit}$ has a smaller amplitude proximate to bonding interface 145.

It is also desirable for signal $S_1$ to be greater than signal $S_2$ and for signal $S_1$ to be greater than signal $S_3$ so that signal $S_{Bit}$ is determined more by the amplitude of signal $S_1$, and signal $S_{Bit}$ is determined less by the amplitudes of signals $S_2$ and $S_3$.

FIG. 8*a* is a perspective view of mesa structure array 159 having a plurality of mesa structures 152, which are denoted as mesa structures 152*a*, 152*b*, 152*c*, etc. In general, mesa structure array 159 includes one or more mesa structures. The number of mesa structures of mesa structure array 159 generally corresponds to the number of vertically oriented semiconductor devices it is desired to manufacture.

FIGS. 8*b* and 8*c* are perspective and side views, respectively, of mesa structure array 159 of FIG. 8*a* carried by conductive bonding region 140, wherein conductive bonding region 140 includes conductive layer 144, barrier layer 143 and bonding layer 142. As mentioned above, mesa structure array 159 includes one or more mesa structures. The number of mesa structures of mesa structure array 159 generally corresponds to the number of vertically oriented semiconductor devices it is desired to manufacture. Hence, one or more mesa structures are coupled to conductive bonding region 140 through bonding. Further, one or more mesa structures are coupled to conductive bonding region 140 through bonding interface 145. One or more mesa structures are coupled to conductive bonding region 140 through device structure layer 153 which, as mentioned above, operates as a base support structure.

Figure 9A:
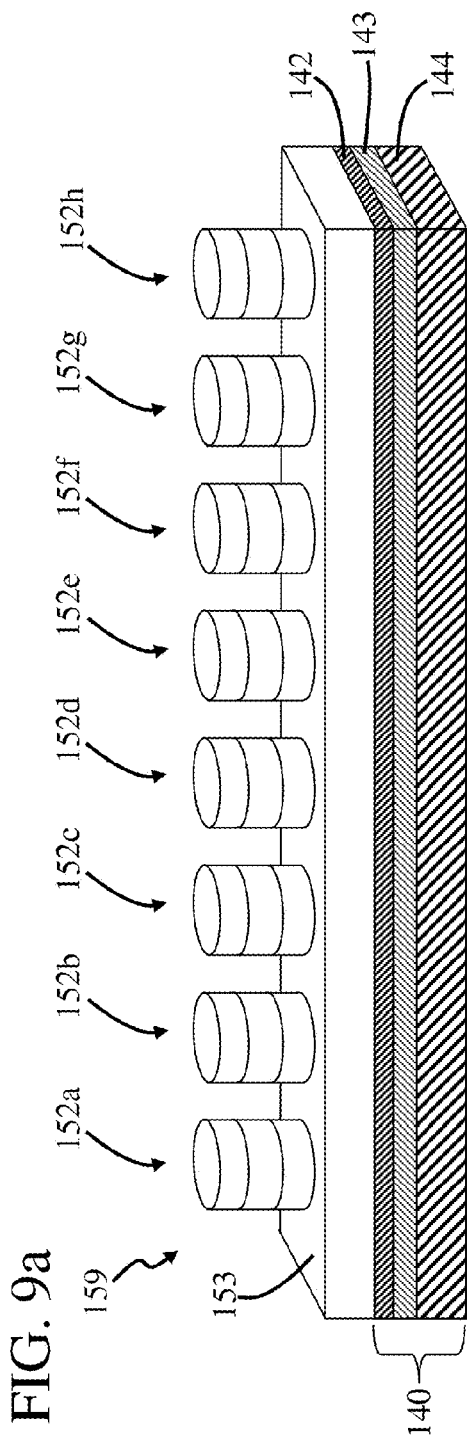
FIG. 9a is a perspective view of a mesa structure array having eight mesa structures.
Figure 9B:
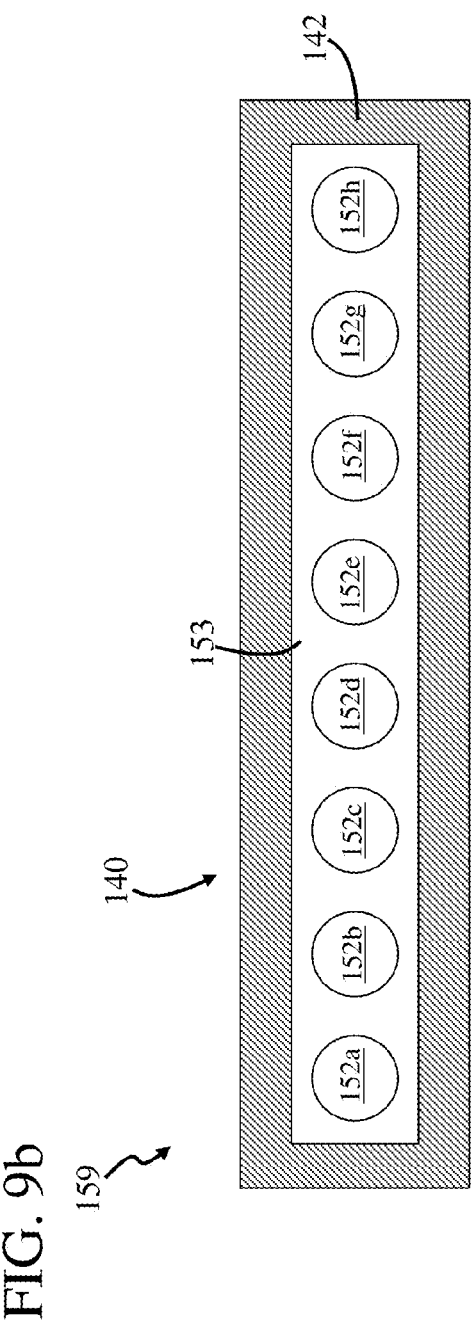

FIG. 9*a* is a perspective view of mesa structure array 159 having eight mesa structures 152, which are denoted as mesa structures 152*a*, 152*b*, 152*c*, 152*d*, 152*e*, 152*f*, 152*g* and 152*h*, and FIG. 9*b* is a top view of mesa structure array 159 of FIG. 9*a*. Mesa structure array 159 can include a number of mesa structures which correspond to a desired number of bits. For example, in some embodiments, mesa structure array 159 includes one mesa structure which corresponds to one bit. In some embodiments, mesa structure array 159 includes sixteen mesa structures which correspond to sixteen bits (one word). In this embodiment, however, mesa structure array 159 includes eight mesa structures which correspond to eight bits (one byte).

Figure 9C:
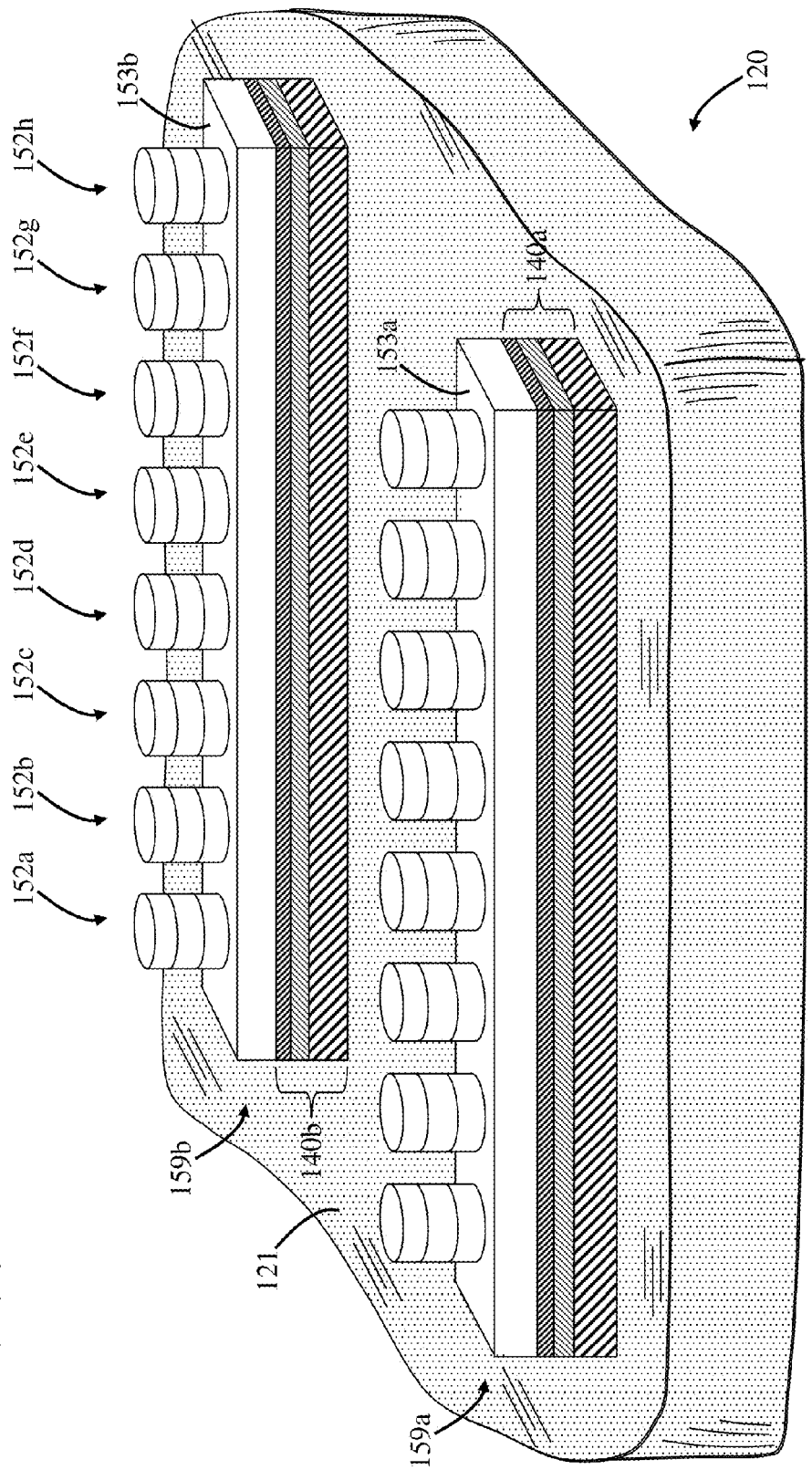
FIG. 9c is a perspective view of mesa structure arrays carried by an interconnect region.
Figure 9D:
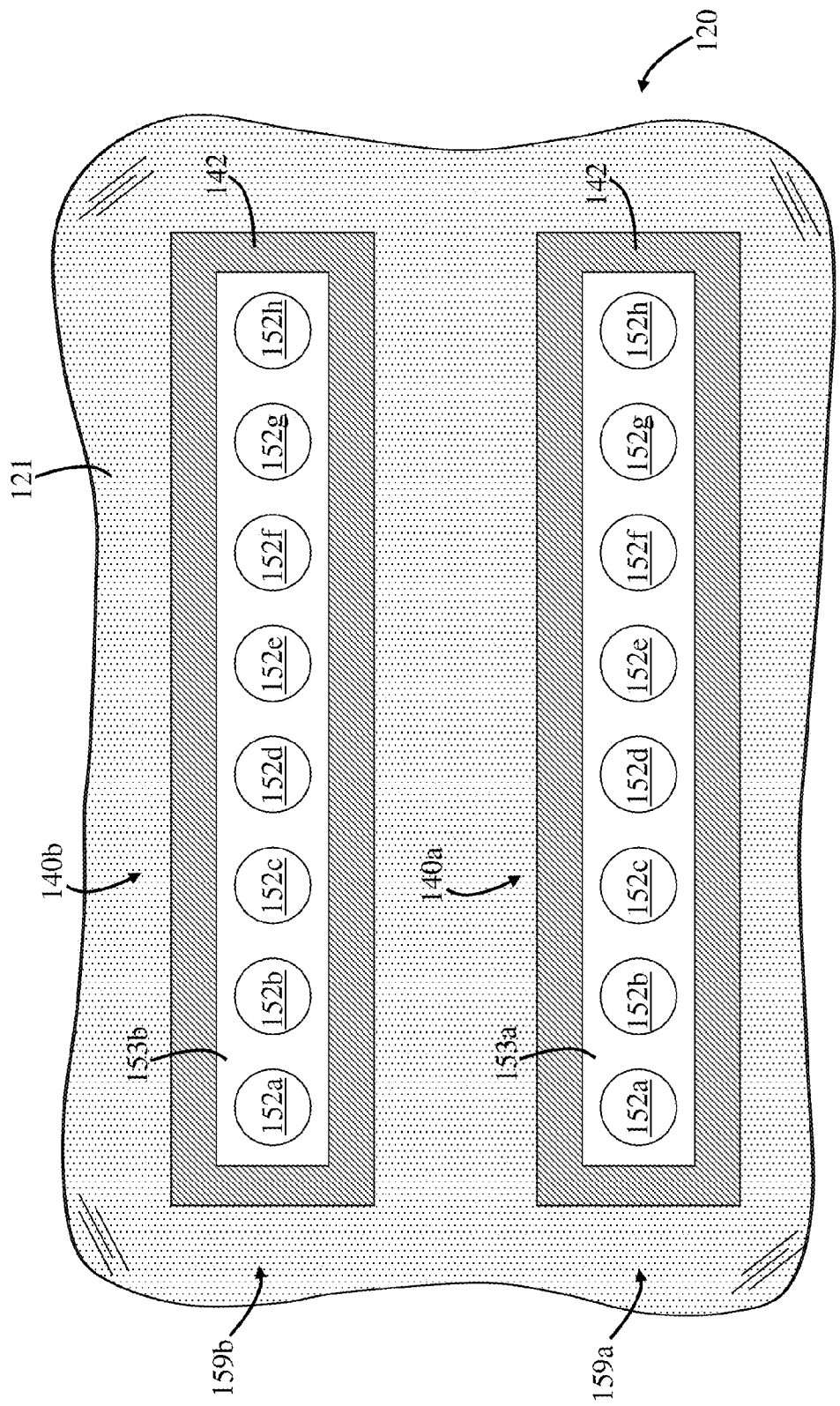
FIG. 9d is a top view of the mesa structure arrays of FIG. 9c.

FIG. 9*c* is a perspective view of mesa structure arrays 159*a* and 159*b* carried by interconnect region 120, and FIG. 9*d* is a top view of mesa structure arrays 159*a* and 159*b* of FIG. 9*c*. In FIGS. 9*c* and 9*d*, mesa structure arrays 159*a* and 159*b* are coupled to interconnect region 120 through conductive bonding regions 140*a* and 140*b*, respectively. In this embodiment, mesa structure array 159*a* corresponds to mesa structure array 159 of FIGS. 9*a* and 9*b*. In this way, mesa structure array 159*a* includes eight mesa structures carried by the same device structure layer 153*a*. Further, mesa structure array 159*b* corresponds to mesa structure array 159 of FIGS. 9*a* and 9*b*. In this way, mesa structure array 159*b* includes eight mesa structures carried by the same device structure layer 153*b*. It should be noted that device layer structures 153*a* and 153*b* operate as base support structures.

Figure 10A:
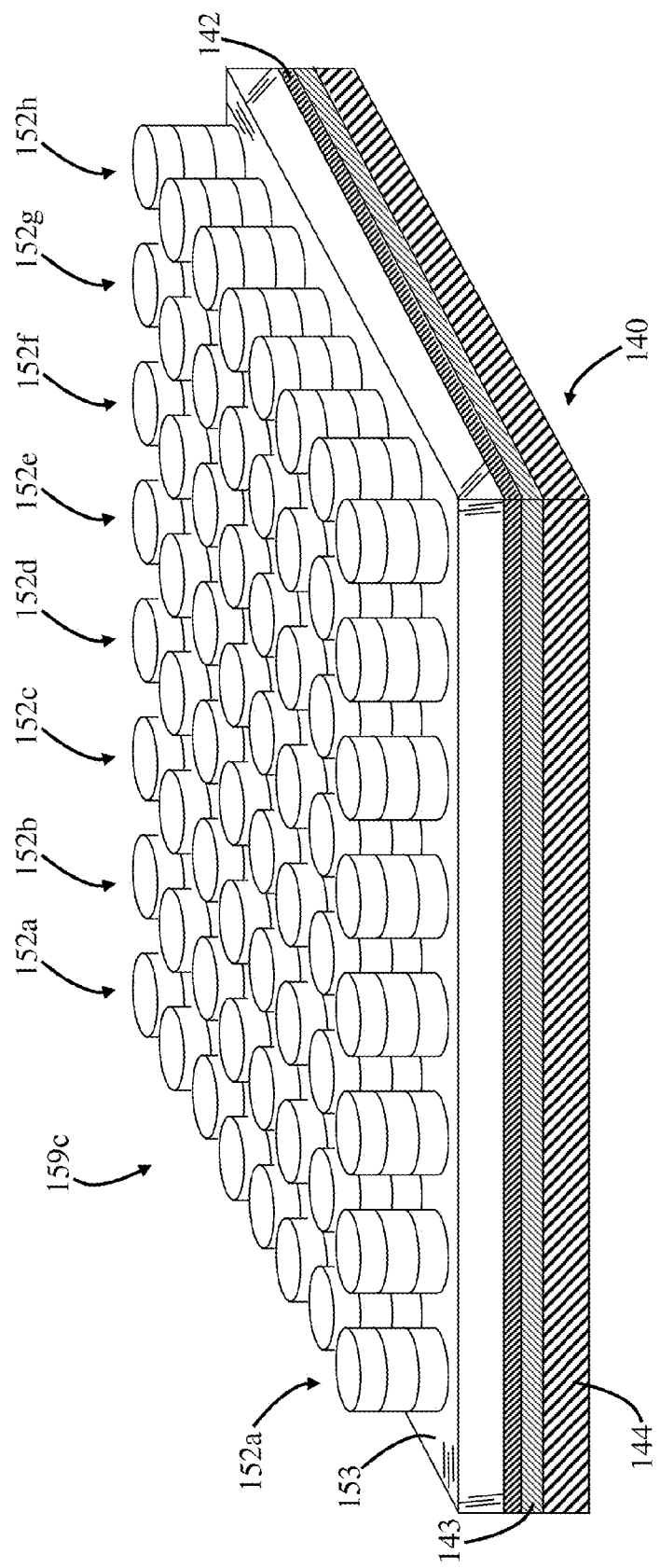
FIG. 10a is a perspective view of a mesa structure array carried by an interconnect region.
Figure 10B:
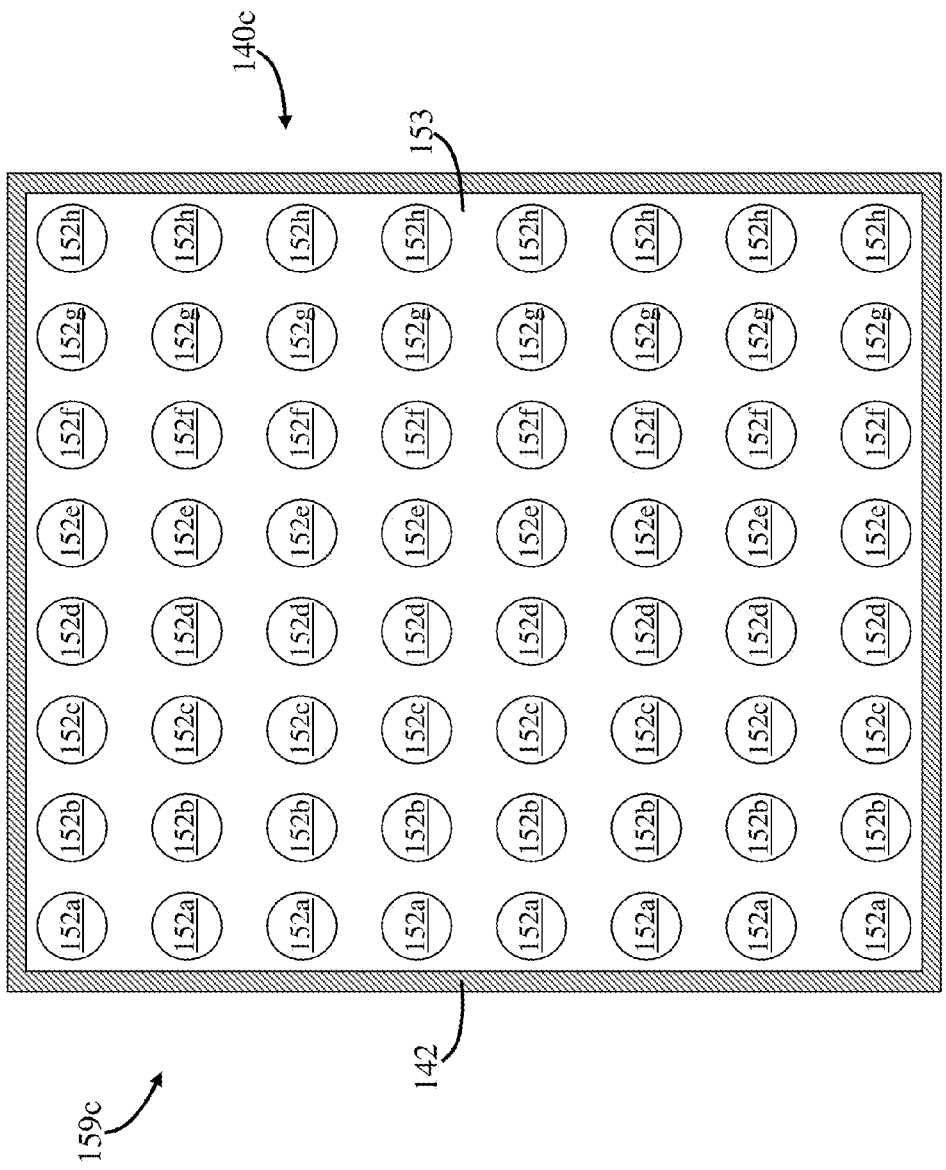

FIG. 10*a* is a perspective view of a mesa structure array 159*c* carried by interconnect region 120, and FIG. 10*b* is a top view of mesa structure arrays 159*c* of FIG. 10*a*. In FIGS. 10*a* and 10*b*, mesa structure array 159*c* is coupled to interconnect region 120 through conductive bonding region 140. In this embodiment, mesa structure array 159*c* includes sixty four mesa structures 152 carried by the same device structure layer 153. In this embodiment, mesa structure array 159*c* includes sixty four mesa structures which correspond to sixty four bits (64 bits). It should be noted that device layer structure 153 operates as a base support structure.

Figure 11B:
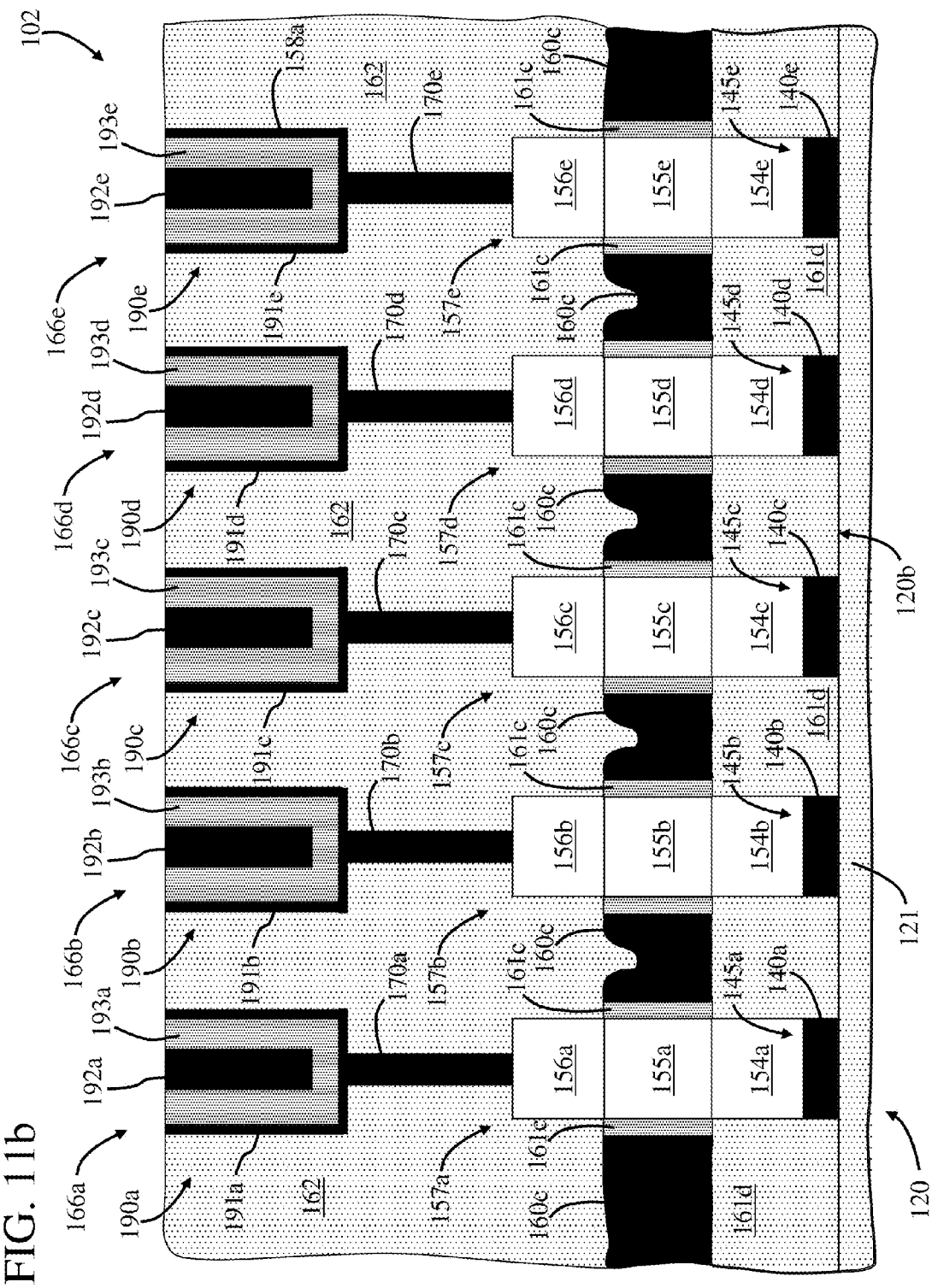
FIG. 11b is a cut-away side view of the bonded semiconductor structure of FIG. 11a taken along a cut-line 11b-11b of FIG. 11a, wherein cut-line 11b-11b extends along a row.
Figure 11C:
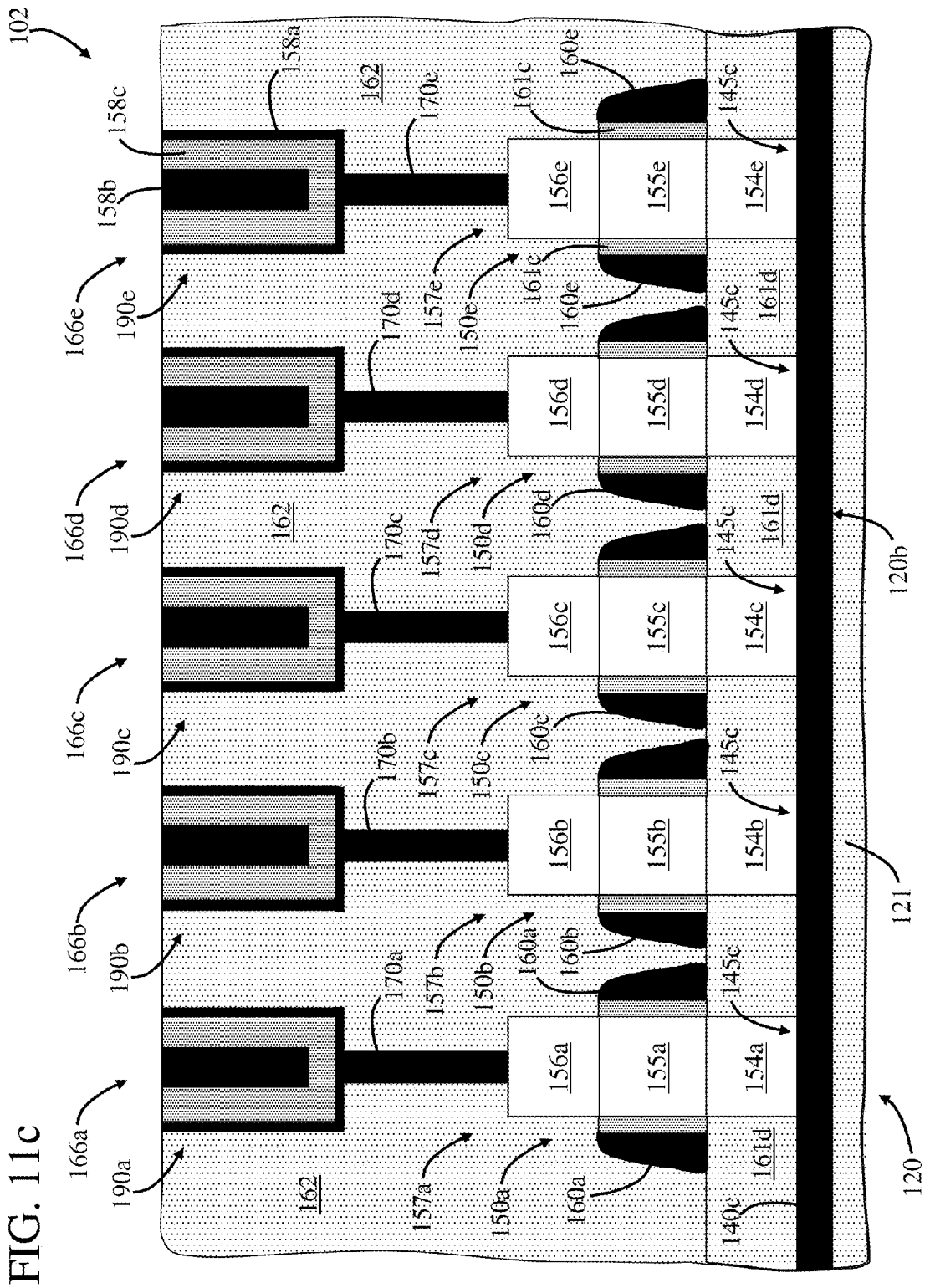
FIG. 11c is a cut-away side view of the bonded semiconductor structure of FIG. 11a taken along a cut-line 11b-11b of FIG. 11a, wherein cut-line 11c-11c extends along a column.

FIG. 11*a* is a top view of a portion of a bonded semiconductor structure 102, wherein bonded semiconductor structure 102 includes a plurality of memory devices 166*a*, 166*b*, 166*c*, 166*d* and 166*e* arranged in rows 167*a*, 167*b*, 167*c*, 167*d* and 167*e* and columns 168*a*, 168*b*, 168*c*, 168*d* and 168*e*. FIG. 11*b* is a cut-away side view of bonded semiconductor structure 102 taken along a cut-line 11*b*-11*b* of FIG. 11*a*, wherein cut-line 11*b*-11*b* extends along row 167*c*. FIG. 11*c* is a cut-away side view of bonded semiconductor structure 102 taken along a cut-line 11*b*-11*b* of FIG. 11*a*, wherein cut-line 11*c*-11*c* extends along column 168*c*. It should be noted that, in some embodiments, bonded semiconductor structure 102 includes interconnect region 120. In this embodiment, however, bonded semiconductor structure 102 includes support substrate 110 and interconnect region 120, which are discussed in more detail above. A portion of interconnect region 120 is shown in FIGS. 11*b* and 11*c*. However, support substrate 110 is not shown in FIGS. 11*a*, 11*b* and 11*c* for simplicity.

In this embodiment, bonded semiconductor structure 102 includes bit lines 140*a*, 140*b*, 140*c*, 140*d* and 140*e*, which extend along columns 168*a*, 168*b*, 168*c*, 168*d* and 168*e*, respectively. Bit lines 140*a*, 140*b*, 140*c*, 140*d* and 140*e* can be seen in FIG. 11*a* and the cut-away view of FIG. 11*b*. Bit lines 140*a*, 140*b*, 140*c*, 140*d* and 140*e* are carried by interconnect region 120. In particular, bit lines 140*a*, 140*b*, 140*c*, 140*d* and 140*e* are carried by dielectric material region 162.

In this embodiment, bonded semiconductor structure 102 includes word lines 160*a*, 160*b*, 160*c*, 160*d* and 160*e*, which extend along rows 167*a*, 167*b*, 167*c*, 167*d* and 167*e*, respectively. Word lines 160*a*, 160*b*, 160*c*, 160*d* and 160*e* can be seen in FIG. 11*a* and the cut-away view of FIG. 11*c*. Word lines 160*a*, 160*b*, 160*c*, 160*d* and 160*e* are carried by dielectric material region 161*d* of region 161, which is discussed in more detail above. It should be noted that, in this embodiment, rows 167*a*, 167*b*, 167*c*, 167*d* and 167*e* are perpendicular to columns 168*a*, 168*b*, 168*c*, 168*d* and 168*e*. In this way, bit lines 140*a*, 140*b*, 140*c*, 140*d* and 140*e* are perpendicular to word lines 160*a*, 160*b*, 160*c*, 160*d* and 160*e*.

In this embodiment, the plurality of memory devices of bonded semiconductor structure 102 extend through dielectric material regions 161 and 162. The formation of dielectric material regions 161 and 162 is discussed in more detail above, and is shown in several of the other drawings, such as in FIGS. 5*k* and 6*j*.

The memory devices of bonded semiconductor structure 102 can be of many different types, such as volatile and non-volatile memory. In this embodiment, the memory devices of bonded semiconductor structure 102 are dynamic random access memory (DRAM) devices, which include a storage element operatively coupled to a switch. In this particular embodiment, the switch is embodied as a vertically oriented semiconductor device and the storage element is embodied as a capacitor. For example, as shown in FIGS. 11b and 11c, memory devices 166a, 166b, 166c, 166d and 166e include vertically oriented semiconductor devices 157a, 157b, 157c, 157d and 157e, respectively. Further, memory devices 166a, 166b, 166c, 166d and 166e include capacitors 190a, 190b, 190c, 190d and 190e, respectively. Vertically oriented semiconductor devices 157a, 157b, 157c, 157d and 157e are operatively coupled to capacitors 190a, 190b, 190c, 190d and 190e, respectively, so that each memory device 166a, 166b, 166c, 166d and 166e operates as a DRAM device.

It should be noted that vertically oriented semiconductor devices 157a, 157b, 157c, 157d and 157e can be of many different types, such as those discussed above which include a base support structure. In this embodiment, vertically oriented semiconductor devices 157a, 157b, 157c, 157d and 157e correspond to the vertically oriented semiconductor devices which do not include a base support structure. More information regarding memory devices, DRAM devices, switches, vertically oriented semiconductor devices and capacitors can be found in the above identified patents and patent applications.

In this embodiment, vertically oriented semiconductor device 157a includes stack 150a of device structure layers 154a, 155a and 156a. In this embodiment, device structure layer 154a is adjacent to conductive bonding region 140a, device structure layer 155a is adjacent to device structure layer 154a and device structure layer 156a is adjacent to device structure layer 155a. Device structure layer 154a establishes bonding interface 145c with conductive bonding region 140a. In this embodiment, vertically oriented semiconductor device 157a includes control dielectric 161c, which extends annularly around stack 150a. In particular, control dielectric 161c extends annularly around device structure layer 155a. In this embodiment, word line 160c extends around control dielectric 161c. The conductivity of stack 150a is adjustable in response to adjusting a signal provided to word line 160c. In particular, the conductivity of device structure layer 155a is adjustable in response to adjusting a signal provided to word line 160c.

In this embodiment, vertically oriented semiconductor device 157b includes stack 150b of device structure layers 154b, 155b and 156b. In this embodiment, device structure layer 154b is adjacent to conductive bonding region 140b, device structure layer 155b is adjacent to device structure layer 154b and device structure layer 156b is adjacent to device structure layer 155b. Device structure layer 154b establishes bonding interface 145b with conductive bonding region 140b. In this embodiment, vertically oriented semiconductor device 157b includes control dielectric 161c, which extends annularly around stack 150b. In particular, control dielectric 161c extends annularly around device structure layer 155b. In this embodiment, word line 160c extends around control dielectric 161c. The conductivity of stack 150b is adjustable in response to adjusting a signal provided to word line 160c. In particular, the conductivity of device structure layer 155b is adjustable in response to adjusting a signal provided to word line 160c.

In this embodiment, vertically oriented semiconductor device 157c includes stack 150c of device structure layers 154c, 155c and 156c. In this embodiment, device structure layer 154c is adjacent to conductive bonding region 140c, device structure layer 155c is adjacent to device structure layer 154c and device structure layer 156c is adjacent to device structure layer 155c. Device structure layer 154c establishes bonding interface 145c with conductive bonding region 140c. In this embodiment, vertically oriented semiconductor device 157c includes control dielectric 161c, which extends annularly around stack 150c. In particular, control dielectric 161c extends annularly around device structure layer 155c. In this embodiment, word line 160c extends around control dielectric 161c. The conductivity of stack 150c is adjustable in response to adjusting a signal provided to word line 160c. In particular, the conductivity of device structure layer 155c is adjustable in response to adjusting a signal provided to word line 160c.

In this embodiment, vertically oriented semiconductor device 157d includes stack 150d of device structure layers 154d, 155d and 156d. In this embodiment, device structure layer 154d is adjacent to conductive bonding region 140d, device structure layer 155d is adjacent to device structure layer 154d and device structure layer 156d is adjacent to device structure layer 155d. Device structure layer 154d establishes bonding interface 145d with conductive bonding region 140d. In this embodiment, vertically oriented semiconductor device 157d includes control dielectric 161c, which extends annularly around stack 150d. In particular, control dielectric 161d extends annularly around device structure layer 155d. In this embodiment, word line 160c extends around control dielectric 161c. The conductivity of stack 150d is adjustable in response to adjusting a signal provided to word line 160c. In particular, the conductivity of device structure layer 155d is adjustable in response to adjusting a signal provided to word line 160c.

In this embodiment, vertically oriented semiconductor device 157e includes stack 150e of device structure layers 154e, 155d and 156e. In this embodiment, device structure layer 154e is adjacent to conductive bonding region 140e, device structure layer 155e is adjacent to device structure layer 154e and device structure layer 156e is adjacent to device structure layer 155e. Device structure layer 154e establishes bonding interface 145e with conductive bonding region 140e. In this embodiment, vertically oriented semiconductor device 157e includes control dielectric 161c, which extends annularly around stack 150e. In particular, control dielectric 161e extends annularly around device structure layer 155e. In this embodiment, word line 160c extends around control dielectric 161c. The conductivity of stack 150e is adjustable in response to adjusting a signal provided to word line 160c. In particular, the conductivity of device structure layer 155e is adjustable in response to adjusting a signal provided to word line 160c.

The capacitors of memory devices 166a, 166b, 166c, 166d and 166e can be of many different types. In this embodiment, capacitor 190a includes a capacitor dielectric 193a, which extends between capacitor electrodes 191a and 192a. Capacitor dielectric 193a is capable of storing a charge in response to a potential difference established between capacitor electrodes 191a and 192a. Capacitor electrode 191a is in communication with via 170a and capacitor electrode 192a is in communication with a read line, which is not shown. The charge stored by capacitor dielectric 193a is read, in a well-known manner, in response to the control signal applied to word line 160c.

In this embodiment, capacitor 190b includes a capacitor dielectric 193b, which extends between capacitor electrodes 191b and 192b. Capacitor dielectric 193b is capable of storing a charge in response to a potential difference established between capacitor electrodes 191b and 192b. Capacitor electrode 191b is in communication with via 170b and capacitor electrode 192b is in communication with a read line, which is not shown. The charge stored by capacitor dielectric 193b is read, in a well-known manner, in response to the control signal applied to word line 160c.

In this embodiment, capacitor 190c includes a capacitor dielectric 193c, which extends between capacitor electrodes 191c and 192c. Capacitor dielectric 193c is capable of storing a charge in response to a potential difference established between capacitor electrodes 191c and 192c. Capacitor electrode 191c is in communication with via 170c and capacitor electrode 192c is in communication with a read line, which is not shown. The charge stored by capacitor dielectric 193c is read, in a well-known manner, in response to the control signal applied to word line 160c.

In this embodiment, capacitor 190d includes a capacitor dielectric 193d, which extends between capacitor electrodes 191d and 192d. Capacitor dielectric 193d is capable of storing a charge in response to a potential difference established between capacitor electrodes 191d and 192d. Capacitor electrode 191d is in communication with via 170d and capacitor electrode 192d is in communication with a read line, which is not shown. The charge stored by capacitor dielectric 193d is read, in a well-known manner, in response to the control signal applied to word line 160c.

In this embodiment, capacitor 190e includes a capacitor dielectric 193e, which extends between capacitor electrodes 191e and 192e. Capacitor dielectric 193e is capable of storing a charge in response to a potential difference established between capacitor electrodes 191e and 192e. Capacitor electrode 191e is in communication with via 170e and capacitor electrode 192e is in communication with a read line, which is not shown. The charge stored by capacitor dielectric 193e is read, in a well-known manner, in response to the control signal applied to word line 160c.

It should be noted that the material of capacitor dielectrics 193a, 193b, 193c, 193d and 193e can be of many different types of dielectric material, such as silicon dioxide. In some embodiments, the material of capacitor dielectrics 193a, 193b, 193c, 193d and 193e is the same material as dielectric material region 162. It should also be noted that the material of capacitor electrodes 191a, 191b, 191c, 191d and 191e and capacitor electrodes 192a, 192b, 192c, 192d and 192e can be of many different types of conductive material, such as the conductive materials typically used in CMOS processing. In some embodiments, the material of capacitor electrodes 191a, 191b, 191c, 191d and 191e and capacitor electrodes 192a, 192b, 192c, 192d and 192e is the same material as the conductive lines of interconnect region 120.

FIGS. 11d and 11e are more detailed perspective views of one embodiment of a memory device 166. It should be noted that FIG. 11e corresponds to FIG. 11d with a portion of memory device 166 cut away. In this embodiment, memory device 166 includes a capacitor 190 operatively coupled to a vertically oriented semiconductor device 157 through conductive via 170. Conductive via 170 and the formation of conductive via 170 is discussed in more detail above. It should be noted that memory device 166 can correspond to any of memory devices 166a, 166b, 166c, 166d and 166e. Further, vertically oriented semiconductor device 157 can correspond to any of the other vertically oriented semiconductor devices disclosed herein. Capacitor 190 can correspond to any of capacitors 190a, 190b, 190c, 190d and 190e.

Vertically oriented semiconductor device 157 includes mesa structure 152 having device structure layers 154, 155 and 156. Mesa structure 152 and the formation of mesa structure 152 is discussed in more detail above. Mesa structure 152 is bonded to conductive bonding region 140 through bonding interface 145, wherein conductive bonding region 140 operates as a bit line and can correspond to any of bit lines 140a, 140b, 140c, 140d and 140e. Conductive bonding region 140 and the formation of conductive bonding region 140 is discussed in more detail above, wherein conductive bonding region 140 includes conductive layer 144, barrier layer 143 and bonding layer 142 (FIG. 5a). In this embodiment, bit lines 140a, 140b, 140c, 140d and 140e are formed in response to removing selected portions of conductive bonding region 140. Information regarding removing selected portions of conductive bonding region 140 is provided in more detail above, and is shown in several of the drawings, such as in FIGS. 5e and 6b.

Device structure layer 154 is bonded to conductive bonding region 140 through bonding interface 145. Bonding interface 145 and the formation of bonding interface 145 is discussed in more detail above. In some embodiments, device structure layer 154 has a polished surface which faces conductive bonding region 140. The surface of device structure layer 154 can be polished in many different ways, such as by using chemical mechanical polishing. It is useful to polish the surface of device structure layer 154 facing conductive bonding region so that a stronger bond can be formed therebetween when forming bonding interface 145. Further, it is useful to polish the surface of device structure layer 154 facing conductive bonding region so that a signal flowing between device structure layer 154 and conductive bonding region 140 experiences less attenuation in response to flowing through bonding interface 145.

It should be noted that bonding interface 145 is not a growth interface because, as discussed in more detail above, a bonding interface is not a growth interface. In this embodiment, device structure layer 154 includes single crystalline semiconductor material, and it is difficult to deposit single crystalline semiconductor material on a non-semiconductor material, such as a metal. In some embodiments, device structure layer 154 includes crystalline semiconductor material, and it is difficult to deposit crystalline semiconductor material on a non-semiconductor material, such as a metal. Hence, it is useful to form a bonding interface between device structure layer 154 and conductive bonding region 140 instead of a growth interface.

It is undesirable to form a growth interface between device structure layer 154 and conductive bonding region 140 because growth interfaces generally have more growth defects than bonding interfaces. It is undesirable to have growth defects between device structure layer 154 and conductive bonding region 140 because a signal will experience more attenuation in response to flowing between device structure layer 154 and conductive bonding region 140. Growth defects are discussed in more detail above with in FIG. 1c.

In this embodiment, memory device 166 includes control dielectric 161c of dielectric material region 161, wherein control dielectric 161c extends annularly around device structure layer 155. Memory device 166 includes control terminal 160, which extends annularly around control dielectric 161c and operates as a word line. A control signal provided to control terminal 160 is adjustable to adjust the conductivity of device structure layer 155. In this way, control terminal 160 operates as a word line. It should be noted that control terminal 160 can correspond to any of word lines 160a, 160b, 160c, 160d and 160e.

In this embodiment, capacitor 190 includes a capacitor dielectric 193, which extends between capacitor electrodes 191 and 192. Capacitor dielectric 193 is capable of storing a charge in response to a potential difference established between capacitor electrodes 191 and 192. Capacitor electrode 191 is in communication with via 170 and capacitor electrode 192 is in communication with a read line, which is not shown. The charge stored by capacitor dielectric 193 is read, in a well-known manner, in response to the control signal applied to word line 160.

Hence, FIGS. 11d and 11e show a memory device 166 which includes conductive bonding region 140, mesa structure 152 coupled to conductive bonding region 140 through bonding interface 145, and capacitor 190 operatively coupled to mesa structure 152. In operation, capacitor 190 stores a charge in response to a signal flowing through bonding interface 145.

FIGS. 11d and 11e show control dielectric 161c which extends around mesa structure 152, and control terminal 160 which extends around mesa structure 152. In operation, conductivity of mesa structure 152 is adjustable in response to adjusting a signal provided to control terminal 160. A current flow through bonding interface 145 is adjustable in response to adjusting a signal provided to control terminal 160. The operation of capacitor 190 is controllable in response to a signal provided to control terminal 160. The operation of capacitor 190 is controllable by controlling the amount of charge stored by capacitor dielectric 193. The operation of capacitor 190 is controllable by controlling the potential difference between capacitor electrodes 191 and 192. In this way, memory device 166 can be read, refreshed, written to and erased.

As shown in FIGS. 11a, 11b and 11e, bit line 140a is in communication with memory devices 166a of column 168a, bit line 140b is in communication with memory devices 166b of column 168b, bit line 140c is in communication with memory devices 166c of column 168c, bit line 140d is in communication with memory devices 166d of column 168d and bit line 140e is in communication with memory devices 166e of column 168e.

Further, memory devices 166a, 166b, 166c, 166d and 166e of row 167a are in communication with word line 160a, memory devices 166a, 166b, 166c, 166d and 166e of row 167b are in communication with word line 160b, memory devices 166a, 166b, 166c, 166d and 166e of row 167c are in communication with word line 160c, memory devices 166a, 166b, 166c, 166d and 166e of row 167d are in communication with word line 160d and memory devices 166a, 166b, 166c, 166d and 166e of row 167e are in communication with word line 160e. In this way, bonded semiconductor structure 102 includes an array of memory devices.

As shown in FIGS. 11b and 11e, the mesa structures of memory devices 166a are bonded to bit line 140a through a corresponding bonding interface 145a. Hence, bonded semiconductor structure 102 includes a plurality of mesa structures bonded to a bit line 140a through a bonding interface 145a. It should be noted that, in this embodiment, the number of bonding interfaces 145a corresponds to the number of memory devices 166a. The number of bonding interfaces 145a increases and decreases as the number of memory devices 166a increases and decreases, respectively.

The mesa structures of memory devices 166b are bonded to bit line 140b through a corresponding bonding interface 145b. Hence, bonded semiconductor structure 102 includes a plurality of mesa structures bonded to bit line 140b through bonding interface 145b. It should be noted that, in this embodiment, the number of bonding interfaces 145b corresponds to the number of memory devices 166b. The number of bonding interfaces 145b increases and decreases as the number of memory devices 166b increases and decreases, respectively.

The mesa structures of memory device 166c are bonded to bit line 140c through a corresponding bonding interface 145c. Hence, bonded semiconductor structure 102 includes a plurality of mesa structures bonded to bit line 140c through bonding interface 145c. It should be noted that, in this embodiment, the number of bonding interfaces 145c corresponds to the number of memory devices 166c. The number of bonding interfaces 145c increases and decreases as the number of memory devices 166c increases and decreases, respectively.

The mesa structures of memory device 166d are bonded to bit line 140d through a corresponding bonding interface 145d. Hence, bonded semiconductor structure 102 includes a plurality of mesa structures bonded to bit line 140d through bonding interface 145d. It should be noted that, in this embodiment, the number of bonding interfaces 145d corresponds to the number of memory devices 166d. The number of bonding interfaces 145d increases and decreases as the number of memory devices 166d increases and decreases, respectively.

The mesa structures of memory device 166e are bonded to bit line 140e through a corresponding bonding interface 145e. Hence, bonded semiconductor structure 102 includes a plurality of mesa structures bonded to bit line 140e through bonding interface 145e. It should be noted that, in this embodiment, the number of bonding interfaces 145e corresponds to the number of memory devices 166e. The number of bonding interfaces 145e increases and decreases as the number of memory devices 166e increases and decreases, respectively.

In this way, bonded semiconductor structure 102 includes a plurality of mesa structures coupled to a corresponding bit line through corresponding bonding interfaces. Further, the number of bonding interfaces of bonded semiconductor structure 102 increases and decreases as the number of memory devices of bonded semiconductor structure 102 increases and decreases, respectively. It should be noted that, in general, bonded semiconductor structure 102 can include one or more mesa structures bonded to a corresponding bit line. However, a plurality of mesa structures are shown in this embodiment for illustrative purposes.

In this embodiment, device structure layers 156 of memory devices 166a are bonded to bit line 140a through corresponding bonding interfaces 145a. Hence, bonded semiconductor structure 102 includes a plurality of device structure layers bonded to bit line 140a through bonding interface 145a.

Device structure layers 156 of memory device 166b are bonded to bit line 140b through corresponding bonding interfaces 145b. Hence, bonded semiconductor structure 102 includes a plurality of device structure layers bonded to bit line 140b through bonding interface 145b.

Device structure layers 156 of memory device 166c are bonded to bit line 140c through corresponding bonding interfaces 145c. Hence, bonded semiconductor structure 102 includes a plurality of device structure layers bonded to bit line 140c through bonding interface 145c.

Device structure layers 156 of memory device 166d are bonded to bit line 140d through corresponding bonding interfaces 145d. Hence, bonded semiconductor structure 102 includes a plurality of device structure layers bonded to bit line 140d through bonding interface 145d.

Device structure layers 156 of memory device 166e are bonded to bit line 140e through corresponding bonding interfaces 145e. Hence, bonded semiconductor structure 102 includes a plurality of device structure layers bonded to bit line 140e through bonding interface 145e.

In this way, bonded semiconductor structure 102 includes a plurality of device structure layers coupled to a corresponding bit line. It should be noted that bonding interfaces 145a, 145b, 145c, 145d and 145e correspond to bonding interface 145, which is discussed in more detail above. It should also be noted that bonding interfaces 145a, 145b, 145c, 145d and 145e are not growth interfaces because, as discussed in more detail above, a bonding interface is not a growth interface.

Figure 12A:
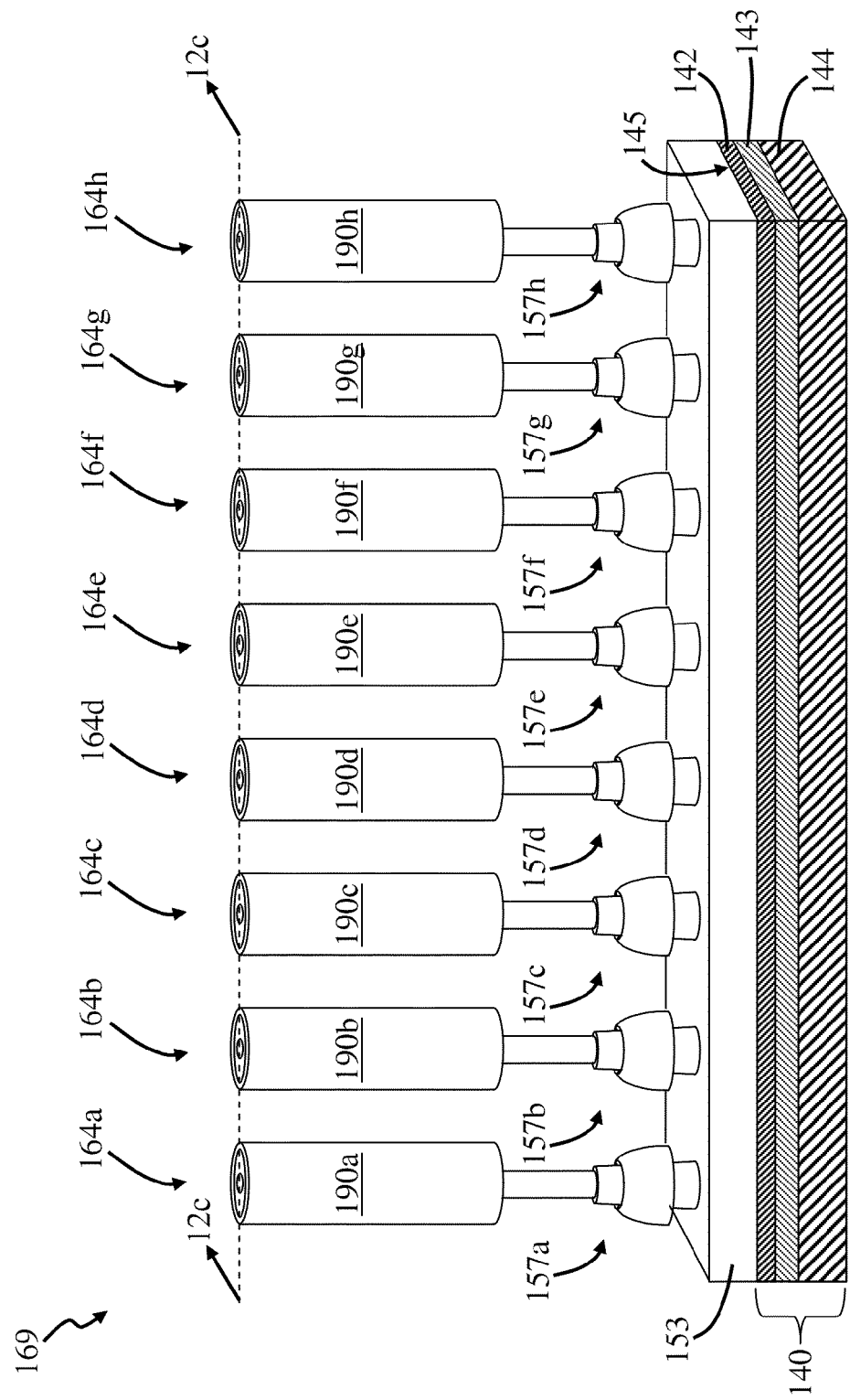
FIG. 12a is a perspective view of an array of memory elements having a vertically oriented semiconductor device in communication with a storage element.
Figure 12B:
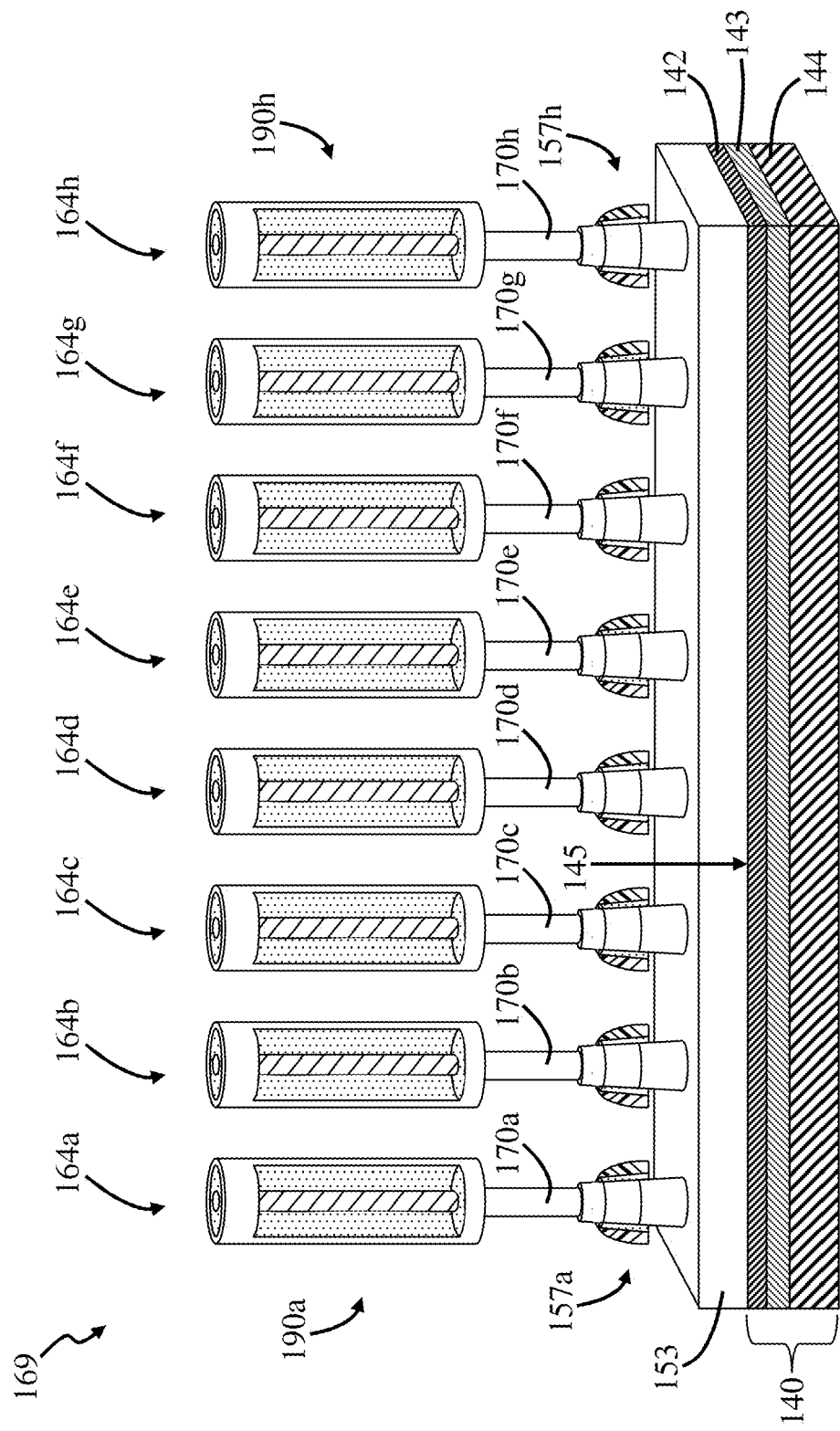

FIGS. 12a and 12b are perspective views of a memory device array 169. FIG. 12c is a cut-away side view of memory device array 169 of FIG. 12a taken along a cut-line 12c-12c. In this embodiment, memory device array 169 includes memory devices 164a, 164b, 164c, 164d, 164e, 164f, 164g and 164h. In this embodiment, memory device array 169 includes eight memory devices, which corresponds to a byte (i.e. eight bits). It should be noted that FIG. 12b corresponds to FIG. 12a with portions of memory devices 164a, 164b, 164c, 164d, 164e, 164f, 164g and 164h cut away.

In this embodiment, memory devices 164a, 164b, 164c, 164d, 164e, 164f, 164g and 164h include vertically oriented semiconductor devices 157a, 157b, 157c, 157d, 157e, 157f, 157g and 157h, respectively. Further, memory devices 164a, 164b, 164c, 164d, 164e, 164f, 164g and 164h include capacitors 190a, 190b, 190c, 190d, 190e, 190f, 190g and 190h, respectively. Vertically oriented semiconductor devices 157a, 157b, 157c, 157d, 157e, 157f, 157g and 157h are operatively coupled to capacitors 190a, 190b, 190c, 190d, 190e, 190f, 190g and 190h, respectively, so that each memory device 164a, 164b, 164c, 164d, 164e, 164f, 164g and 164h operates as a DRAM device. In this embodiment, vertically oriented semiconductor devices 157a, 157b, 157c, 157d, 157e, 157f, 157g and 157h are operatively coupled to corresponding capacitors 190a, 190b, 190c, 190d, 190e, 190f, 190g and 190h through vias 170a, 170b, 170c, 170d, 170e, 170f, 170g and 170h, respectively. It should be noted that vias 170a, 170b, 170c, 170d, 170e, 170f, 170g and 170h can correspond to via 170, which is discussed in more detail above.

It should also be noted that, in this embodiment, vertically oriented semiconductor devices 157a, 157b, 157c, 157d, 157e, 157f, 157g and 157h correspond to vertically oriented semiconductor devices which includes a base support structure. In this embodiment, vertically oriented semiconductor devices 157a, 157b, 157c, 157d, 157e, 157f, 157g and 157h include device layer structure 153, which operates as a base support structure, as discussed in more detail above. Device layer structure 153 is coupled to conductive bonding region 140, as discussed in more detail above with FIGS. 5f-5k, FIGS. 6d-6j, FIGS. 7b-7c, FIGS. 8a-8c, FIGS. 9a-9d, and FIGS. 10a-10b. More information regarding memory devices, DRAM devices, switches, vertically oriented semiconductor devices and capacitors can be found in the above identified patents and patent applications.

The capacitors of memory devices 164a, 164b, 164c, 164d and 164e can be of many different types, such as those discussed in more detail above with FIGS. 11b-11e. In this embodiment, each capacitor includes a capacitor dielectric 193, which extends between capacitor electrodes 191 and 192. Capacitor dielectric 193 is capable of storing a charge in response to a potential difference established between capacitor electrodes 191 and 192. Each capacitor electrode 191 is in communication with a corresponding via 170 and capacitor electrode 192 is in communication with a read line, which is not shown. The charge stored by capacitor dielectric 193 is read, in a well-known manner, in response to the control signal applied to a word line, as will be discussed in more detail presently.

Figure 12D:
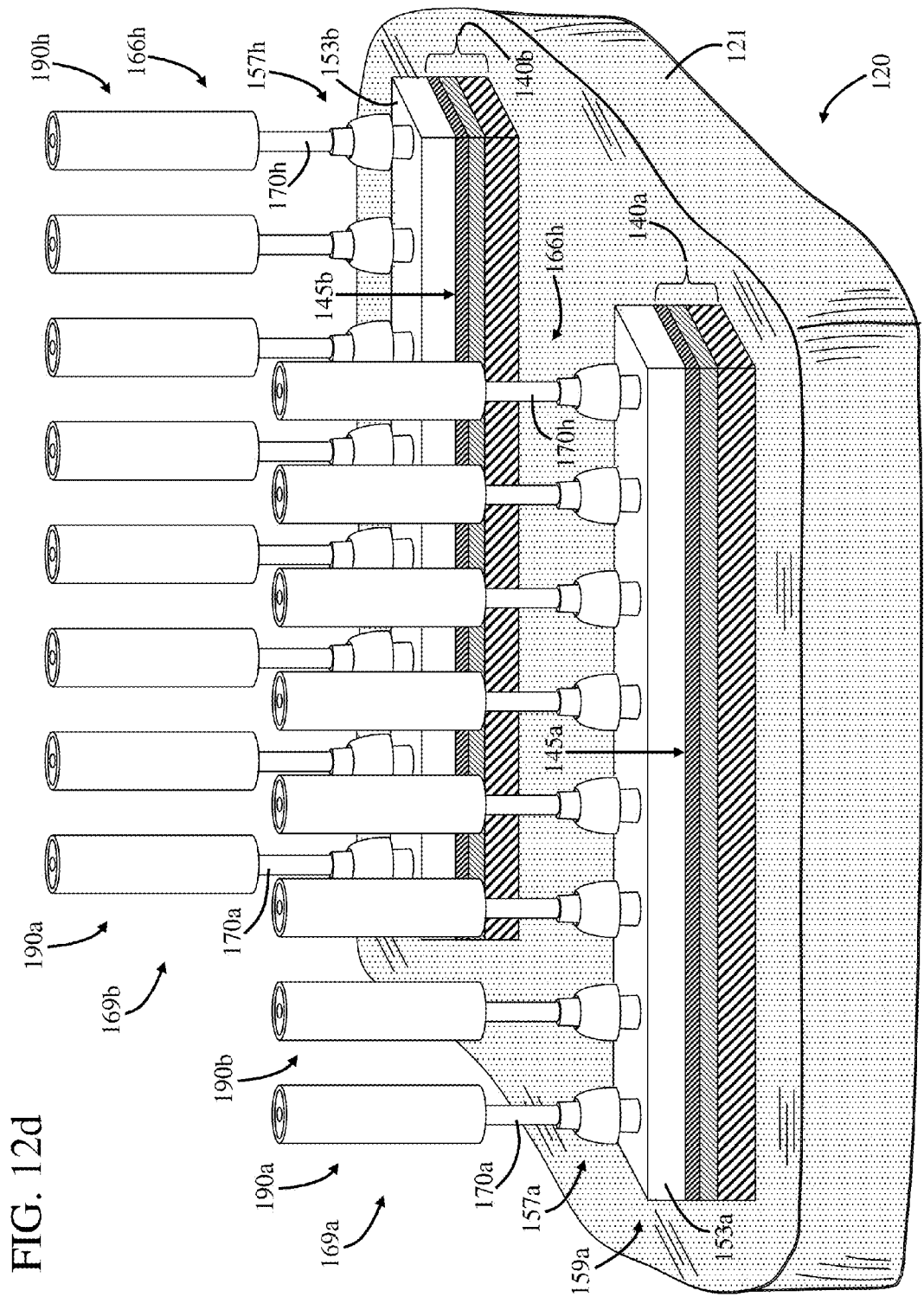
FIG. 12d is a perspective view of the array of memory elements of FIG. 12a carried by an interconnect region.
Figure 12E:
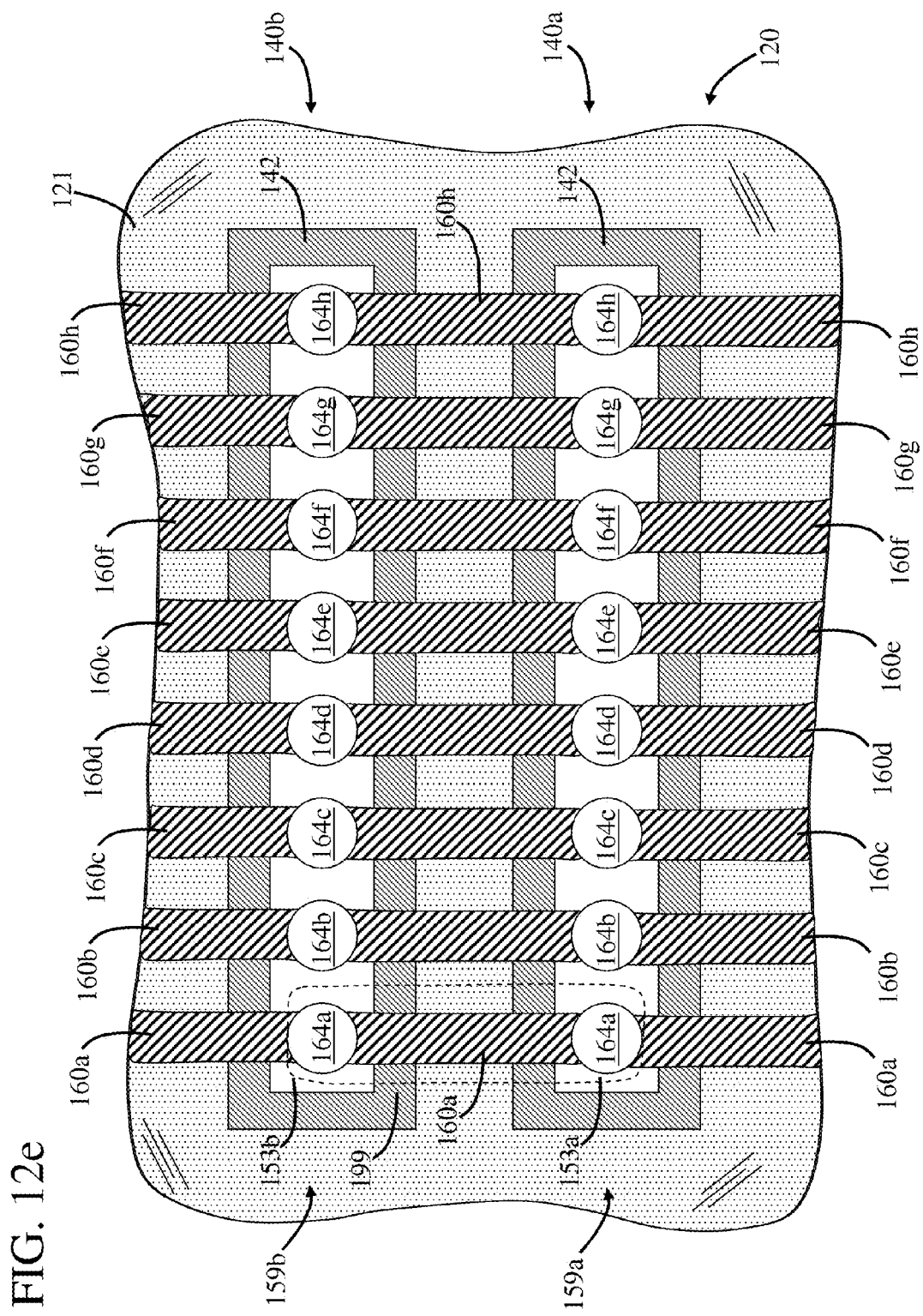
FIG. 12e is a top view of the array of FIG. 12d with word lines extending between the memory elements.
Figure 12F:
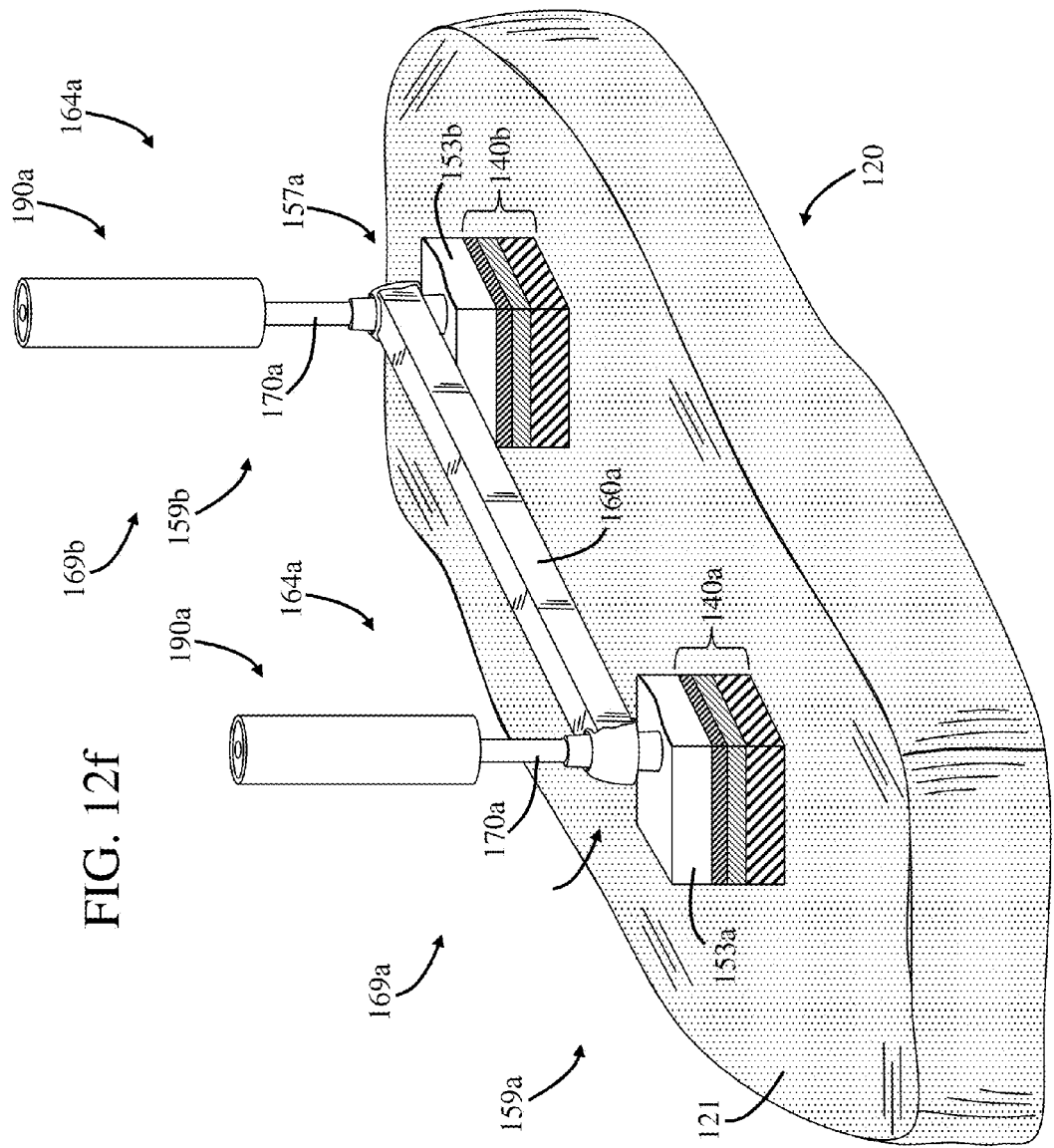
FIG. 12f is a perspective view of a portion of the array of FIG. 12d with a word line extending between memory elements.

FIG. 12d is a perspective view of memory device arrays 169a and 169b carried by interconnect region 120. FIG. 12e is a top view of memory device arrays 169a and 169b carried by interconnect region 120 of FIG. 12d with word lines extending therebetween. FIG. 12f is a perspective view of a region 199 of FIG. 12e.

In FIGS. 12d, 12e and 12f, memory device arrays are coupled to interconnect region 120 through conductive bonding regions 140a and 140b, respectively. In this embodiment, memory device array 169a corresponds to memory device array 169 of FIGS. 12a, 12b and 12c. As mentioned above, memory device array 169 includes mesa structure array 159. In this way, mesa structure array 169a includes eight mesa structures carried by the same device structure layer 153a. In this embodiment, memory device array 169b corresponds to memory device array 169 of FIGS. 12a, 12b and 12c. As mentioned above, memory device array 169 includes mesa structure array 159. In this way, mesa structure array 169b includes eight mesa structures carried by the same device structure layer 153b. It should be noted that device layer structures 153a and 153b operate as base support structures.

In this embodiment, word lines 160a, 160b, 160c, 160d, 160e, 160f, 160g and 160h extend between memory device arrays 169a and 169b. Word line 160a extends between memory devices 164a of mesa structure arrays 169a and 169b. In particular, word line 160a extends between vertically oriented semiconductor devices 157a of mesa structure arrays 169a and 169b. Word line 160a extends between the control terminals of vertically oriented semiconductor devices 157a of mesa structure arrays 169a and 169b. A portion of word line 160a between vertically oriented semiconductor devices 157a of mesa structure arrays 169a and 169b is shown in perspective in the view of FIG. 12f.

Word line 160b extends between memory devices 164b of mesa structure arrays 169a and 169b. In particular, word line 160b extends between vertically oriented semiconductor devices 157b of mesa structure arrays 169a and 169b. Word line 160b extends between the control terminals of vertically oriented semiconductor devices 157b of mesa structure arrays 169a and 169b.

Word line 160c extends between memory devices 164c of mesa structure arrays 169a and 169b. In particular, word line 160c extends between vertically oriented semiconductor devices 157c of mesa structure arrays 169a and 169b. Word line 160c extends between the control terminals of vertically oriented semiconductor devices 157c of mesa structure arrays 169a and 169b.

Word line 160d extends between memory devices 164d of mesa structure arrays 169a and 169b. In particular, word line 160d extends between vertically oriented semiconductor devices 157d of mesa structure arrays 169a and 169b. Word line 160d extends between the control terminals of vertically oriented semiconductor devices 157d of mesa structure arrays 169a and 169b.

Word line 160e extends between memory devices 164e of mesa structure arrays 169a and 169b. In particular, word line 160e extends between vertically oriented semiconductor devices 157e of mesa structure arrays 169a and 169b. Word line 160e extends between the control terminals of vertically oriented semiconductor devices 157e of mesa structure arrays 169a and 169b.

Word line 160f extends between memory devices 164f of mesa structure arrays 169a and 169b. In particular, word line 160f extends between vertically oriented semiconductor devices 157*f* of mesa structure arrays 169*a* and 169*b*. Word line 160*f* extends between the control terminals of vertically oriented semiconductor devices 157*f* of mesa structure arrays 169*a* and 169*b*.

Word line 160*g* extends between memory devices 164*g* of mesa structure arrays 169*a* and 169*b*. In particular, word line 160*g* extends between vertically oriented semiconductor devices 157*g* of mesa structure arrays 169*a* and 169*b*. Word line 160*g* extends between the control terminals of vertically oriented semiconductor devices 157*g* of mesa structure arrays 169*a* and 169*b*.

Word line 160*h* extends between memory devices 164*h* of mesa structure arrays 169*a* and 169*b*. In particular, word line 160*h* extends between vertically oriented semiconductor devices 157*h* of mesa structure arrays 169*a* and 169*b*. Word line 160*h* extends between the control terminals of vertically oriented semiconductor devices 157*h* of mesa structure arrays 169*a* and 169*b*.

Figure 13A:
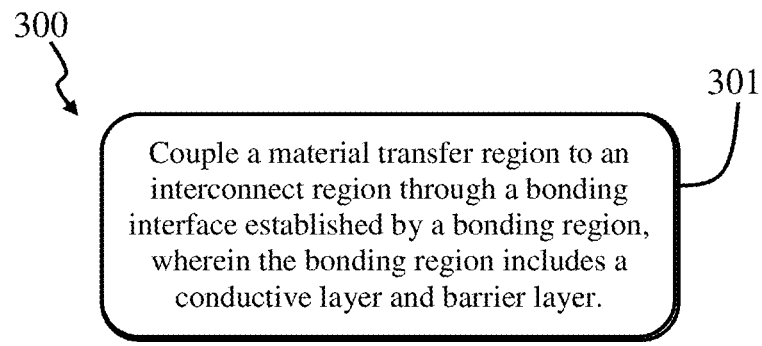
FIGS. 13a, 13b and 13c are block diagrams of methods of forming a bonded semiconductor circuit structure.

FIG. 13*a* is a block diagram of a method 300 of forming a bonded semiconductor circuit structure. In this embodiment, method 300 includes a step 301 of coupling a material transfer region to an interconnect region through a bonding interface established with a bonding region, wherein the bonding region includes a conductive layer and barrier layer.

In some embodiments, the bonding interface is a metal-semiconductor bonding interface and, in other embodiments, the bonding interface is a metal-to-metal bonding interface. In some embodiments, the bonding interface is a metal-semiconductor bonding interface.

In some embodiments, the interconnect region is carried by a wafer. The wafer can be of many different types, such as a semiconductor wafer. The wafer can be of many different sizes. For example, in some embodiments, the wafer is an eight inch wafer and, in other embodiments, the wafer is a twelve inch wafer.

In this embodiment, the conductive layer is positioned towards the interconnect region, and the conductive layer extends between the interconnect region and barrier layer. In this embodiment, the barrier layer extends between the material transfer region and conductive layer. In some embodiments, the interconnect region includes a conductive line in communication with the conductive layer. In some embodiments, the wafer carries an electronic device. In some embodiments, the interconnect region includes a conductive line in communication with the electronic device and conductive bonding layer.

In some embodiments, the material transfer region includes a polished surface, which faces the interconnect region. In some embodiments, the material transfer region includes an opposed polished surface, which faces away from the interconnect region.

In some embodiments, the material transfer region includes a polished surface, which faces the bonding region. In some embodiments, the material transfer region includes an opposed polished surface, which faces away from the bonding region.

In some embodiments, method 300 includes forming the bonding region so the conductive layer is thicker than the barrier layer. In some embodiments, method 300 includes forming the bonding region so the conductive layer is more conductive than the barrier layer. In some embodiments, method 300 includes forming the bonding region so the barrier layer is more resistive than the conductive layer.

In some embodiments, method 300 includes a step of forming a bonding layer which establishes the bonding interface. The bonding layer is positioned towards the material transfer region, and the bonding layer extends between the material transfer region and barrier layer. The bonding layer establishes the bonding interface with the material transfer region. In some embodiments, the interconnect region includes a conductive line in communication with the bonding layer through the conductive layer and barrier layer. The conductive line is in communication with the bonding layer through the conductive layer and barrier layer when a signal flowing between the conductive line and bonding layer flows through the conductive layer and barrier layer.

Figure 13B:
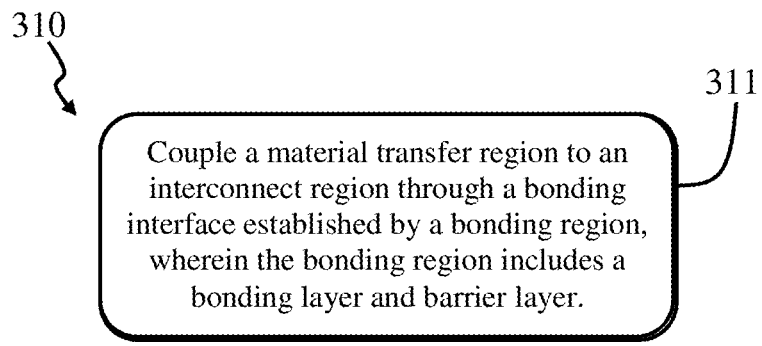

FIG. 13*b* is a block diagram of a method 310 of forming a bonded semiconductor circuit structure. In this embodiment, method 300 includes a step 311 of coupling a material transfer region to an interconnect region through a bonding interface established with a bonding region, wherein the bonding region includes a barrier layer and bonding layer.

In some embodiments, the bonding interface is a metal-semiconductor bonding interface and, in other embodiments, the bonding interface is a metal-to-metal bonding interface. In some embodiments, the bonding interface is a metal-semiconductor bonding interface.

In some embodiments, the interconnect region is carried by a wafer. The wafer can be of many different types, such as a semiconductor wafer. The wafer can be of many different sizes. For example, in some embodiments, the wafer is an eight inch wafer and, in other embodiments, the wafer is a twelve inch wafer.

In this embodiment, the bonding layer is positioned towards the material transfer region, and the bonding layer extends between the material transfer region and barrier layer. The bonding layer establishes the bonding interface with the material transfer region. In this embodiment, the barrier layer extends between the interconnect region and bonding layer. In some embodiments, method 300 includes forming the bonding region so the bonding layer is thicker than the barrier layer. In some embodiments, the interconnect region includes a conductive line in communication with the conductive layer. In some embodiments, the interconnect region includes a conductive line in communication with the bonding layer through the barrier layer. The conductive line is in communication with the bonding layer through the barrier layer when a signal flowing between the conductive line and bonding layer flows through the barrier layer.

In some embodiments, the material transfer region includes a polished surface, which faces the interconnect region. In some embodiments, the material transfer region includes an opposed polished surface, which faces away from the interconnect region.

In some embodiments, the material transfer region includes a polished surface, which faces the bonding region. In some embodiments, the material transfer region includes an opposed polished surface, which faces away from the bonding region.

In some embodiments, method 300 includes a step of forming a conductive layer, wherein the conductive layer is positioned between the barrier layer and interconnect region. The barrier layer extends between the conductive layer and bonding layer. In some embodiments, method 300 includes forming the bonding region so the conductive layer is more conductive than the barrier layer. In some embodiments, method 300 includes forming the bonding region so the barrier layer is more resistive than the conductive layer. In some embodiments, the interconnect region includes a conductive line in communication with the conductive layer. In some embodiments, the interconnect region includes a conductive line in communication with the bonding layer through the conductive layer and barrier layer. The conductive line is in communication with the bonding layer through the conductive layer and barrier layer when a signal flowing between the conductive line and bonding layer flows through the conductive layer and barrier layer.

Figure 13C:
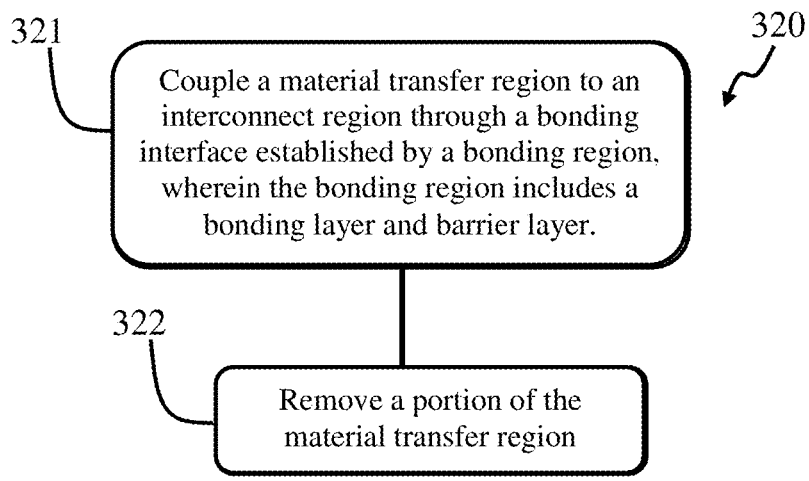

FIG. 13c is a block diagram of a method 300 of forming a bonded semiconductor circuit structure. In this embodiment, method 320 includes a step 321 of coupling a material transfer region to an interconnect region through a bonding interface established with a bonding region, wherein the bonding region includes a barrier layer which extends between a conductive layer and bonding layer. The bonding layer establishes the bonding interface with the material transfer region.

In some embodiments, the bonding interface is a metal-semiconductor bonding interface and, in other embodiments, the bonding interface is a metal-to-metal bonding interface. In some embodiments, the bonding interface is a metal-semiconductor bonding interface.

In some embodiments, the interconnect region is carried by a wafer. The wafer can be of many different types, such as a semiconductor wafer. The wafer can be of many different sizes. For example, in some embodiments, the wafer is an eight inch wafer and, in other embodiments, the wafer is a twelve inch wafer.

In this embodiment, the conductive layer is positioned towards the interconnect region, and the conductive layer extends between the interconnect region and barrier layer. In this embodiment, the barrier layer extends between the material transfer region and conductive layer. In some embodiments, the interconnect region includes a conductive line in communication with the conductive layer.

In some embodiments, the material transfer region includes a polished surface, which faces the interconnect region. In some embodiments, the material transfer region includes an opposed polished surface, which faces away from the interconnect region.

In some embodiments, the material transfer region includes a polished surface, which faces the bonding region. In some embodiments, the material transfer region includes an opposed polished surface, which faces away from the bonding region.

In some embodiments, method 300 includes forming the bonding region so the conductive layer is thicker than the barrier layer. In some embodiments, method 300 includes forming the bonding region so the conductive layer is more conductive than the barrier layer. In some embodiments, method 300 includes forming the bonding region so the barrier layer is more resistive than the conductive layer.

In some embodiments, the bonding layer is positioned towards the material transfer region, and the bonding layer extends between the material transfer region and barrier layer. The bonding layer establishes the bonding interface with the material transfer region. In some embodiments, the interconnect region includes a conductive line in communication with the bonding layer through the conductive layer and barrier layer. The conductive line is in communication with the bonding layer through the conductive layer and barrier layer when a signal flowing between the conductive line and bonding layer flows through the conductive layer and barrier layer.

In this embodiment, method 320 includes a step 322 of removing a portion of the material transfer region. In some embodiments, the material transfer region includes a stack of semiconductor layers. In some embodiments, the stack of semiconductor layers include crystalline semiconductor material. In some embodiments, the stack of semiconductor layers include single crystalline semiconductor material. In some embodiments, the material transfer region includes a pn junction.

While particular embodiments of the invention have been shown and described, numerous variations and alternate embodiments will occur to those skilled in the art. Accordingly, it is intended that the invention be limited only in terms of the appended claims.

The invention claimed is:

1. A semiconductor structure, comprising:
    a support substrate which carries an electronic device;
    an interconnect region carried by the support substrate, the interconnect region including a conductive line connected to the electronic device;
    a semiconductor material region;
    a conductive bonding region which couples the semiconductor material region to the interconnect region through a bonding interface,
    wherein the conductive bonding region includes a conductive layer connected to the conductive line, and a barrier layer, the conductive layer being more conductive than the barrier layer;
    a control dielectric which extends around the semiconductor material region; and
    a control terminal which extends around the control dielectric;
    wherein the conductivity of the semiconductor material region is adjustable in response to adjusting a signal provided to the control terminal.

2. The semiconductor structure of claim 1, wherein the conductive layer is thicker than the barrier layer.

3. The semiconductor structure of claim 1, wherein the barrier layer extends between the conductive layer and semiconductor material region.

4. The semiconductor structure of claim 1, wherein the bonding interface is a metal-semiconductor bonding interface.

5. The semiconductor structure of claim 1, wherein the conductive line extends through a dielectric material.

6. The semiconductor structure of claim 5, wherein the conductive line is in communication with the barrier layer through the conductive layer.

7. The semiconductor structure of claim 1, wherein the conductive bonding region includes a bonding layer.

8. The semiconductor structure of claim 7, wherein the conductive layer is thicker than the bonding layer.

9. The semiconductor structure of claim 7, wherein the bonding layer is thicker than the barrier layer.

10. The semiconductor structure of claim 7, wherein the bonding layer is more conductive than the barrier layer.

11. The semiconductor structure of claim 7, wherein the bonding layer extends between the barrier layer and semiconductor material region.

12. The semiconductor structure of claim 7, wherein the bonding interface is a metal-semiconductor bonding interface.

13. The semiconductor structure of claim 1, wherein the semiconductor material region includes a single crystalline semiconductor material region.

14. The semiconductor structure of claim 7, wherein the conductive line extends through a dielectric material.

15. The semiconductor structure of claim 14, wherein the conductive line is in communication with the bonding layer.

16. The semiconductor structure of claim 14, wherein the conductive line is in communication with the bonding layer through the conductive layer.

17. A semiconductor structure, comprising:
    a support substrate which carries an electronic device;

an interconnect region carried by the support substrate, the interconnect region including a conductive line in communication with the electronic device;

a conductive bonding region in communication with the conductive line, wherein the conductive bonding region includes a conductive layer and bonding layer, wherein the conductive layer is less resistive than the bonding layer;

semiconductor material region coupled to the interconnect region through the conductive bonding region a control dielectric which extends around the semiconductor material region; and a control terminal which extends around the control dielectric;

wherein the conductivity of the semiconductor material region is adjustable in response to adjusting a signal provided to the control terminal.

18. The semiconductor structure of claim 17, wherein the conductive layer is thicker than the bonding layer.

19. The semiconductor structure of claim 17, wherein the bonding layer extends between the conductive layer and material transfer region.

20. The semiconductor structure of claim 17, wherein the conductive bonding region establishes a bonding interface between the interconnect region and material transfer region.

21. The semiconductor structure of claim 20, wherein the bonding interface is a metal-semiconductor bonding interface.

22. The semiconductor structure of claim 17, wherein the interconnect region includes a conductive line which extends through a dielectric material.

23. The semiconductor structure of claim 22, wherein the conductive line is connected to the conductive bonding region.

24. The semiconductor structure of claim 22, wherein the conductive line is in communication with the bonding layer through the conductive layer.

25. The semiconductor structure of claim 17, wherein the conductive bonding region includes a barrier layer.

26. The semiconductor structure of claim 25, wherein the conductive layer is thicker than the barrier layer.

27. The semiconductor structure of claim 25, wherein the bonding layer is thicker than the barrier layer.

28. The semiconductor structure of claim 25, wherein the bonding layer is more conductive than the barrier layer.

29. The semiconductor structure of claim 25, wherein the bonding layer extends between the barrier layer and material transfer region.

30. The semiconductor structure of claim 29, wherein the bonding layer establishes a metal-semiconductor bonding, interface with the material transfer region.

31. The semiconductor structure of claim 25, wherein the interconnect region includes a conductive line which extends through a dielectric material.

32. The semiconductor structure of claim 31, wherein the conductive line is in communication with the bonding layer.

33. The semiconductor structure of claim 31, wherein the conductive line is in communication with the barrier layer through the conductive layer.

34. A method of forming a semiconductor structure, comprising:

forming a support substrate which carries an electronic device;

forming an interconnect region carried by the support substrate, the interconnect region including a conductive line connected to the electronic device;

forming a conductive bonding region connected to the conductive line, wherein the conductive bonding region includes a conductive layer and bonding layer, wherein the conductive layer is more conductive than the bonding layer;

coupling a material transfer region to the interconnect region by establishing a bonding interface between the material transfer region and conductive bonding region forming a mesa structure in response to removing a portion of the material transfer region;

forming a control dielectric which extends annularly around the mesa structure; and forming a control terminal which extends annularly around the control dielectric;

wherein the conductivity of a portion of the mesa structure is adjustable in response to adjusting a signal provided to the control terminal.

35. The method of claim 34, further including forming the conductive bonding region so the conductive layer is thicker than the barrier layer.

36. The method of claim 34, further including forming the conductive bonding region so the conductive layer is more conductive than the barrier layer.

37. The method of claim 34, further including forming the conductive bonding region so the barrier layer extends between the conductive layer and material transfer region.

38. The method of claim 34, wherein the bonding interface is a metal-semiconductor bonding interface.

39. The method of claim 34, further including forming the interconnect region by forming a conductive line which extends through a dielectric material region.

40. The method of claim 39, further including forming the conductive bonding region so the conductive bonding region is connected to the conductive line.

41. The method of claim 39, further including forming the barrier layer so the barrier layer is in communication with the conductive line through the conductive layer.

42. The method of claim 34, further including forming the conductive bonding region so the conductive bonding region includes a bonding layer.

43. The structure of claim 42, further including forming the conductive layer so the conductive layer is thicker than the bonding layer.

44. The method of claim 42, further including forming the bonding layer so the bonding layer is thicker than the barrier layer.

45. The method of claim 42, further including forming the bonding layer so the bonding layer is more conductive than the barrier layer.

46. The method of claim 42, further including forming the bonding layer so the bonding layer extends between the barrier layer and material transfer region.

47. The method of claim 42, wherein the bonding interface is a metal-semiconductor bonding interface.

48. The method of claim 42, further including forming the interconnect region by forming a conductive line which extends through a dielectric material region.

49. The method of claim 48, further including forming the conductive line so the conductive line is in communication with the bonding layer.

50. The method of claim 48, further including forming the conductive line so the conductive line is in communication with the bonding layer through the conductive layer.

51. A method of forming a semiconductor structure, comprising:

forming a support substrate which carries an electronic device;

forming an interconnect region carried by the support substrate, the interconnect region including a conductive line in communication with the electronic device;

forming a conductive bonding region in communication with the conductive line, wherein the conductive bonding region includes a conductive layer and bonding layer, wherein the conductive layer is more conductive than the bonding layer; and coupling a material transfer region to the interconnect region through the conductive bonding region processing the material transfer region to form a mesa structure;

forming a control dielectric which extends proximate to the mesa structure; and forming a control terminal which extends proximate to the control dielectric;

wherein the conductivity of a portion of the mesa structure is adjustable in response to adjusting signal provided to the control terminal.

52. The method of claim 51, further including forming the conductive layer so the conductive layer is thicker than the bonding layer.

53. The method of claim 51, further including forming the conductive bonding region so the conductive bonding region establishes a bonding interface between the interconnect region and material transfer region.

54. The method of claim 53, wherein the bonding interface is a metal-semiconductor bonding interface.

55. The method of claim 53, wherein the bonding interface is a metal-semiconductor bonding interface.

56. The method of claim 51, further including forming the interconnect region by forming a conductive line which extends through a dielectric material region.

57. The method of claim 56, further including forming the conductive bonding region so the conductive bonding region is in communication with the conductive line.

58. The method of claim 56, further including forming the bonding layer so the bonding layer is in communication with the conductive line through the conductive layer.

59. The method of claim 51, further including forming the bonding layer so the bonding layer extends between the conductive layer and material transfer region.

60. The method of claim 59, wherein forming the material transfer region includes forming a dielectric material region.

61. The method of claim 59, wherein forming the material transfer region includes forming a semiconductor material region.

62. The method of claim 59, wherein forming the material transfer region includes forming a single crystalline semiconductor material region.

63. The method of claim 59, wherein forming the material transfer region includes forming a stack of single crystalline semiconductor material.

64. The method of claim 51, further including forming a barrier layer with the conductive bonding region.

65. The method of claim 64, further including forming the conductive layer so the conductive layer is thicker than the barrier layer.

66. The method of claim 64, further including forming the bonding layer so the bonding layer is thicker than the barrier layer.

67. The method of claim 64, further including forming the bonding layer so the bonding layer is more conductive than the barrier layer.

68. The method of claim 64, further including forming the bonding layer so the bonding layer extends between the barrier layer and material transfer region.

69. The method of claim 64, further including forming the interconnect region by forming a conductive line which extends through a dielectric material region.

70. The method of claim 69, further including forming the bonding layer so the bonding layer is in communication with the conductive line.

71. The method of claim 69, further including forming the bonding layer so the bonding layer is in communication with the conductive line through the barrier layer.

72. A semiconductor structure, comprising:
a conductive bonding region;
a semiconductor material region coupled to the conductive bonding region through a bonding interface;
a capacitor in communication with the semiconductor material region;
a control dielectric which extends around the semiconductor material region; and
a control terminal which extends around the control dielectric;
wherein the conductivity of the semiconductor material region is adjustable in response to adjusting a signal provided to the control terminal.

73. The semiconductor structure of claim 72, wherein the bonding interface is established in response to coupling the semiconductor material region to the conductive bonding region.

74. The semiconductor structure of claim 72, wherein the bonding interface is a metal-to-metal bonding interface.

75. The semiconductor structure of claim 72, wherein the semiconductor material region extends between the conductive bonding region and capacitor.

76. The semiconductor structure of claim 72, wherein the semiconductor material region includes a base support structure.

77. The semiconductor structure a claim 72, wherein the semiconductor material region includes crystalline semiconductor material.

78. The semiconductor structure of claim 72, wherein the semiconductor material region includes single crystalline semiconductor material.

79. The semiconductor structure of claim 72, wherein the capacitor stores a charge in response to a signal flowing through the bonding interface.

80. The semiconductor structure of claim 72, wherein a charge of the capacitor is adjustable in response to adjusting the conductivity of the semiconductor material region.

81. A semiconductor structure, comprising:
a conductive bonding region;
a mesa structure which includes a semiconductor material region coupled to the conductive bonding region through a bonding interface;
a capacitor in communication with the mesa structure;
a control dielectric which extends annularly around the mesa structure; and
a control terminal which extends annularly around the mesa structure;
wherein the conductivity of the mesa structure is adjustable in response to adjusting a signal provided to the control terminal.

82. The semiconductor structure of claim 81, wherein a current flow through the bonding interface is adjustable in response to adjusting the signal provided to the control terminal.

83. The semiconductor structure of claim 81, wherein the operation of the capacitor is controllable in response to the signal provided to the control terminal.

84. The semiconductor structure of claim 81, wherein the bonding interface is established in response to coupling the semiconductor material region to the conductive bonding region.

85. The semiconductor structure of claim 81, wherein the bonding interface is a metal-to-metal bonding interface.

86. The semiconductor structure of claim 81, wherein the mesa structure extends between the conductive bonding region and capacitor.

87. The semiconductor structure of claim 81, wherein the mesa structure includes crystalline semiconductor material.

88. The semiconductor structure of claim 81, wherein the mesa structure includes single crystalline semiconductor material.

89. The semiconductor structure of claim 81, wherein the capacitor stores a charge in response to a signal flowing through the bonding interface and mesa structure.

90. A semiconductor structure, comprising:
a conductive bonding region;
a mesa structure carried by a base support structure, wherein the base support structure includes a semiconductor material region coupled to the conductive bonding region through a bonding interface;
a capacitor in communication with the mesa structure;
a control dielectric which extends around the mesa structure; and
a control terminal which extends around the control dielectric;
wherein the conductivity of the mesa structure is adjustable in response to adjusting a signal provided to the control terminal.

91. The semiconductor structure of claim 90, wherein the conductivity of the mesa structure is adjustable in response to adjusting the signal provided to the control terminal.

92. The semiconductor structure of claim 90, wherein a charge of the capacitor is adjustable in response to adjusting the conductivity of the mesa structure.

* * * * *